US011833657B2

(12) United States Patent
Grela et al.

(10) Patent No.: US 11,833,657 B2
(45) Date of Patent: Dec. 5, 2023

(54) STORAGE HUTCH ASSEMBLY

(71) Applicants: Larry Mitchell Grela, Plainfield, IL (US); Edwin Dizon Manalang, Las Vegas, NV (US)

(72) Inventors: Larry Mitchell Grela, Plainfield, IL (US); Edwin Dizon Manalang, Las Vegas, NV (US)

(*) Notice: Subject to any disclaimer, the term of this patent is extended or adjusted under 35 U.S.C. 154(b) by 0 days.

(21) Appl. No.: 17/873,218

(22) Filed: Jul. 26, 2022

(65) Prior Publication Data

US 2022/0388147 A1 Dec. 8, 2022

Related U.S. Application Data

(63) Continuation of application No. 17/080,674, filed on Oct. 26, 2020, now Pat. No. 11,433,529, which is a continuation of application No. 16/501,658, filed on May 17, 2019, now Pat. No. 10,821,596, which is a continuation of application No. 15/731,423, filed on Jun. 6, 2017, now Pat. No. 10,293,478.

(51) Int. Cl.

| | |
|---|---|
| ***H05K 5/00*** | (2006.01) |
| ***B25H 3/02*** | (2006.01) |
| ***B25H 3/06*** | (2006.01) |
| ***B25H 3/04*** | (2006.01) |
| ***B25H 3/00*** | (2006.01) |
| *H01R 13/73* | (2006.01) |
| *H01R 25/00* | (2006.01) |
| *H01R 27/02* | (2006.01) |

(52) U.S. Cl.

CPC ............ *B25H 3/023* (2013.01); *B25H 3/003* (2013.01); *B25H 3/006* (2013.01); *B25H 3/04* (2013.01); *B25H 3/06* (2013.01); *H01R 13/73* (2013.01); *H01R 25/006* (2013.01); *H01R 27/02* (2013.01)

(58) Field of Classification Search

CPC ........................................................ H05K 5/00

See application file for complete search history.

(56) References Cited

U.S. PATENT DOCUMENTS

| | | | |
|---|---|---|---|
| 150,407 | A | 5/1874 | Ellison |
| 729,808 | A | 6/1903 | Taylor et al. |
| 1,110,231 | A | 2/1916 | Flint |
| 1,170,231 | A | 2/1916 | Flint |
| 1,459,930 | A | 6/1923 | Riehle |
| 1,513,849 | A | 11/1924 | Moore |
| 1,936,867 | A | 11/1933 | Wetzel |

(Continued)

FOREIGN PATENT DOCUMENTS

| | | | |
|---|---|---|---|
| GB | 206915 | A | 9/1981 |
| GB | 2069915 | A | 9/1981 |

OTHER PUBLICATIONS

International Search Report for PCT Application No. PCT US 2010/001732, dated Aug. 5, 2010.

(Continued)

*Primary Examiner* — Jerry Wu

(74) *Attorney, Agent, or Firm* — John G. Chupa

(57) ABSTRACT

A storage hutch assembly 10 including a plurality of dissimilar assemblies, such as a power tool holder assembly 120, which may be selectively and operatively deployed within the hutch assembly 10 upon a contained shelf 30 and/or upon a storage cart, such a cart 50, and/or upon a surface such as surface 25 contained within the storage hutch assembly 10.

4 Claims, 39 Drawing Sheets

(56) References Cited

U.S. PATENT DOCUMENTS

| | | | |
|---|---|---|---|
| 1,987,822 A | 1/1935 | Gregory | |
| 2,286,427 A | 6/1942 | Levensten | |
| 2,525,208 A | 9/1946 | Clink | |
| 2,981,549 A | 4/1961 | Richardson | |
| 3,070,340 A | 12/1962 | Cohn | |
| D205,523 S | 8/1966 | Doman | |
| 3,520,583 A | 12/1967 | Case | |
| 3,456,995 A | 7/1969 | Nyquist | |
| D229,262 S | 11/1973 | Pearson | |
| 3,848,942 A | 11/1974 | Fanini | |
| 3,848,943 A | 11/1974 | Geesaman | |
| 3,954,202 A | 5/1976 | Petrick | |
| 4,108,514 A | 8/1978 | Zimmerman | |
| 4,120,549 A | 10/1978 | Bureau | |
| 4,211,455 A | 7/1980 | Tedrow | |
| D258,175 S | 2/1981 | Hazeltine | |
| 4,266,835 A | 5/1981 | Schmidy | |
| 4,303,158 A | 12/1981 | Perkins | |
| 4,365,720 A | 3/1982 | Kaneshiro | |
| 4,389,077 A | 6/1983 | Schmidt | |
| D271,733 S | 12/1983 | Daventry | |
| D273,906 S | 5/1984 | Norlin | |
| D282,263 S | 4/1986 | Richey | |
| D283,263 S | 4/1986 | Richey | |
| D292,937 S | 11/1987 | Richey | |
| 4,830,198 A | 5/1989 | Colquitt | |
| D337,404 S | 7/1993 | Mile | |
| 5,292,191 A | 3/1994 | Slivon | |
| D356,703 S | 3/1995 | Dickinson | |
| 5,443,311 A | 8/1995 | Kadlecek et al. | |
| 5,456,358 A | 10/1995 | Schmidt | |
| 5,497,878 A | 3/1996 | Sandonato | |
| D374,532 S | 10/1996 | Pool | |
| D387,926 S | 12/1997 | Blaesing | |
| 5,857,757 A | 7/1999 | Bieker et al. | |
| 5,927,838 A | 7/1999 | Hellman | |
| 5,951,129 A | 9/1999 | Stein | |
| D423,817 S | 5/2000 | Holcomb et al. | |
| D423,818 S | 5/2000 | Holcomb et al. | |
| D427,807 S | 7/2000 | Holcomb et al. | |
| D430,426 S | 9/2000 | Bieker et al. | |
| D444,930 S | 7/2001 | Brown | |
| D448,168 S | 9/2001 | Johnston | |
| D448,586 S | 10/2001 | O'hare | |
| 6,375,235 B1 | 4/2002 | Mehmen | |
| 6,422,386 B1 | 7/2002 | Weise et al. | |
| 6,527,353 B1 | 3/2003 | Bradfish et al. | |
| 6,578,938 B2 | 6/2003 | Norman | |
| 6,811,232 B2 | 11/2004 | Doan et al. | |
| D505,237 S | 5/2005 | Schmidt et al. | |
| D514,854 S | 2/2006 | Schmidt et al. | |
| D520,784 S | 5/2006 | Schmidt et al. | |
| 7,048,347 B1 | 5/2006 | Liu | |
| D523,607 S | 6/2006 | Huget | |
| 7,121,638 B1 | 10/2006 | Eggert et al. | |
| D536,202 S | 2/2007 | Mehmen et al. | |
| 7,268,518 B1 | 9/2007 | Goff | |
| 7,296,808 B2 | 11/2007 | Huguet | |
| D563,119 S | 3/2008 | Malley et al. | |
| RE40,267 E | 4/2008 | Mehmen | |
| D574,628 S | 8/2008 | Grela | |
| 7,510,078 B2 | 3/2009 | Schmidt et al. | |
| 7,552,950 B2 | 6/2009 | Scheffy et al. | |
| D621,677 S | 8/2010 | Koehn | |
| 7,784,887 B2 | 8/2010 | Grela et al. | |
| D626,404 S | 11/2010 | Koehn | |
| D633,719 S | 3/2011 | Koehn | |
| D634,184 S | 3/2011 | Koehn | |
| D636,615 S | 4/2011 | Grela | |
| 7,946,663 B2 | 5/2011 | Holcomb | |
| D642,400 S | 8/2011 | Koehn | |
| D642,404 S | 8/2011 | Koehn | |
| D643,703 S | 8/2011 | Koehn | |
| D643,704 S | 8/2011 | Koehn | |
| D649,377 S | 11/2011 | Grela | |
| 8,056,943 B2 | 11/2011 | Scheffy et al. | |
| 8,056,995 B2 | 11/2011 | Grela et al. | |
| 8,084,992 B2 | 12/2011 | Scheffy et al. | |
| D654,776 S | 2/2012 | Retchloff | |
| 8,157,337 B2 | 4/2012 | Manalang et al. | |
| D660,462 S | 5/2012 | Chen | |
| 8,215,728 B2 | 7/2012 | Mehmen | |
| 8,240,786 B2 | 8/2012 | Daino et al. | |
| D671,388 S | 11/2012 | Retchloff | |
| D677,934 S | 3/2013 | Grela | |
| D678,694 S | 3/2013 | Grela | |
| 8,613,456 B2 | 4/2013 | Grela | |
| 8,608,261 B2 | 12/2013 | Retchloff | |
| 8,827,387 B2 | 4/2014 | Grela | |
| 8,944,537 B1 | 2/2015 | Manalang | |
| 8,994,537 B2 | 3/2015 | Pokrajac | |
| 9,010,886 B2 | 4/2015 | Grela | |
| 9,181,731 B2 | 5/2015 | Grela et al. | |
| 9,050,718 B2 | 6/2015 | Cole | |
| 9,189,731 B2 | 11/2015 | Grela | |
| D747,875 S | 1/2016 | Manalang et al. | |
| 9,388,609 B2 | 7/2016 | Grela et al. | |
| 9,422,750 B2 | 8/2016 | Gutierrez | |
| 9,630,312 B2 | 4/2017 | Grela et al. | |
| 9,894,996 B1 | 2/2018 | Grela et al. | |
| 9,984,996 B2 | 2/2018 | Grela et al. | |
| 9,914,209 B2 | 3/2018 | Grela et al. | |
| 10,145,158 B2 | 5/2018 | Grela et al. | |
| 10,293,478 B2 | 5/2019 | Grela | |
| 10,702,984 B2 | 7/2020 | Grela | |
| 2005/0204646 A1 | 9/2005 | Tupper et al. | |
| 2006/0103278 A1 | 5/2006 | Bousquet | |
| 2008/0150407 A1 | 6/2008 | Mehmen | |
| 2008/0276667 A1 | 11/2008 | Scheffey et al. | |
| 2008/0278046 A1 | 11/2008 | Scheffy | |
| 2009/0195134 A1 | 8/2009 | Liu | |
| 2010/0019636 A1 | 1/2010 | Chen | |
| 2010/0072716 A1 | 3/2010 | Grela | |
| 2010/0276317 A1 | 11/2010 | Grela et al. | |
| 2010/0282629 A1 | 11/2010 | Grela | |
| 2010/0314978 A1* | 12/2010 | Manalang | B25H 3/06 312/317.3 |
| 2011/0121701 A1 | 5/2011 | Chang | |
| 2011/0309730 A1 | 12/2011 | Retchloff et al. | |
| 2015/0061483 A1 | 3/2015 | Liu | |
| 2017/0165828 A1 | 6/2017 | Fleischmann | |

OTHER PUBLICATIONS

United States Trademark Registration No. 3, 930, 484.

Mateo Tools Catalog—At least as early as Oct. 29, 2014.

Notification of First Office Action (including Search Report)—The State Intellectual Property Office of the People's Republic of China (dated May 21, 2013) App No. 201080026995.9.

European Search Report—dated Jun. 25, 2014—Application No. 10166026.4-1701/2263836.

European Search Report—dated Jun. 18, 2014—Application No. EP-10-16-6026.

P. 163 of the published Sears Catalog which was publicly available about 2012-2013.

P. 154 of the published Sears Catalog which was publicly available about 2012-2013.

A page from the published Sears Catalog which was publicly available about 2012-2013.

Storage Assembly Photos—Published at least as early as Aug. 13, 2017 on Facebook and perhaps other social media Jason Szapka—Snap on Tools.

Photos published at least as early as Aug. 13, 2017 in Social media such as Face book.

* cited by examiner

FIG. 20
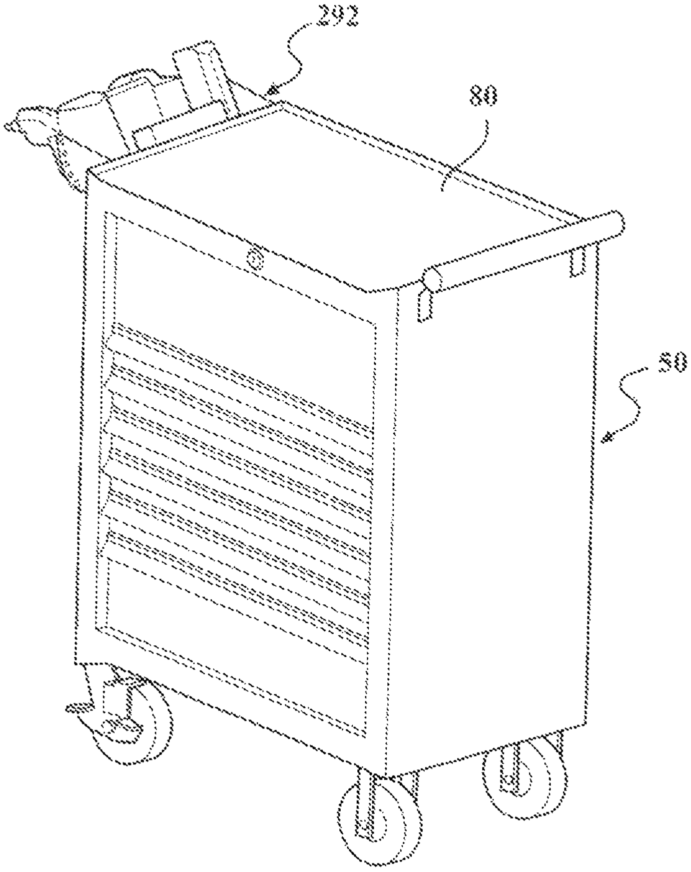
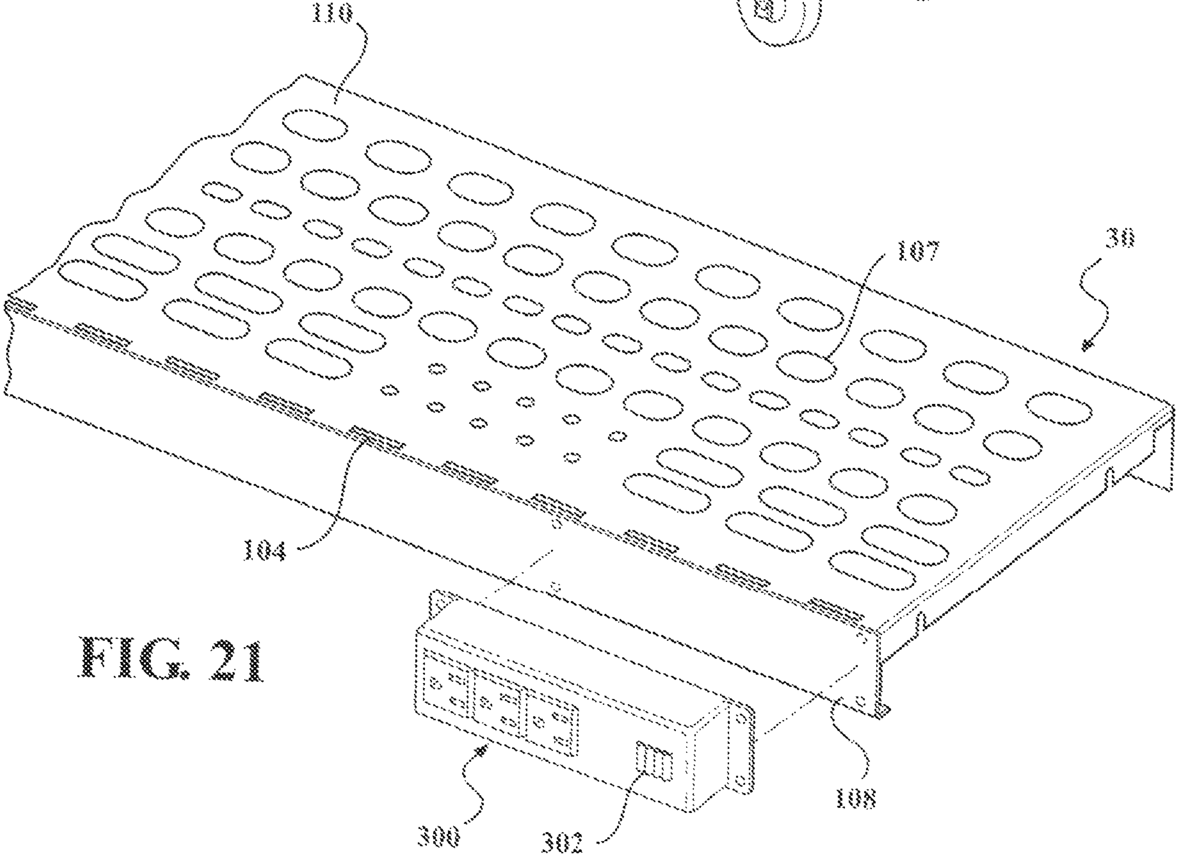
FIG. 21

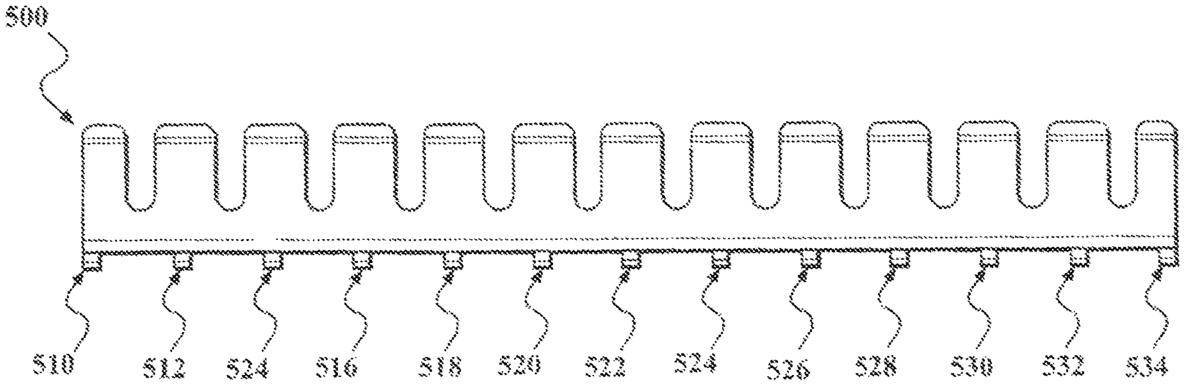
FIG. 39
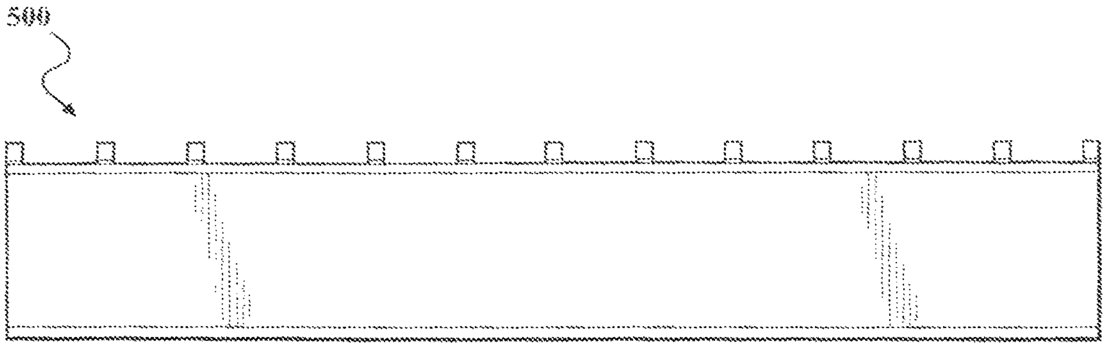
FIG. 40
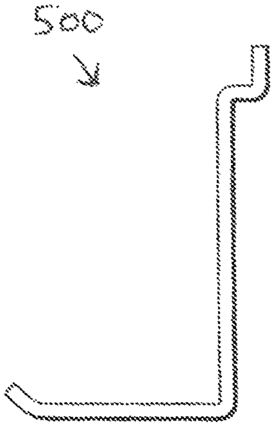
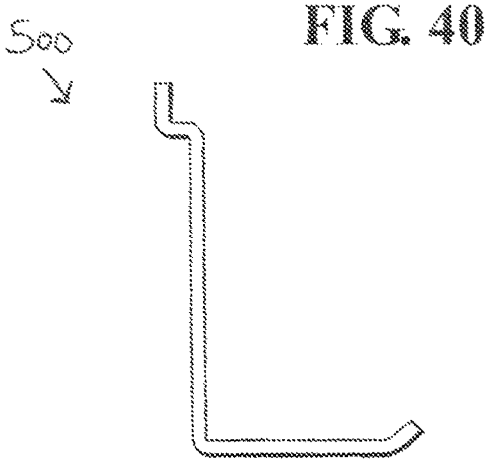
FIG. 41
FIG. 42

STORAGE HUTCH ASSEMBLY

GENERAL BACKGROUND

Field of the Invention

The present invention generally relates to a hutch assembly and more particularly, by way of example and without limitation, to a hutch assembly having at least one storage assembly which may be easily and securely attached within the hutch assembly and/or upon the hutch assembly and further to a hutch assembly which may be securely attached to a cabinet assembly.

BACKGROUND OF THE INVENTION

A storage hutch is commonly placed upon a cabinet and used to selectively and securely store items, such as tools, parts, sockets, and similar types of items. While these prior hutches do allow for such storage, they all suffer various types of drawbacks and deficiencies.

By way of example and without limitation, these prior storage hutches are not readily coupled to various types of diverse top cabinet surfaces (having various widths and materials) and often require some sort of drilling into the nicely finished top cabinet surface and the use of some sort of connecting members, thereby destroying the finish of the top cabinet surface. Moreover, it the top cabinet surface is relatively wide, unsightly and relatively large connectors must be used to securely connect the storage hutch to this surface thereby further detracting from the desired overall aesthetically pleasing appearance of the final hutch-cabinet storage assembly.

By way of another example and without limitation, many of these storage hutches do not readily and securely store a wide variety of dissimilar items and provide storage facilities which are not adapted to the respective geometric configuration of the respective dissimilar items to be stored. For example, while a wide rectangular drawer may be useful to store a single relatively large item, it is not desirable for smaller tools (which may slide back and forth in the large drawer and such movement both may cause damage to the drawer itself as well as the tools, in addition to causing undesirable noise). For similar reasons, smaller parts are not desired to be placed within such relatively large drawers.

By way of yet another example and without limitation, these prior hutches do not provide needed electrical power and/or data communication which are each essential in operating power tools and in diagnosing various functions and states of an item being tended to by the user of the storage hutch.

The present inventions overcome these and other drawbacks and provide a secure storage facility for a wide variety of dissimilar items in a new and novel fashion.

SUMMARY OF THE INVENTIONS

It is a first non-limiting object of the various inventions, to provide a new and novel storage hutch assembly.

It is a second non-limiting object of the various inventions to provide a new and novel storage hutch assembly which overcomes some or all of the drawbacks of prior hutch assemblies and which allows for the storage of a wide variety of dissimilar items.

It is a third non-limiting object of the present inventions to provide a new and novel storage hutch assembly which overcomes some or all of the drawbacks of prior hutch assemblies and which includes a plurality of dissimilar storage assemblies which are respectively configured according to the spatial geometric properties of respective items.

It is a fourth non-limiting object of the present inventions to provide a new and novel storage hutch assembly which may be readily secured to a cabinet in a secure and aesthetically pleasing manner.

According to a first non-limiting aspect of the present inventions, a power tool holder is provided and includes a body having a retention portion with at least one opening, and wherein the body further includes a support portion.

According to a second non-limiting aspect of the present inventions, a power tool holder is provided and comprises a body having a retention portion with at least one opening and a support portion, and wherein the power tool holder further comprises a power receptacle assembly which is disposed upon the body.

According to a third non-limiting aspect of the present inventions, a power tool holder is provided and includes a body having a retention portion with at least one opening and a support portion, and wherein the power tool holder further includes a data communications assembly which is disposed upon the body.

According to a fourth non-limiting aspect of the present inventions, a socket reception assembly is provided and includes a body having a first portion and an opposed second portion upon which a plurality of outwardly projecting members are deployed in a plurality of distinct spaced apart rows.

According to a fifth non-limiting aspect of the present inventions, a media retention assembly is provided and includes a flat first portion including an attachment portion and wherein the flat front surface further includes a second and opposed support portion.

According to a sixth non-limiting aspect of the present inventions, a holder assembly is provided and includes a body having at least one retention cavity and further having an attachment portion.

According to a seventh non-limiting aspect of the present inventions, a holder is provided and includes a flat back portion having a width and which further includes an attachment portion; a flat bottom support portion with a plurality of reception openings; a flat front surface having a width which is smaller than the width of the flat back portion and which includes a plurality of dissimilar openings; and a flat ledge portion which protrudes away from the back portion and the front portion and which includes a plurality of openings.

According to an eighth non-limiting aspect of the present inventions, a tool storage hutch is provided and includes a pair of side panels each having respective top edges and respective notched bottom edges and wherein the tool storage hutch further includes top, bottom, back and front portions which are respectively coupled to each of the pair of side panels and cooperating with each of the pair of side panels to form a tool storage hutch having an interior cavity.

According to a ninth non-limiting aspect of the present inventions, a tool storage hutch is provided and includes a body having an interior cavity; and a power tool holder which is selectively and removably coupled within the interior cavity of the hutch and which is selectively movable to a position upon the hutch remote from the interior cavity.

According to a tenth non-limiting aspect of the present inventions, a tool storage hutch is provided and includes a body having an interior cavity; and a media stand which is selectively and removably coupled within the interior cavity of the hutch and which is selectively movable to a position upon the hutch remote from the interior cavity.

According to an eleventh non-limiting aspect of the present inventions, a tool storage hutch is provided and includes a body having an interior cavity; and a socket assembly which is selectively and removably coupled within the interior cavity of the hutch and which is selectively movable to a position upon the hutch remote from the interior cavity.

According to a twelfth non-limiting aspect of the present inventions, a tool storage hutch is provided and includes a body having an interior cavity; and a parts holder which is selectively and removably coupled within the interior cavity of the hutch and which is selectively movable to a position upon the hutch remote from the interior cavity.

According to a thirteenth non-limiting aspect of the present inventions, a tool storage hutch is provided and includes a body having an interior cavity; and a tool holder which is selectively and removably coupled within the interior cavity of the hutch and which is selectively movable to a position upon the hutch remote from the interior cavity.

According to a fourteenth non-limiting aspect of the present inventions, a tool storage hutch is provided and includes a body having an interior cavity; a power tool holder; a parts holder; a socket assembly; a media stand; and a tool holder and wherein each of the power tool holder, the parts holder, the socket assembly, the media stand, and the tool holder have a substantially identical attachment portion which respectively allows the power tool holder, the parts holder, the socket assembly, the media stand and the tool holder to be respectively and selectively attached to one of a portion of the body remote from said interior cavity or to a portion of the body resident within the interior cavity.

According to a fifteenth non-limiting aspect of the present inventions, a shelf is provided and includes a top surface; and an electrical power receptacle assembly.

According to a sixteenth non-limiting aspect of the present inventions, a shelf is provided and includes a top surface and a data communications assembly.

According to a seventeenth non-limiting aspect of the present inventions, a shelf is provided for use in combination with a plurality of dissimilar retention accessories, wherein the shelf includes a plurality of dissimilar coupling features which respectively allow unique and respective retention accessories to be selectively attached to the shelf.

According to an eighteenth non-limiting aspect of the present inventions, a shelf is provided and includes a first surface having a plurality of dissimilar openings and at least one edge which are adapted to cooperatively receive tools of various shapes and sizes; and various holder accessories including at least one of a power tool holder, a socket holder, a media stand, a drill bit holder, a pliers rack, a part holder, a data communications assembly, and an electrical power receptacle assembly.

According to a nineteenth non-limiting aspect of the present inventions, a method is provided for storing items including the steps of providing a body; causing a shelf to be deployed within the body, wherein the shelf includes an outwardly extending edge; and causing at least one of a power tool rack, a socket rack, and a media stand to be deployed upon the edge of said shelf.

According to a twentieth non-limiting aspect of the present inventions, a method is provided for storing items upon a cabinet, the method including the steps of providing a hutch; attaching the hutch upon the cabinet; providing a shelf having a plurality of dissimilar openings and an edge; placing the shelf within the hutch; providing a plurality of dissimilar item reception assemblies which each have an identical attachment portion; attaching some of the plurality of dissimilar reception assemblies to the shelf by use of each of the respective and similar attachment portions; and placing items within at least one of the attached reception assemblies.

These and other aspects, features, and advantages of the present inventions will become apparent from a reading of the following detailed description of the preferred embodiments of the various inventions, including the subjoined claims, and by reference to the attached drawings which will be generally described below.

BRIEF DESCRIPTION OF THE DRAWINGS

FIG. 20 is a perspective view of the power tool storage assembly which is shown in FIGS. 14-19 being selectively coupled to a storage cabinet.

FIG. 21 is a partial perspective view of the shelf of the storage hutch which is shown for example in FIGS. 2,5,18, 19 in unassembled combination with an electrical power receptacle and a data assembly.

FIG. 39 is a bottom view of the tool holder which is shown in FIG. 36 and taken in the direction of view arrow "39".

FIG. 40 is a back view of the tool holder which is shown in FIG. 36 and taken in the direction of view arrow "40".

FIG. 41 is a side view of the tool holder which is shown in FIG. 36 and taken in the direction of view arrow "41".

FIG. 42 is a side view of the tool holder which is shown in FIG. 36 and taken in the direction of view arrow "42".

DETAILED DESCRIPTION OF THE PREFERRED EMBODIMENT OF THE INVENTION

Figure 1:
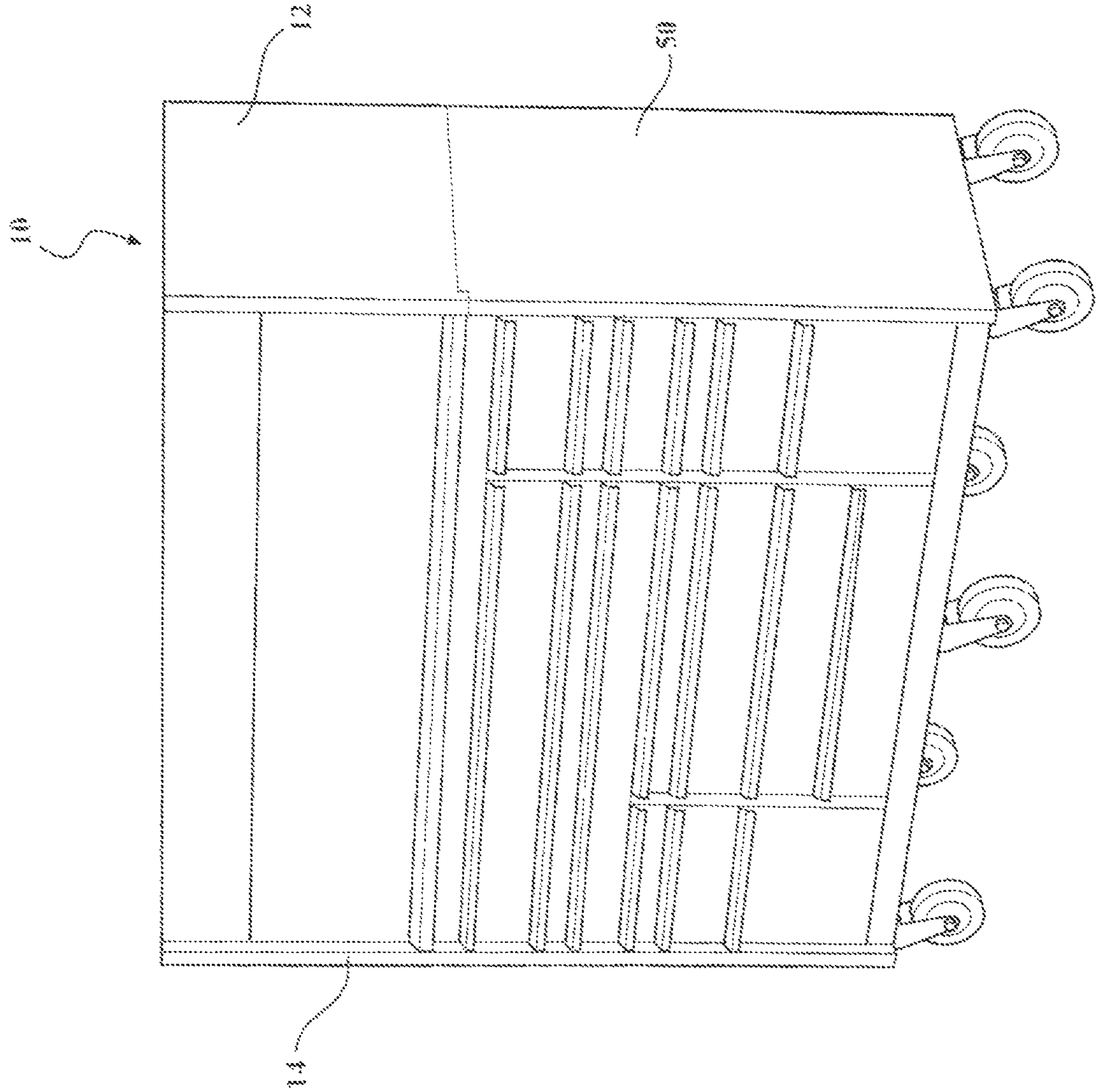
FIG. 1 is a perspective view of a storage hutch assembly which is made in accordance with the preferred embodiment of the various present inventions and shown in a selectively closed position and further shown as being operably mounted upon a storage cabinet.

Referring now to FIGS. 1-6, there is shown a storage hutch assembly 10 which is made in accordance with the teachings of the preferred embodiment of the various inventions.

Storage hutch assembly 10 includes a pair of substantially identical and generally flat and rectangular side panels 12, 14, a generally "L"-shaped back panel 16 having a substantially flat back surface portion 18 and a substantially flat top surface 20 which integrally and orthogonally projects from the portion 18, a substantially flat and rectangular front panel 21, and a substantially "L"-shaped top panel 22. Top panel 22 has a flat top surface 9 and a flat back surface 11 which orthogonally projects from the flat top surface 9.

These panels 12, 14, 16, 21, and 22 all cooperate when coupled to form an interior storage cavity 24 and the back panel 16 has a surface 25 which includes a plurality of openings or perforations, such as perforation 27, and is wholly disposed within the formed interior storage cavity 24. Perforations or openings, such as perforations 31, 33 are respectively disposed on respective surfaces 41, 43 of side panels 12, 14 and these respective surfaces 41, 43 are also wholly disposed within the formed interior storage cavity 24. In addition to the foregoing, the storage hutch 10 includes a shelf 30, substantially identical splicer posts 32, 34, and gas struts 36, 38. The foregoing storage hutch components 12, 14, 16, 21, 22, 30, 32, 34, 36, 38 may be shipped to a user and assembled in the manner which will now be discussed. Alternatively, the storage hutch assembly 10 may be pre-assembled and shipped to a user for immediate use, thereby adding to the overall utility of the storage hutch assembly 10.

It should be realized that the foregoing storage hutch 10 is adapted to be selectively and operatively coupled to a storage cabinet, such as by way of example and without limitation, a roller type storage cabinet 50 having a generally flat and aesthetically pleasing top surface 80 which may be formed of stainless steel or any other desired material. However, nothing in this description is meant to limit the use of the storage hutch 10 to a particular type of storage cabinet and that the storage hutch 10 may be used on a "stand alone" basis without the need for such a cabinet 50 and that various types of dissimilar cabinets may be selectively utilized in operative combination with the storage hutch assembly.

To assemble the storage hutch 10, as is perhaps best shown in FIGS. 1-6 and FIGS. 12 and 13, respective ends 60 of generally hollow splicer channels or posts 32, 34 are placed within opposed and respective open channels 54, 56 which are coupled to the storage cabinet 50. Respective and opposed ends 62 of the channels 32, 34 are respectively coupled to side panels 12, 14. That is, in one non-limiting embodiment, each side panel 12, 14 has a respective and generally hollow channel portion 70 which fits within a unique one of the respective ends 62 of one of the respective splicer channels or posts 32, 34 and these, the respective and opposed ends 60 of each of the respective channels or posts 32, 34, are contained in respective hollow channels 54, 56, thereby securing the side panels 12, 14 to the top of the storage cabinet, such as storage cabinet 50.

Further, each side panel 12, 14 includes a removable spacer bar 72 which frictionally and removably receives and which lies along the respective bottom edge 74 of each side panel 12, 14 and which allows the side panels 12, 14 to be made flush against the top surface 80 of the cabinet 50 regardless of the width of the top surface 80, thereby providing for an overall aesthetically pleasing appearance. That is, the spacer bars 72 may be removed if the thickness of the top surface 80 of the cabinet 50 is relatively thick, and allowed to remain frictionally engaged and coupled to the respective bottom panel edges 74 if the thickness of the top surface 80 is relatively thin. Thus, the presence of these selectively removable spacer bars 72 and the adjustment of the side panels 12, 14 along the respective channels 54, 56 allows the side panels 12, 14 to be made relatively flush against the top surface 50. Additional fasteners, such as fastener 59, may be used to strengthen the connection of the storage hutch assembly 10 to the storage cabinet, such as to storage hutch cabinet 50, but the use of such fasteners do not require drilling into the top surface 80 of the cabinet 50 and pre-drilled holes may even be utilized to receive the fastener prior to shipment to a user. As shown, perhaps best in FIG. 2, these fasteners are utilized on the outside surface of side panels 12, 14 (i.e., the respective side panel surfaces which are not contained within the formed storage cavity 24, and upon the cabinet, such as storage cabinet 50.

The side panels 12, 14 are respectively received by "L"-shaped edges 86, 88 of the back panel 16 and respectively coupled to these edges 86, 88 by conventional fastening techniques, such as by screws. The front panel 21 has an edge 91 which is coupled to the edge 97 of the top panel 22 by a conventional fastening technique. Moreover, the shelf 30 is made to be attached to side panels 12, 14 by conventional fastening techniques, such as by screws. Further, gas struts 36, 38 are attached to respective side panels 12, 14 and to the top panel 22 and the top panel 22 is pivotally coupled to side panels 12, 14 by a pair of screws 94, 96. Edge 3 of the top panel 22 abuts edge 1 of the top flat surface 20.

Figure 2:
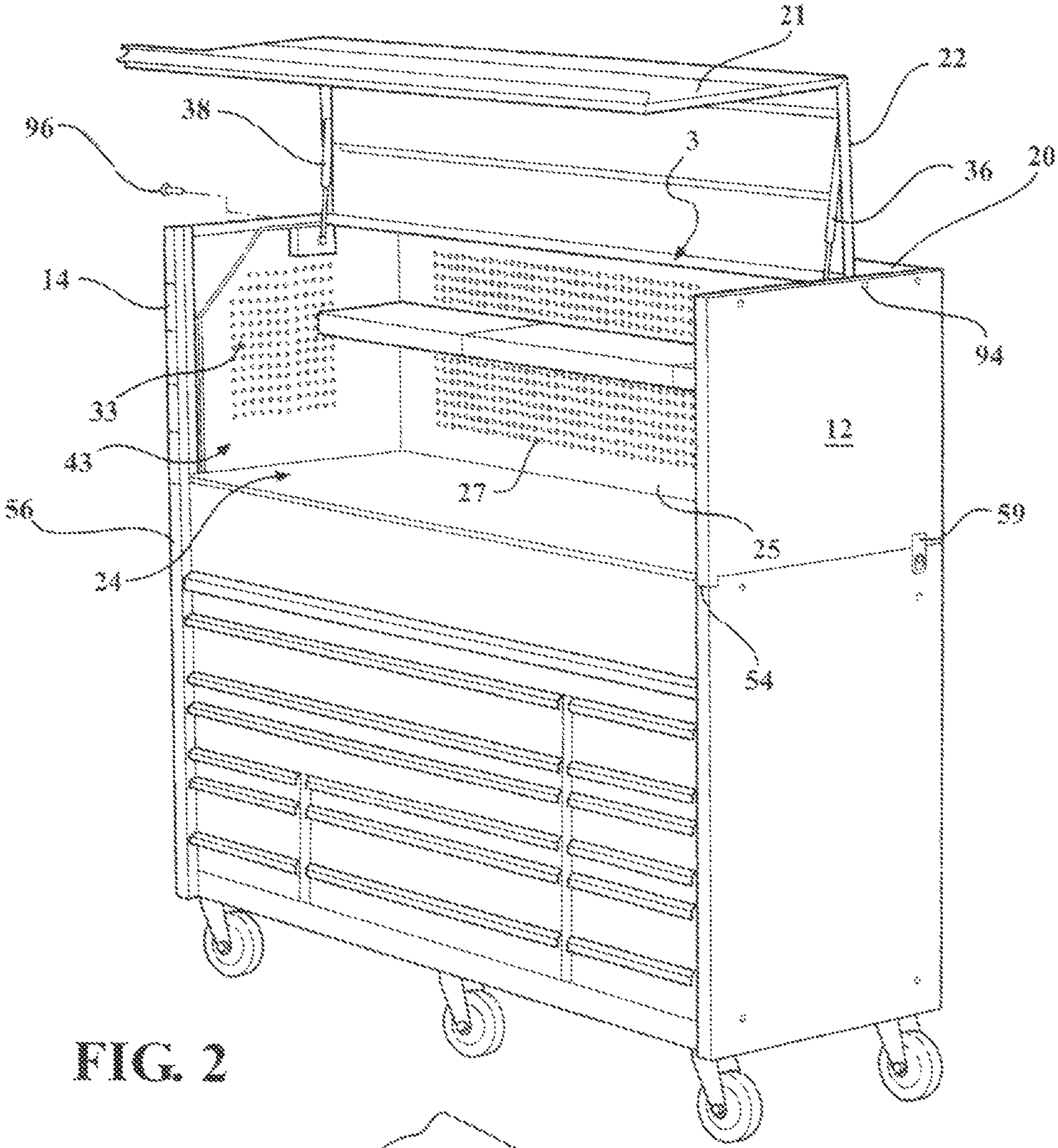
FIG. 2 is a view which is similar to that which is shown in FIG. 1, but in which the storage hutch assembly is shown in a selectively open position in which access to the interior cavity of the storage hutch assembly is allowed.
Figure 3:
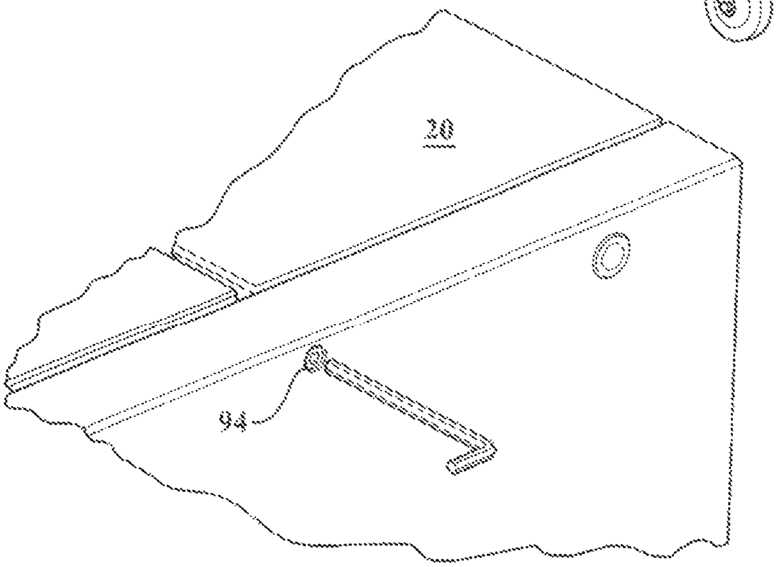
FIG. 3 is a partial view of the top member of the storage hutch assembly which is shown in FIGS. 1 and 2 and which illustrates the preferred, although non-limiting, method for attaching the top panel to the side panels of the hutch assembly of the various inventions.
Figure 4:
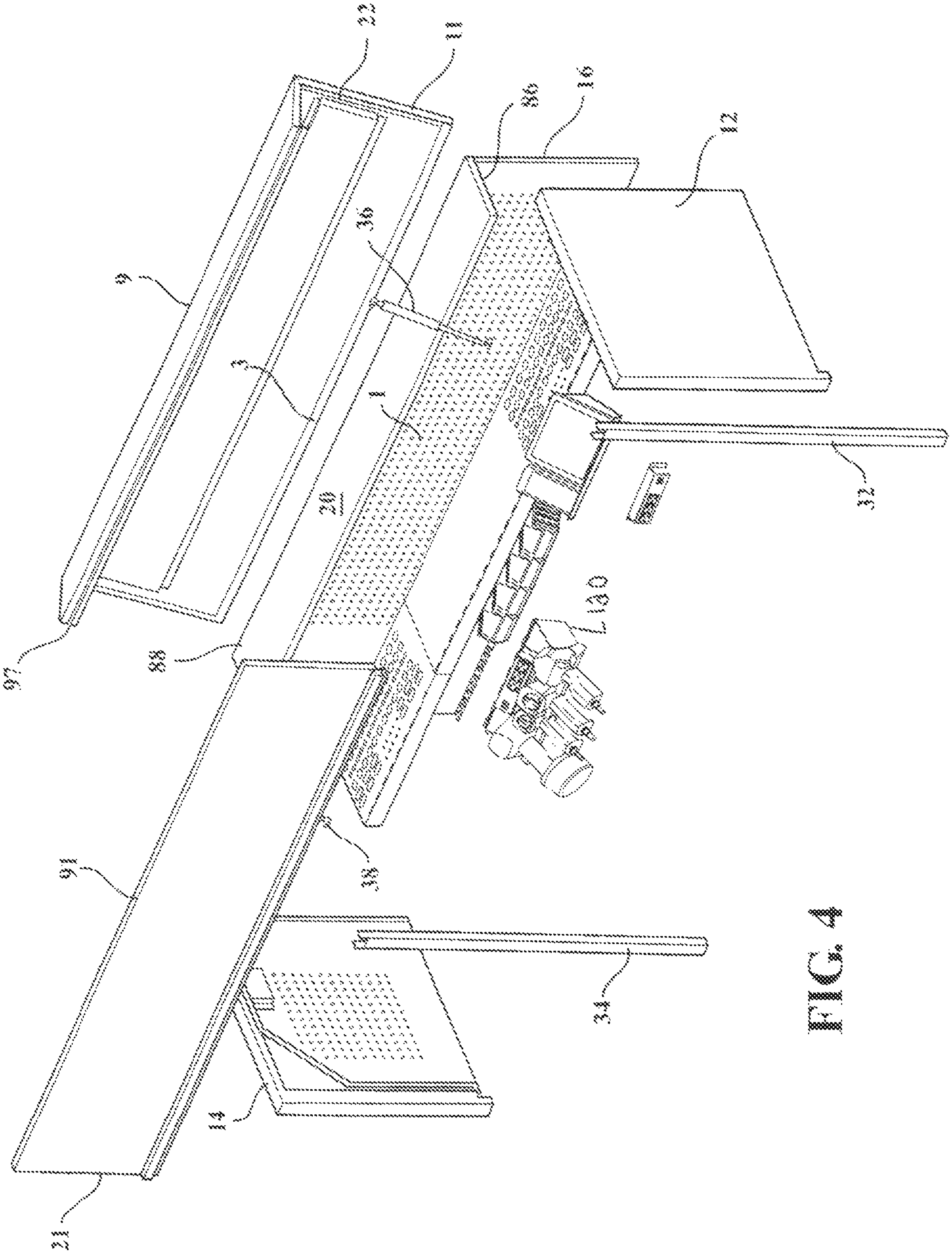
FIG. 4 is an unassembled exploded perspective view of the storage hutch assembly which is shown in FIGS. 1 and 2 in combination with a storage assembly.
Figure 5:
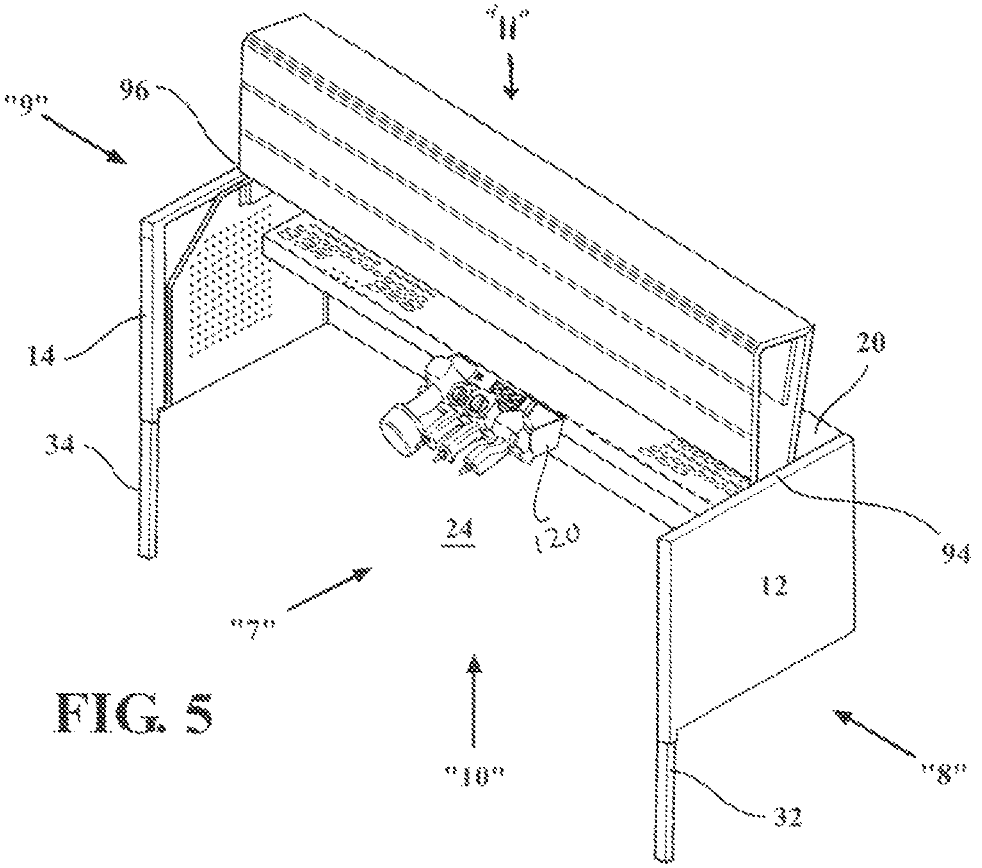
FIG. 5 is a perspective view of the storage hutch assembly which is shown in FIGS. 1, 2, and 3 and further shown in a selective open position.
Figure 6:
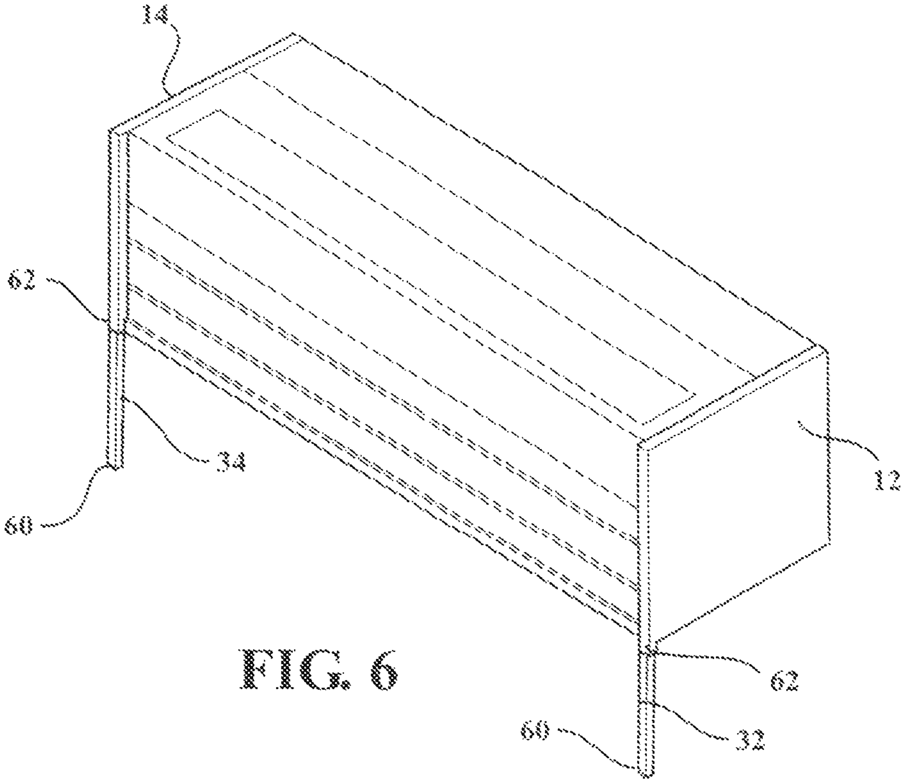
FIG. 6 is a view which is similar to that which is shown in FIG. 5, but in which the storage hutch assembly is shown in a selectively closed position.
Figure 7:
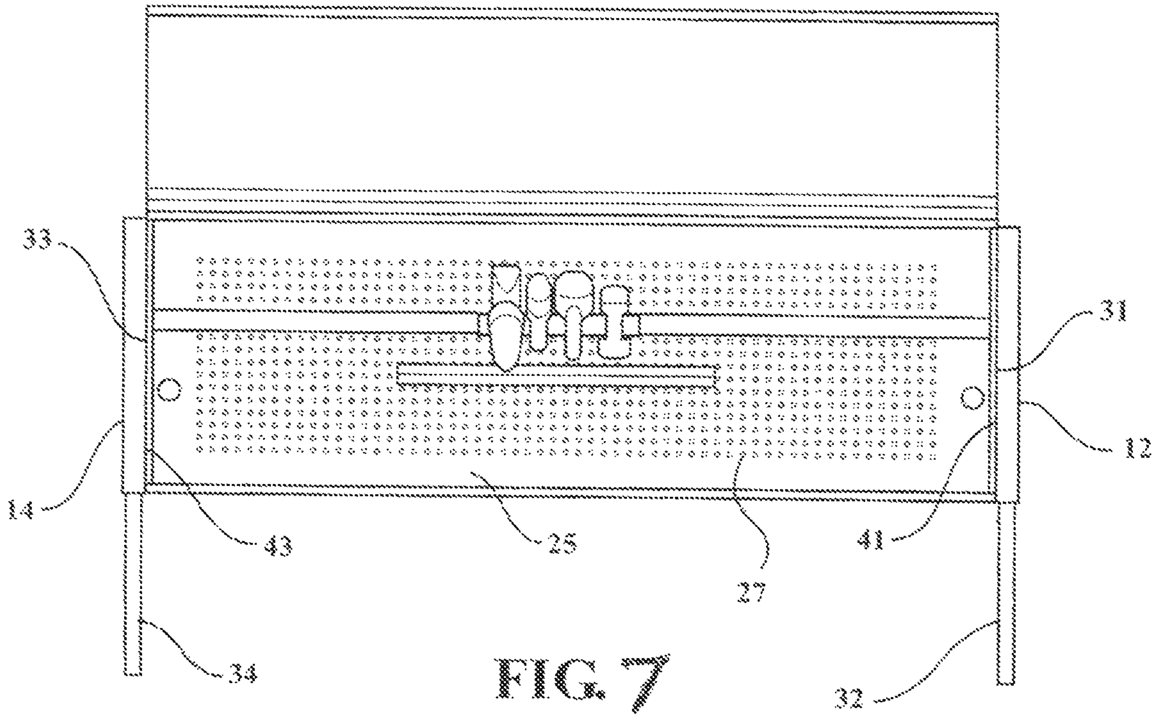
FIG. 7 is a front view taken in the direction of view arrow "7" of the storage hutch assembly which is shown in FIG. 5.
Figure 8:
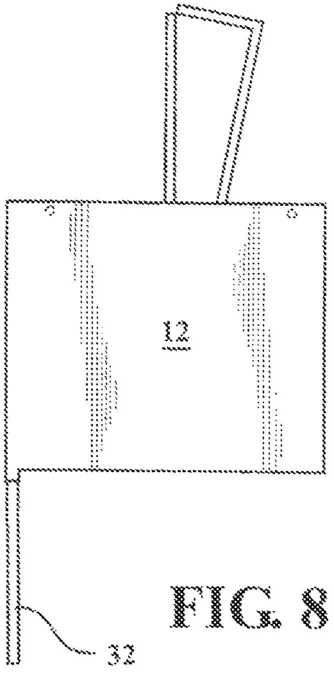
FIG. 8 is a side view of the storage hutch assembly which is shown in FIG. 5 and taken in the direction of view arrow "8".
Figure 9:
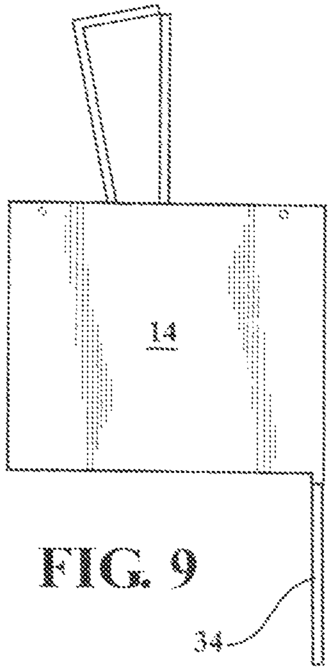
FIG. 9 is a side view of the storage hutch assembly which is shown in FIG. 5 and taken in the direction of view arrow "9".
Figure 10:
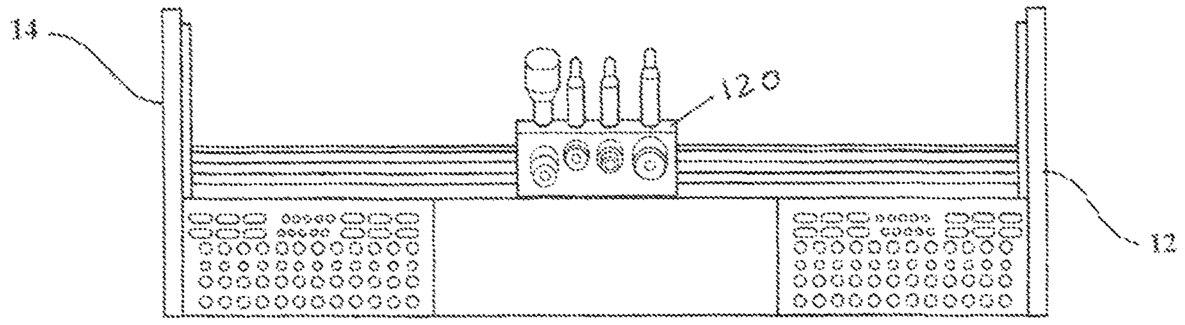
FIG. 10 is a bottom view of the storage hutch assembly which is shown in FIG. 5 and taken in the direction of view arrow "10".
Figure 11:
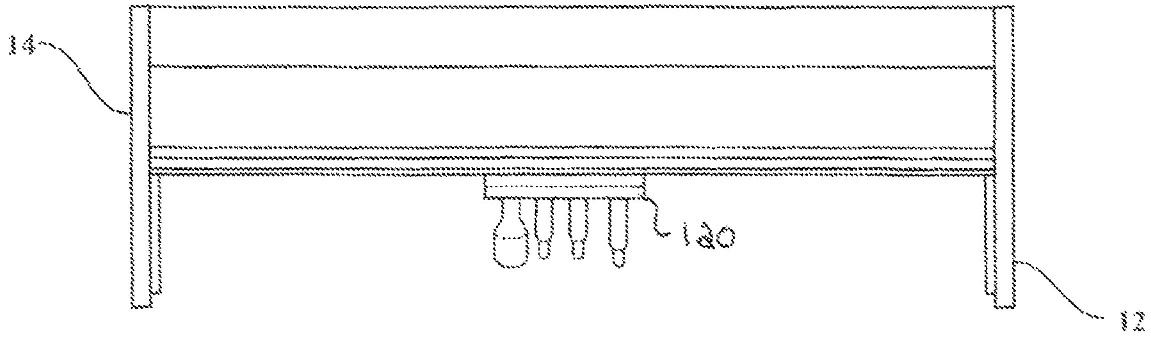
FIG. 11 is a top view of the storage hutch assembly which is shown in FIG. 5 and taken in the direction of view arrow "11".
Figure 13:
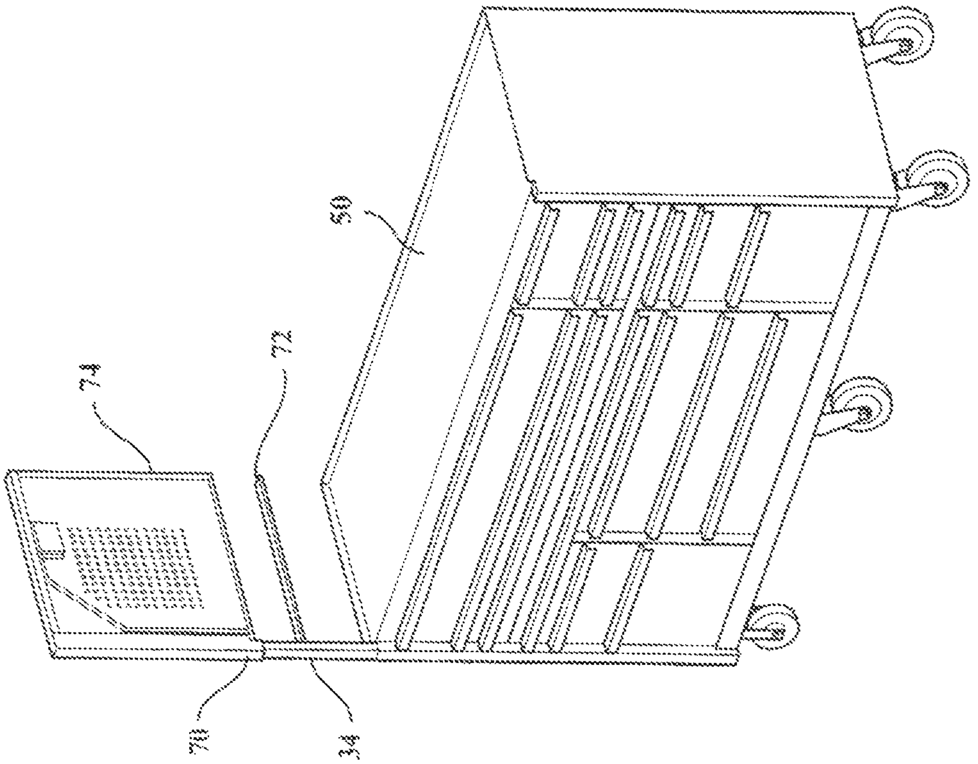
FIG. 13 is a view similar to that which is shown in FIG. 12 but further showing the selective connection of a spacer bar to the side panel shown in FIG. 11.
Figure 12:
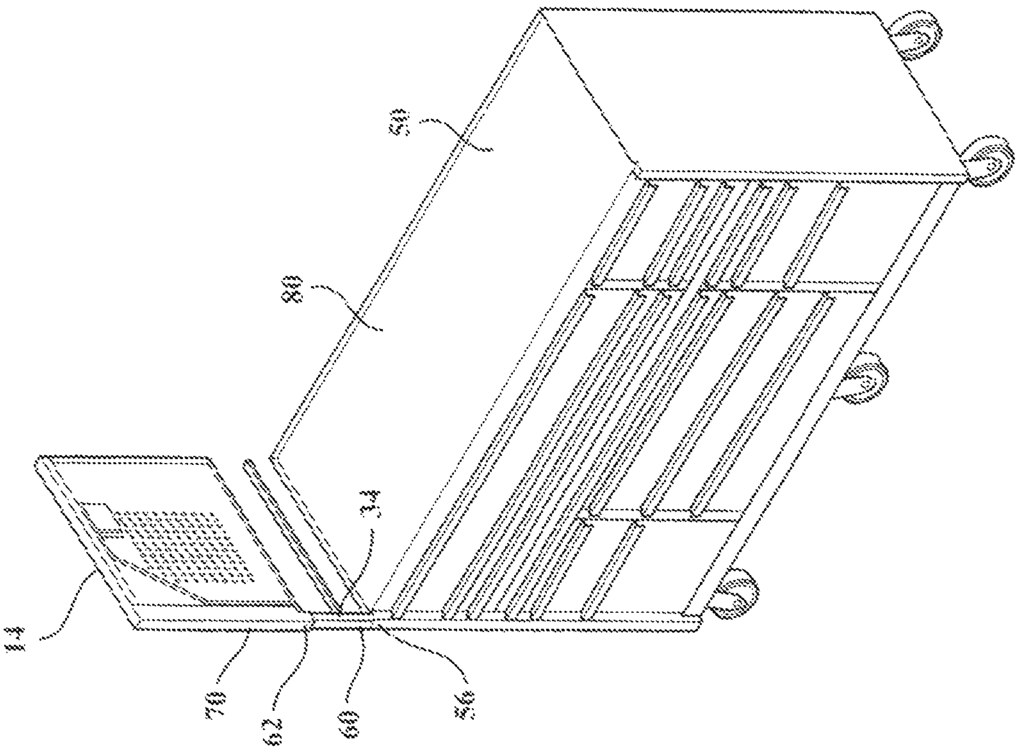
FIG. 12 is a perspective unassembled partial view of the storage hutch assembly shown in FIGS. 1-11 and showing the connection of a side panel to the cabinet which is shown in FIG. 1.
Figure 14:
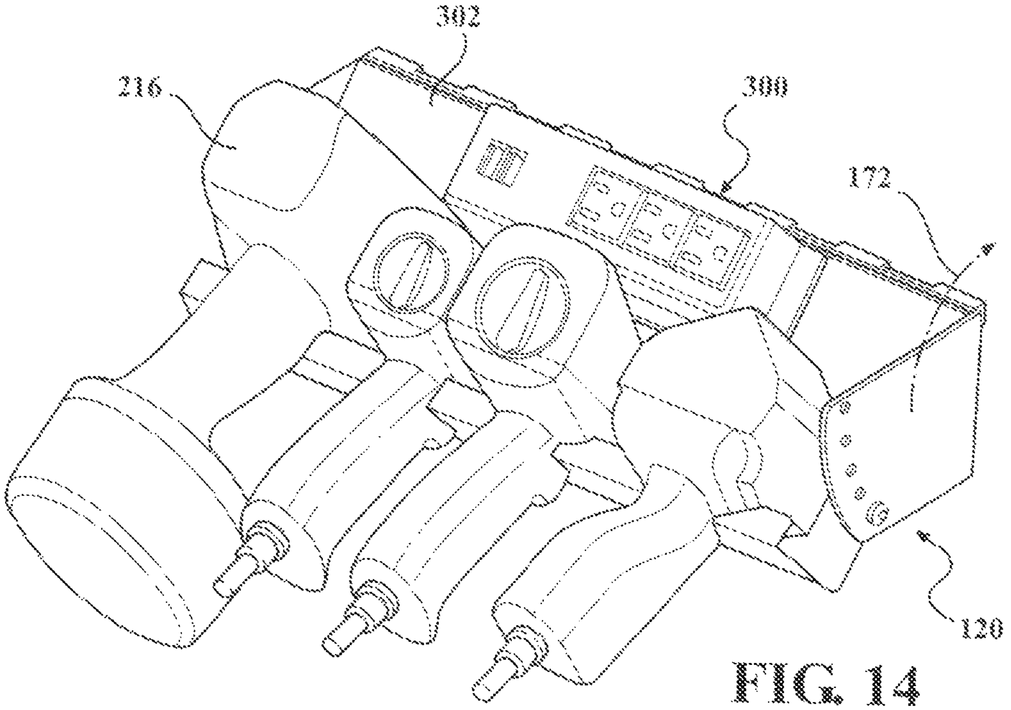
FIG. 14 is a perspective view of a power tool holder storage assembly which is made in accordance with the teachings of the preferred embodiment of the various inventions and shown as selectively containing power tools and an electrical power receptacle.
Figure 15:
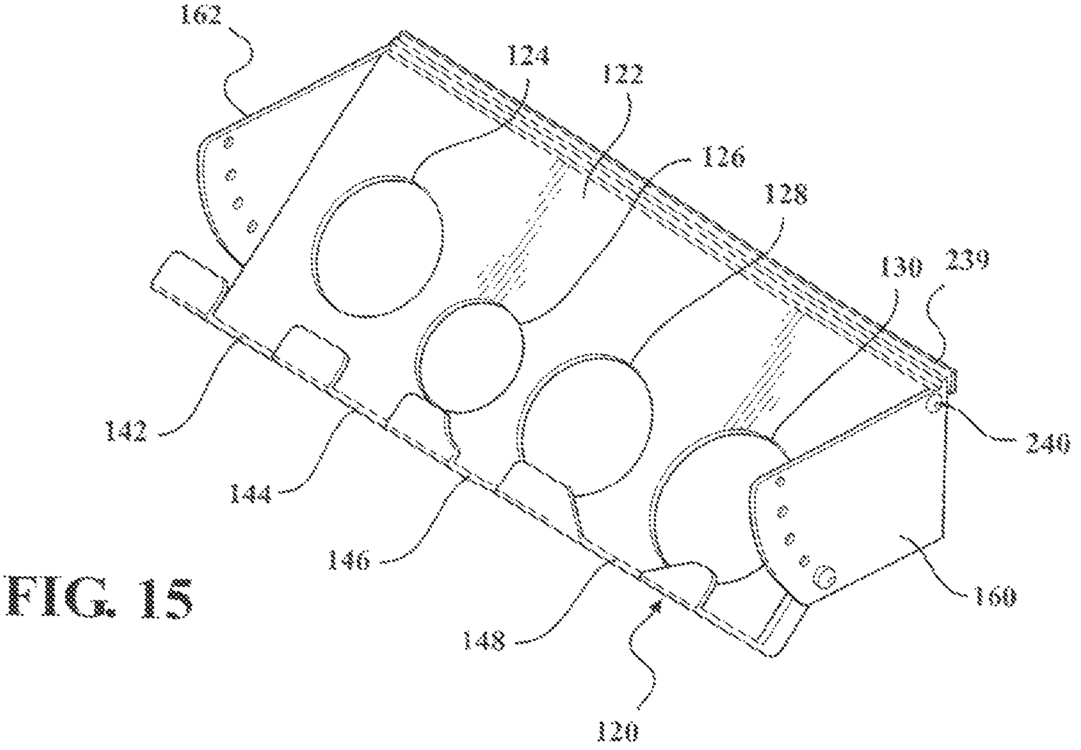
FIG. 15 is a view which is similar to that shown in FIG. 14 but without the power tools and the electrical power receptacle.
Figure 16:
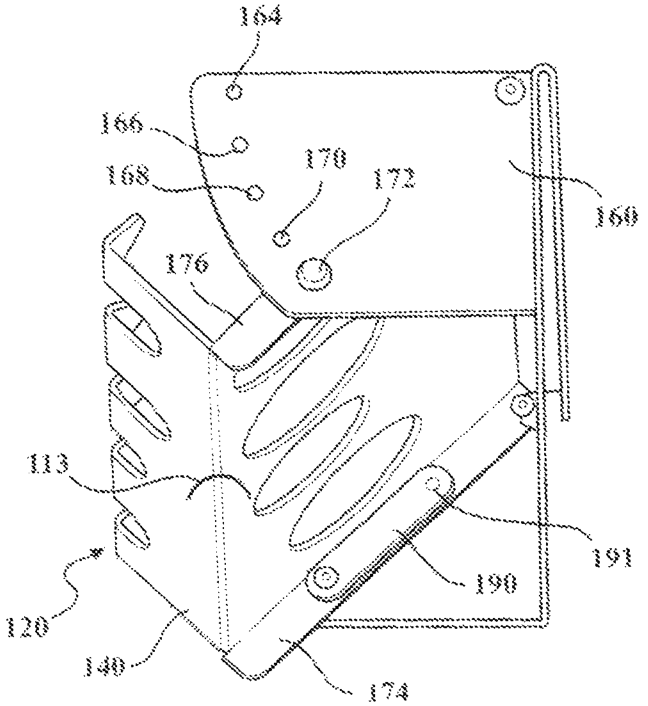
FIG. 16 is a side view of the power tool storage assembly shown in FIGS. 14 and 15 and further shown in a fully extended position.
Figure 17:
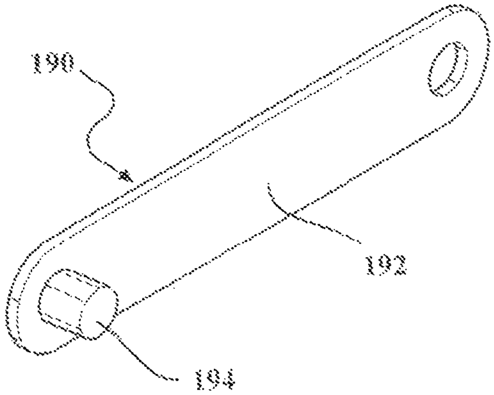
FIG. 17 is a perspective view of the connection member portion of the power tool holder shown in FIGS. 14-16.

Thus, as perhaps best shown in FIG. 2, an interior storage cavity 24 is formed and the shelf 30 is deployed within the formed interior storage cavity 24. The assembled top panel 22 is selectively movable between an open position in which the interior storage cavity 24 is accessible to a closed positon in which the interior storage cavity 24 is made inaccessible (as is perhaps best shown in FIG. 1) or closed.

Figure 18:
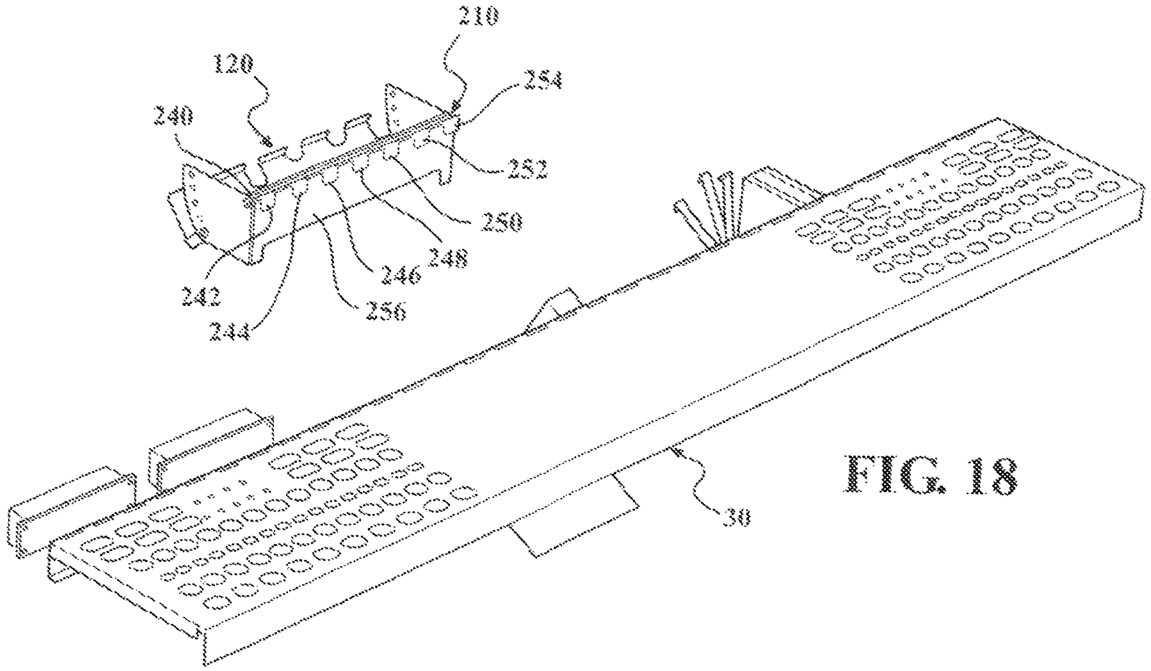
FIG. 18 is a perspective view of the combination of the shelf portion of the storage hutch which is made in accordance with the teachings of the preferred embodiment of the various inventions and the power tool storage assembly shown in FIGS. 14-17.
Figure 19:
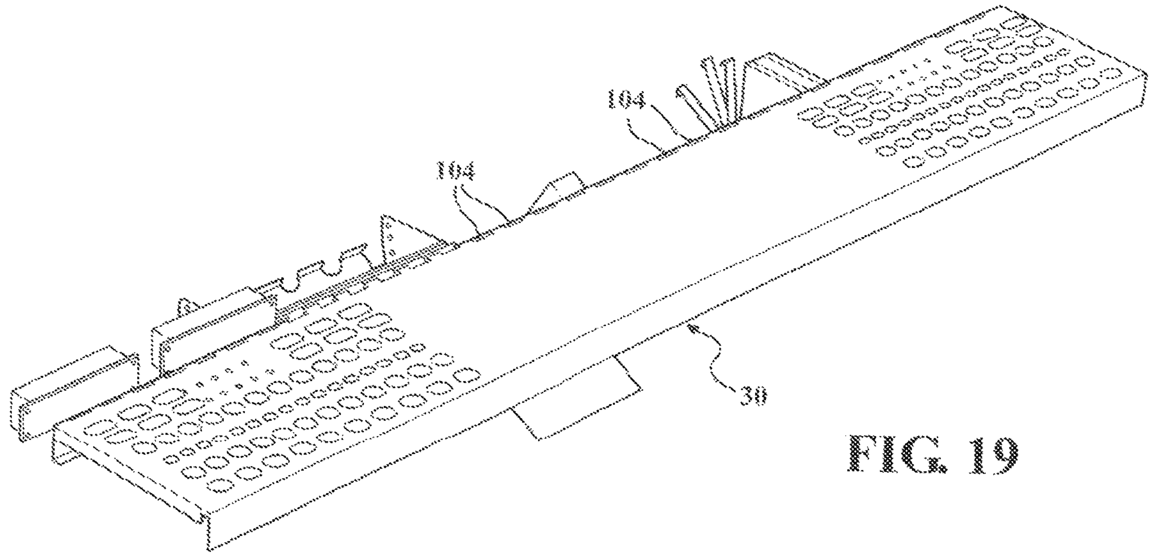
FIG. 19 is a view which is similar to that which is shown in FIG. 18 but in which the power tool storage assembly is selectively coupled to the shelf.
Figures 22, 27, 28:
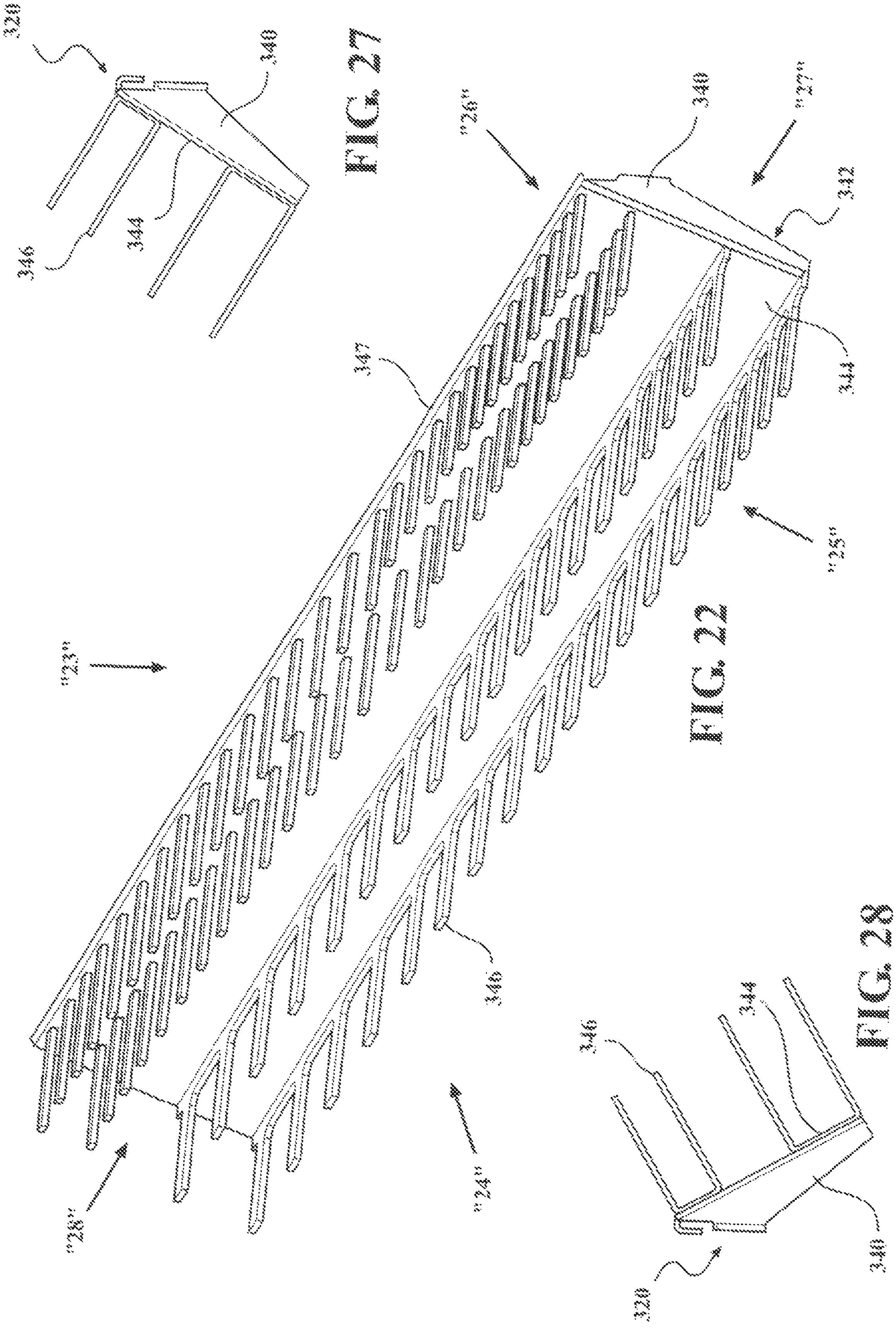
FIG. 22 is a perspective view of a socket assembly which is made in accordance with the teachings of the preferred embodiment of the various inventions.
FIG. 27 is a side view of the socket assembly which is shown in FIG. 22 and taken in the direction of view arrow "27".
FIG. 28 is a side view of the socket assembly which is shown in FIG. 22 and taken in the direction of view arrow "28".
Figure 23:
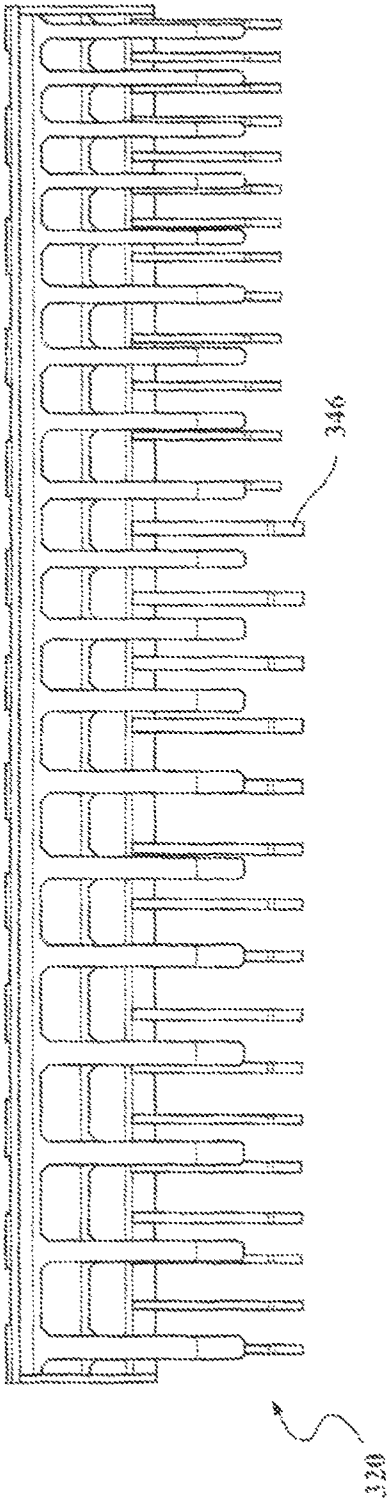
FIG. 23 is a top view of the socket assembly which is shown in FIG. 22 and taken in the direction of view arrow "23".
Figure 24:
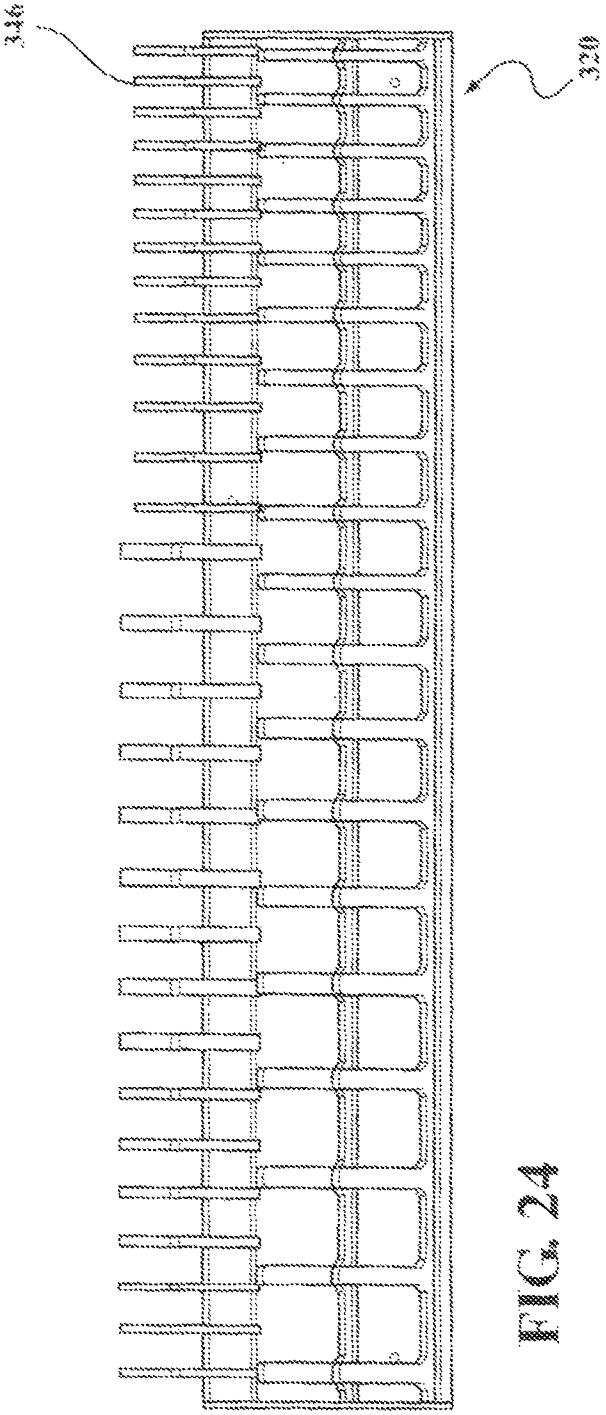
FIG. 24 is a front view of the socket assembly which is shown in FIG. 22 and taken in the direction of view arrow "24".
Figure 25:
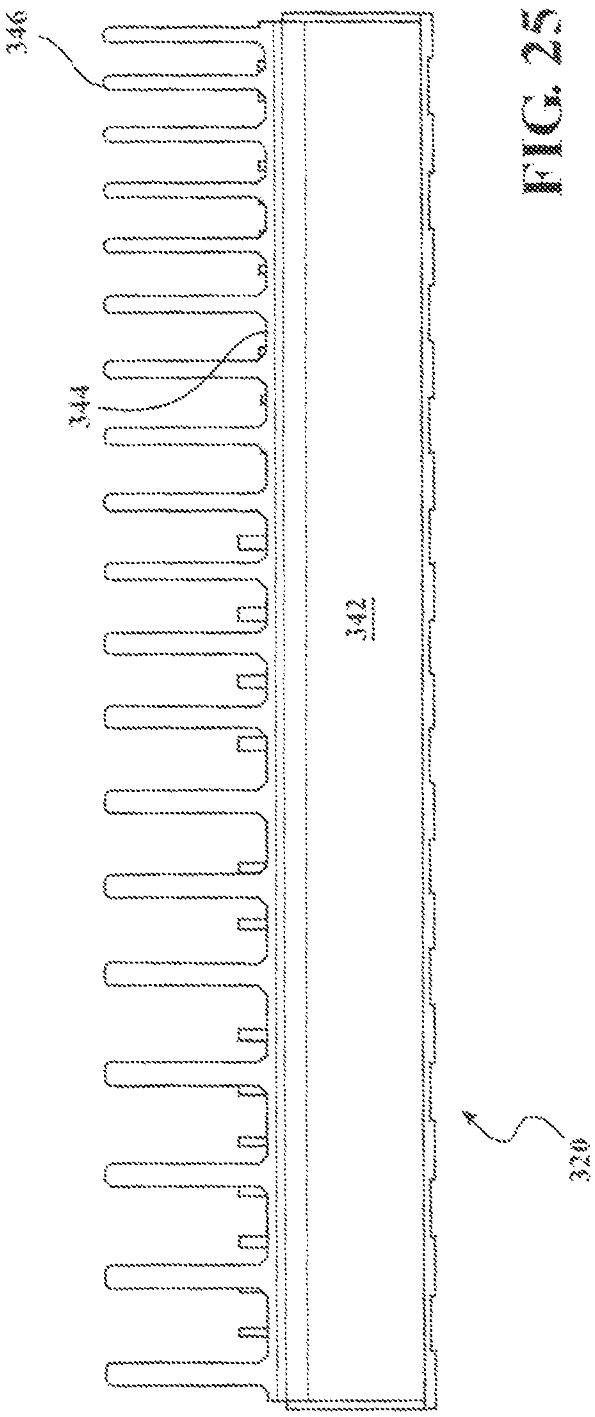
FIG. 25 is a bottom view of the socket assembly which is shown in FIG. 22 and taken in the direction of view arrow "25".
Figure 26:
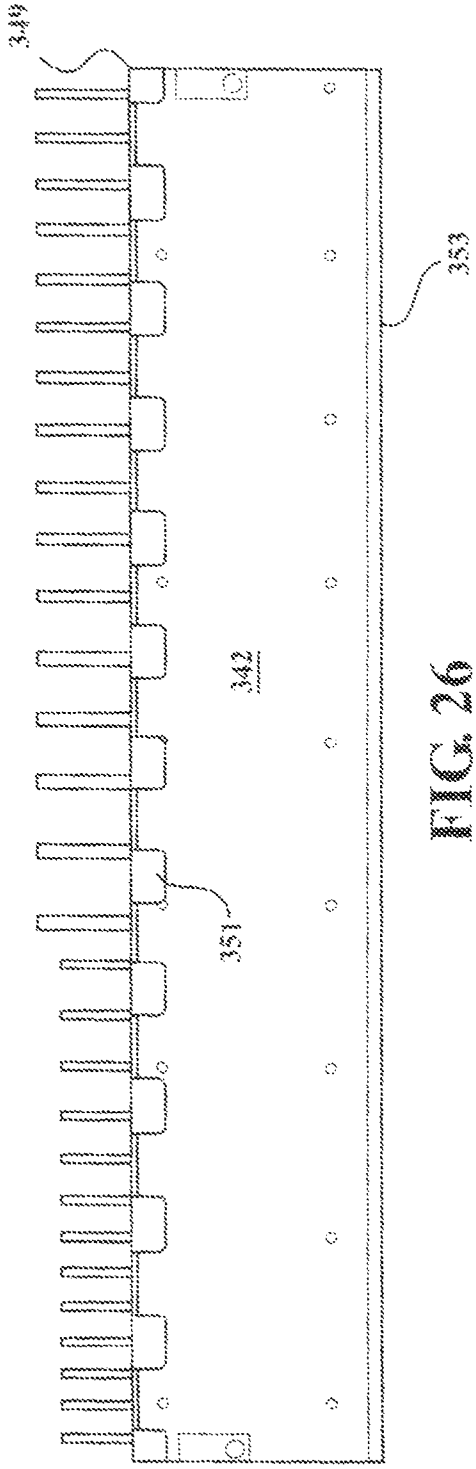
FIG. 26 is a back view of the socket assembly which is shown in FIG. 22 and taken in the direction of view arrow "26".
Figure 29:
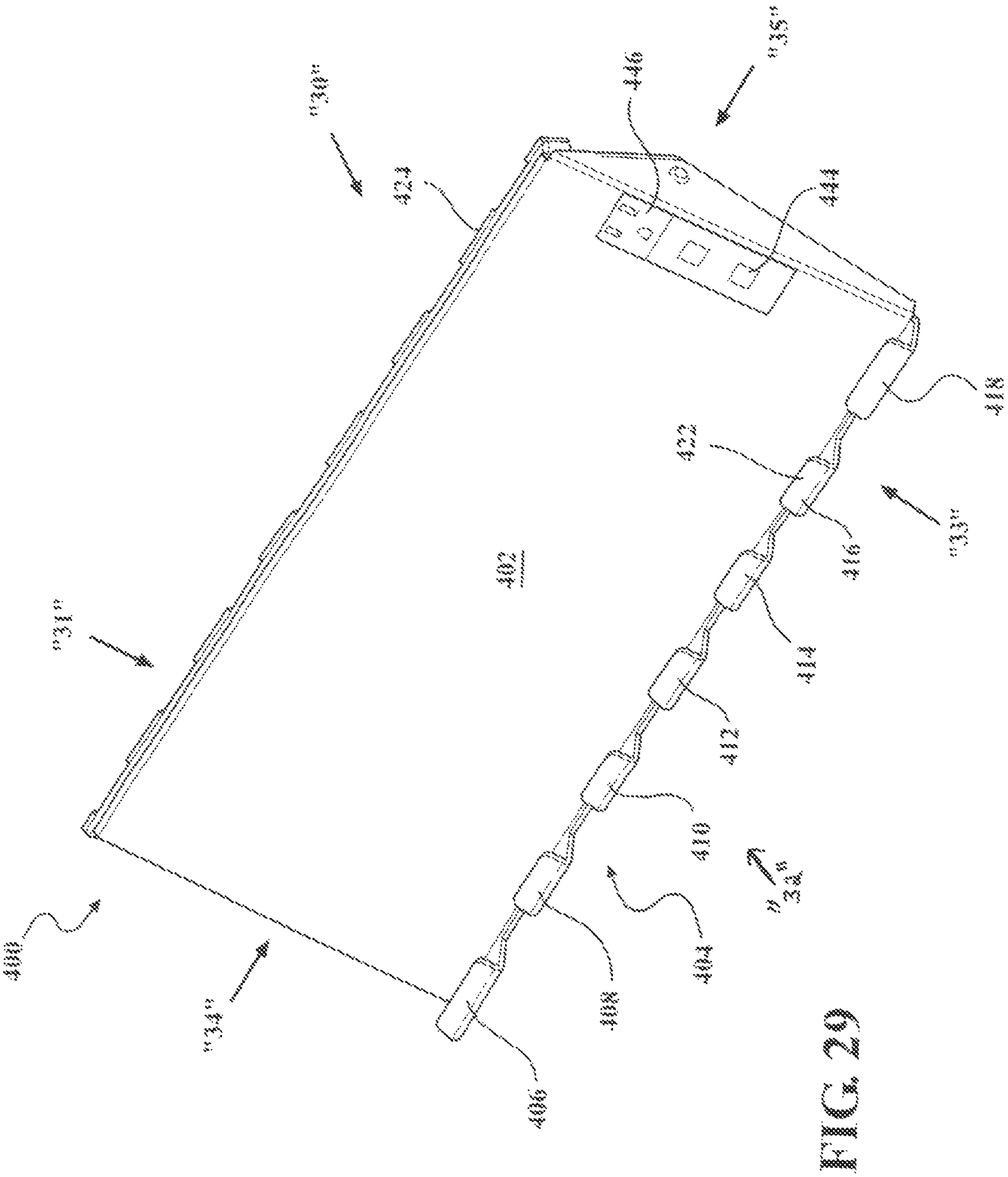
FIG. 29 is a perspective view of a media stand which is made in the accordance with the teachings of the preferred embodiment of the various inventions.
Figure 30:
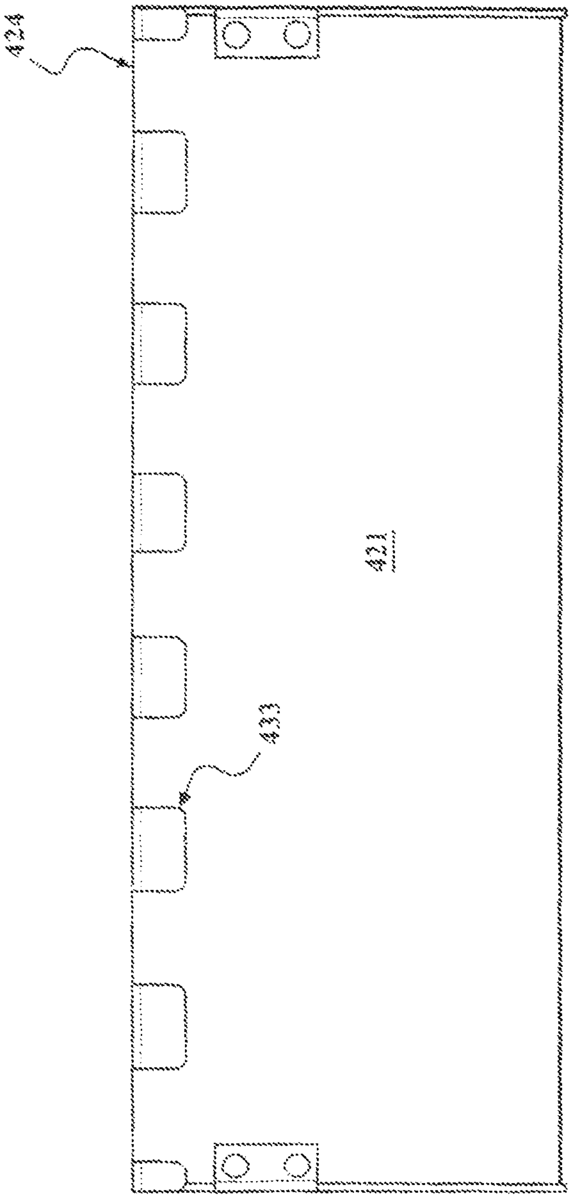
FIG. 30 is a back view of the media stand which is shown in FIG. 29 and taken in the direction of view arrow "30".
Figure 31:
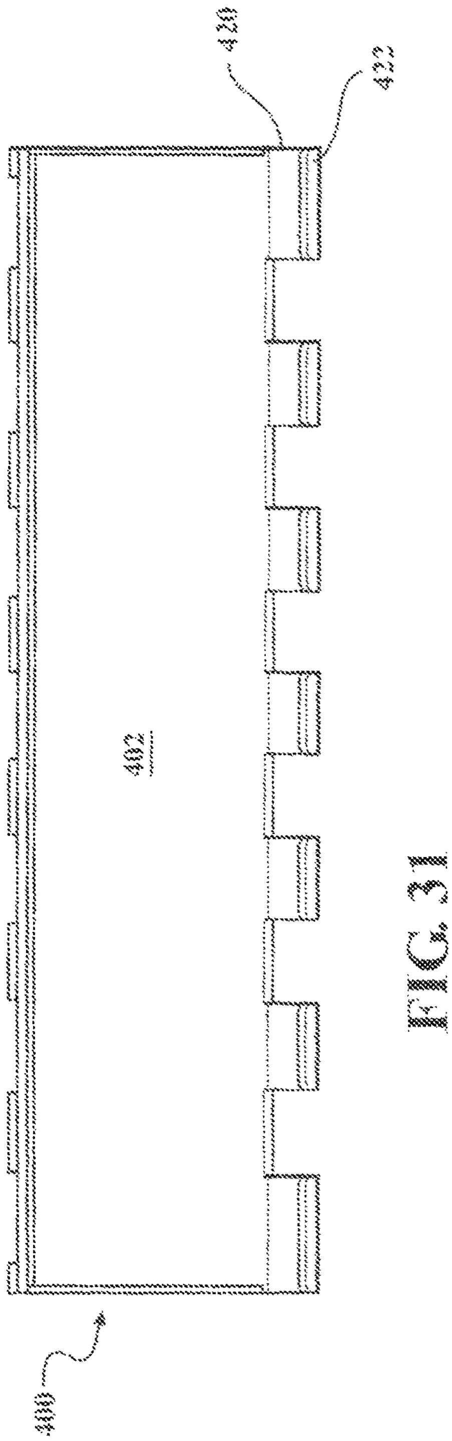
FIG. 31 is a top view of the media stand which is shown in FIG. 29 and taken in the direction of view arrow "31".
Figure 32:
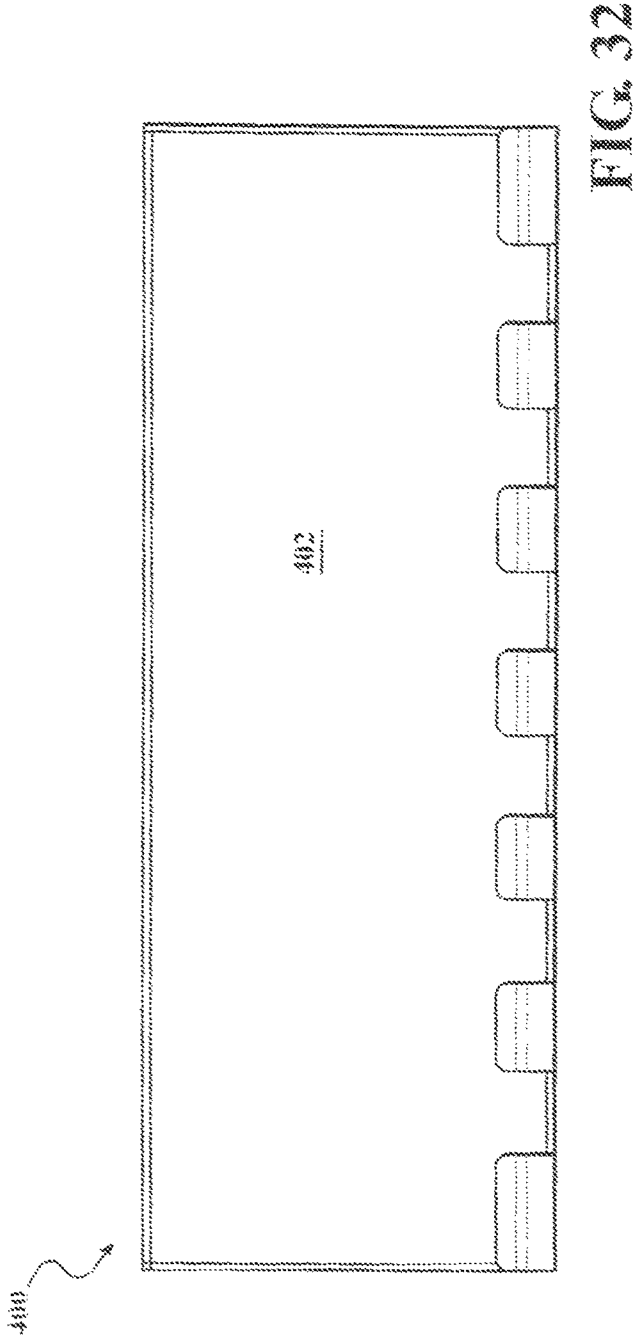
FIG. 32 is a front view of the media stand which is shown in FIG. 29 and taken in the direction of view arrow "32".
Figure 33:
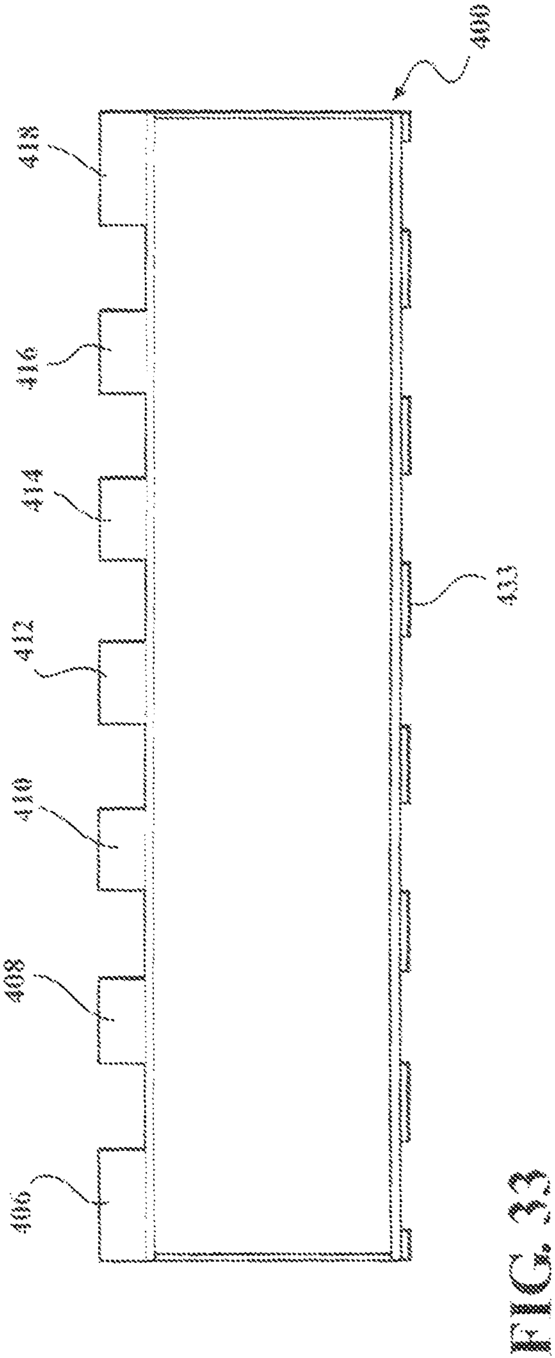
FIG. 33 is a bottom view of the media stand which is shown in FIG. 29 and taken in the direction of view arrow "3".
Figure 34:
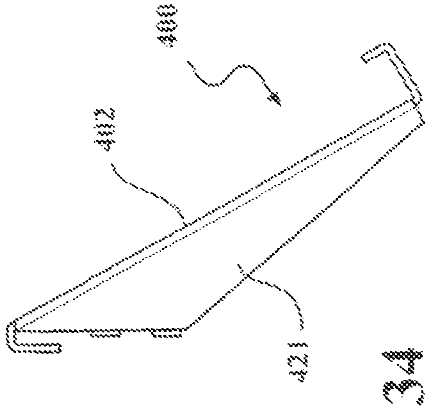
FIG. 34 is a side view of the media stand which is shown in FIG. 29 and taken in the direction of view arrow "34".
Figure 35:
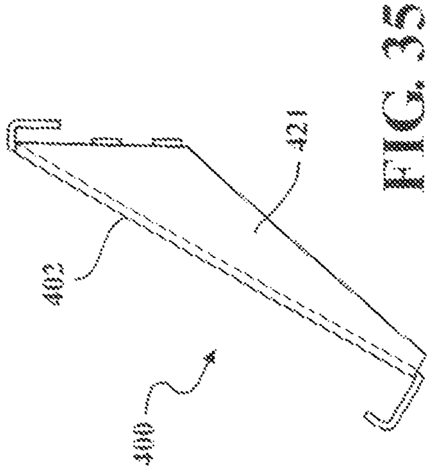
FIG. 35 is a side view of the media stand which is shown in FIG. 29 and taken in the direction of view arrow "35".
Figure 36:
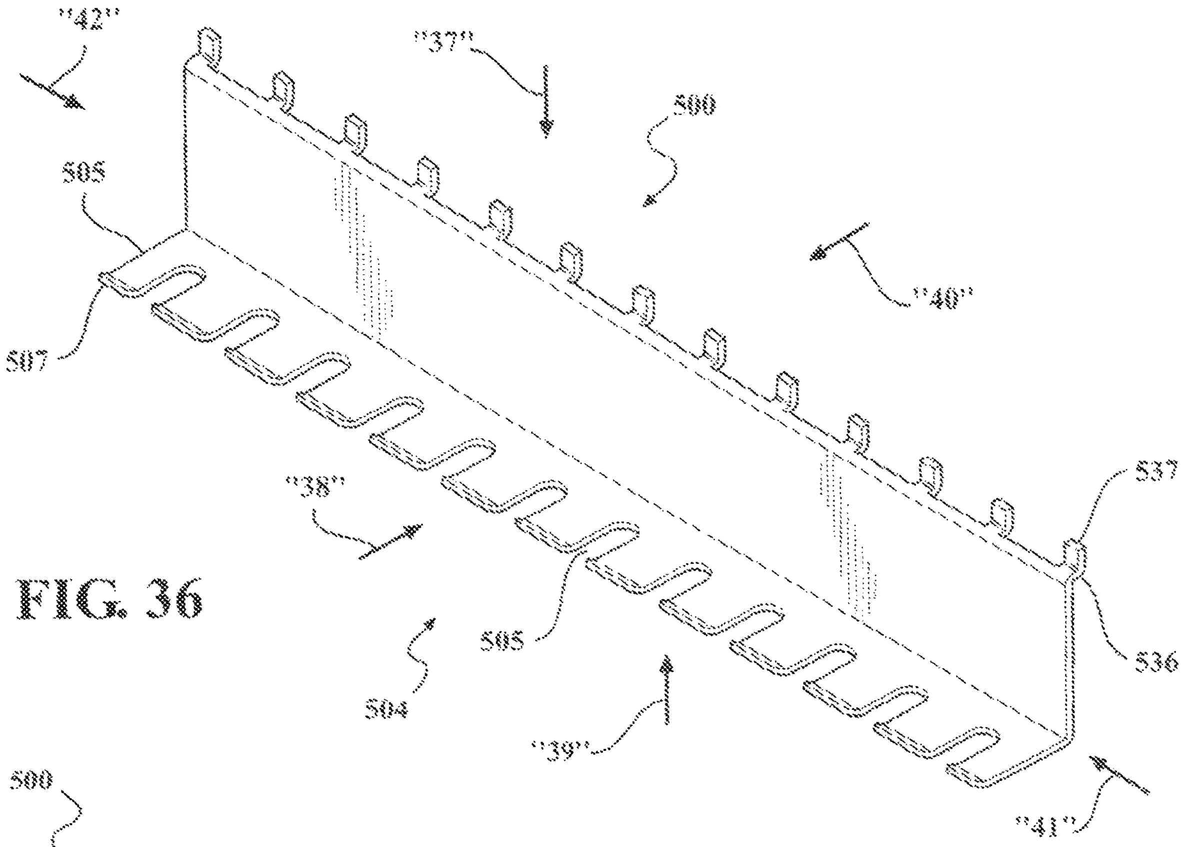
FIG. 36 is a perspective view of a tool holder which is made in the accordance with the teachings of the preferred embodiment of the various inventions.
Figure 37:
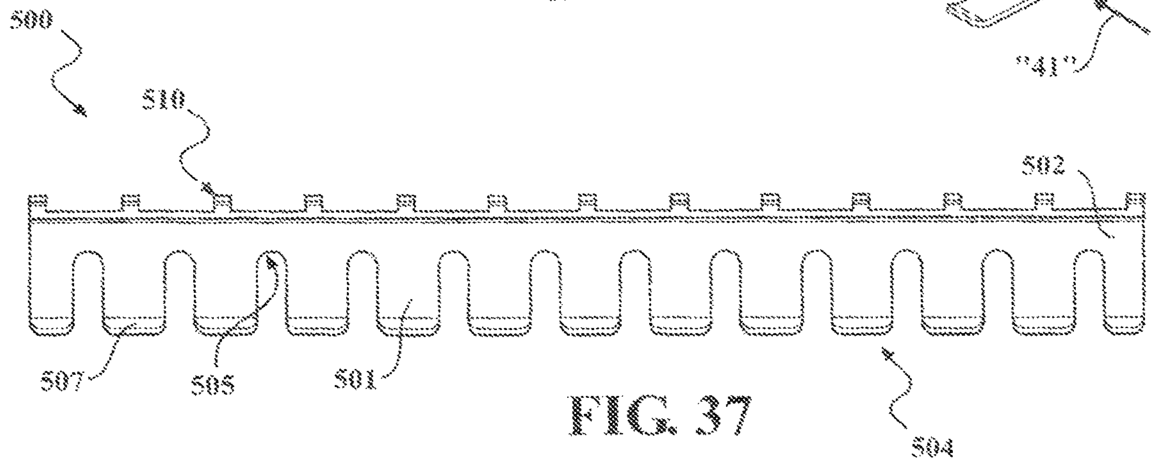
FIG. 37 is a top view of the tool holder which is shown in FIG. 36 and taken in the direction of view arrow "37".
Figure 38:
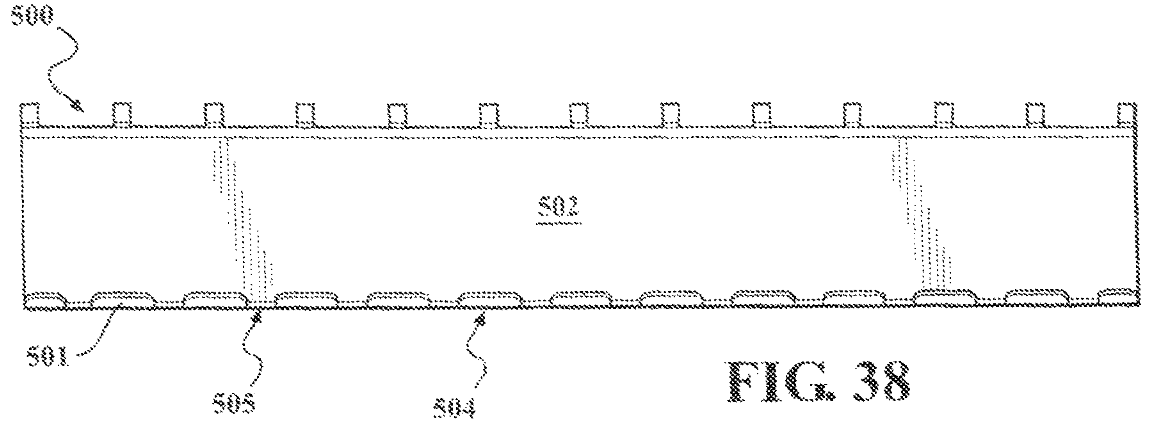
FIG. 38 is a front view of the tool holder which is shown in FIG. 36 and taken in the direction of view arrow "38".
Figure 43:
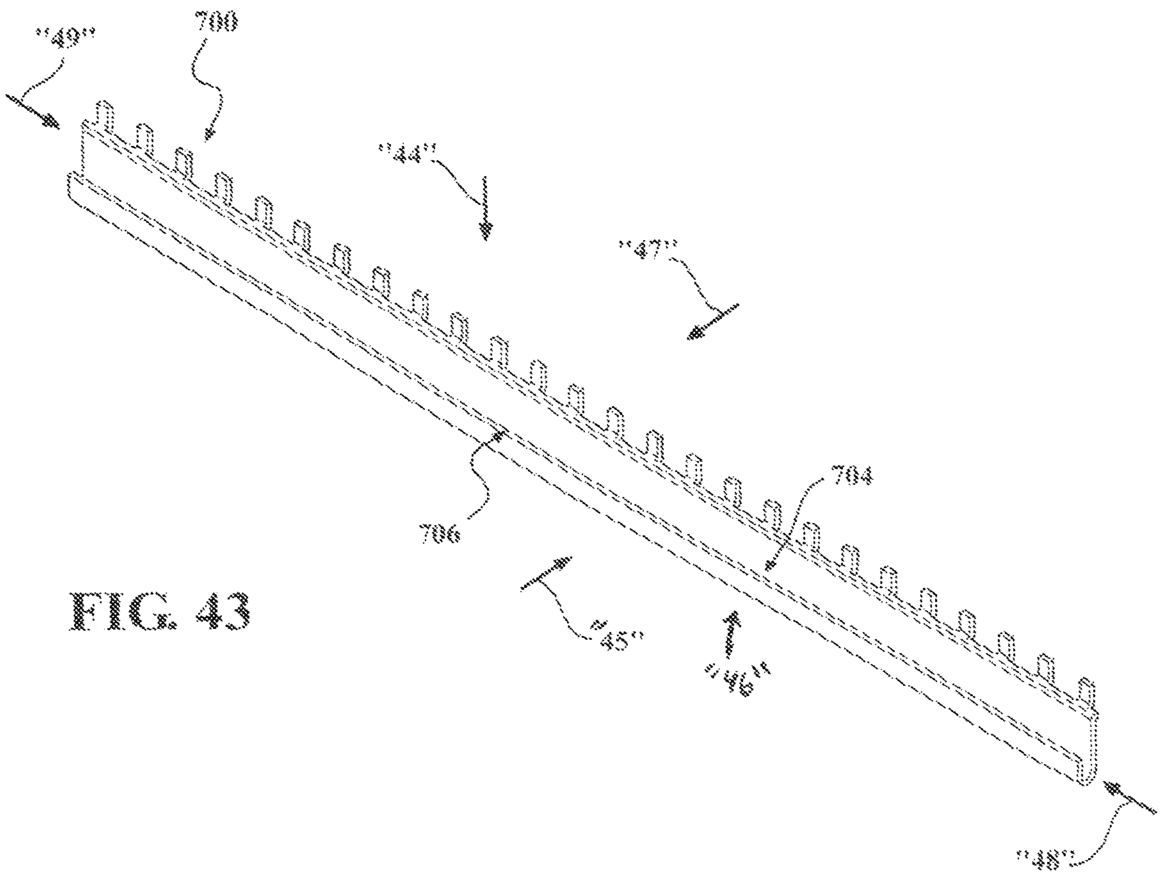
FIG. 43 is a perspective view of a parts bin holder which is made in the accordance with the teachings of the preferred embodiment of the various inventions.
Figure 44:
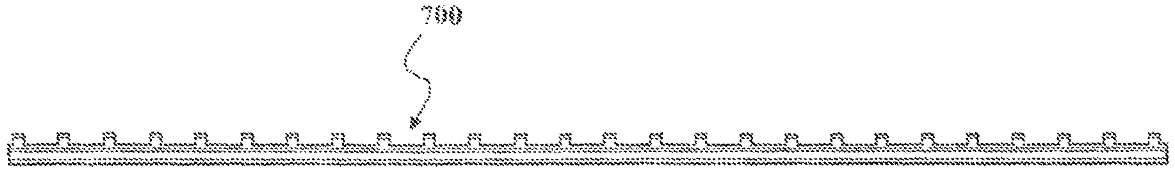
FIG. 44 is a top view of the parts bin holder which is shown in FIG. 43 and taken in the direction of view arrow "37".
Figure 45:
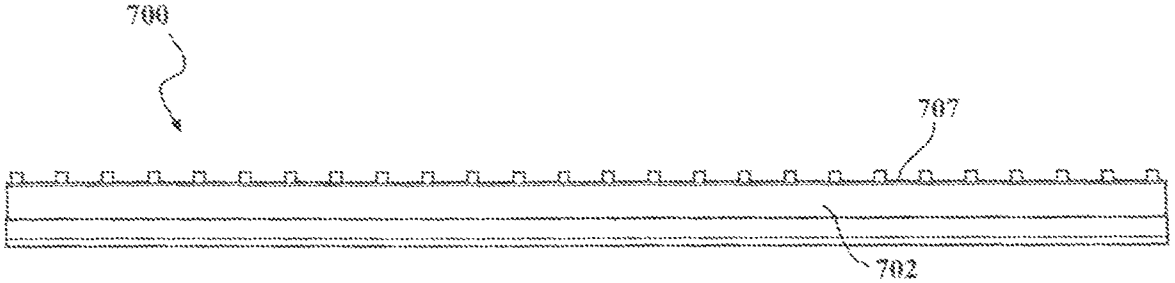
FIG. 45 is a front view of the parts bin holder which is shown in FIG. 43 and taken in the direction of view arrow "45".
Figure 46:
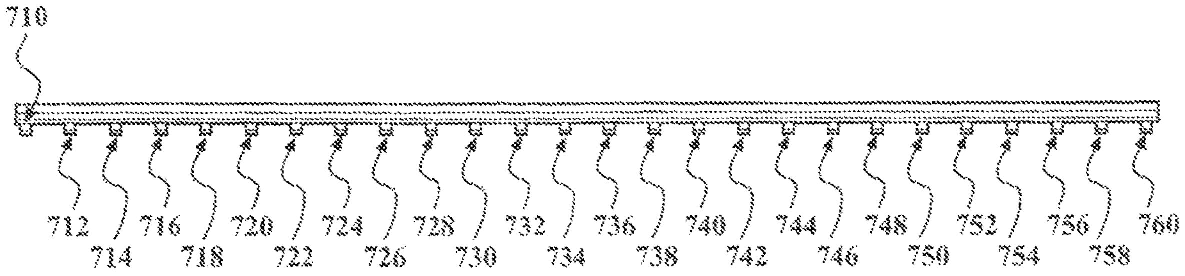
FIG. 46 is a bottom view of the parts bin holder which is shown in FIG. 43 and taken in the direction of view arrow "46".
Figure 47:
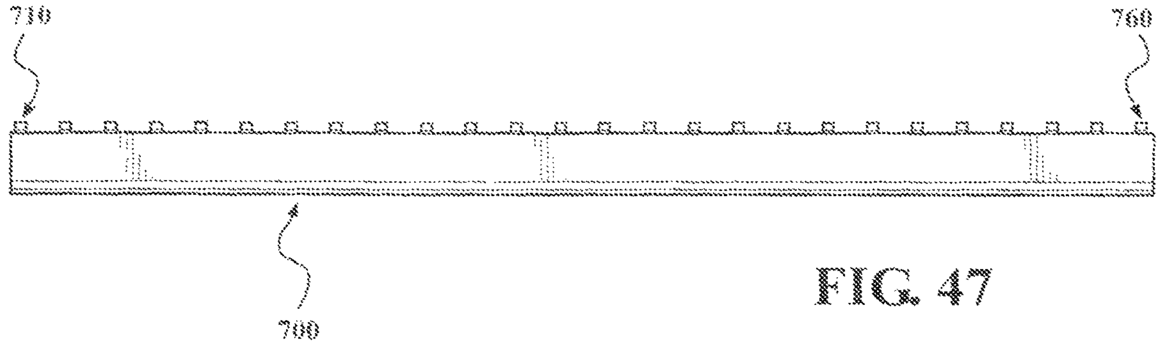
FIG. 47 is a back view of the parts bin holder which is shown in FIG. 43 and taken in the direction of view arrow "47".
Figure 48:
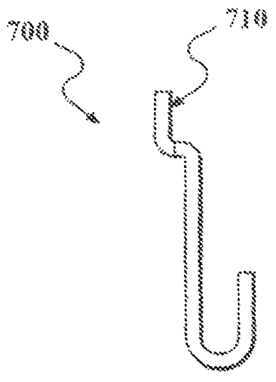
FIG. 48 is a side view of the parts bin holder which is shown in FIG. 43 and taken in the direction of view arrow "48".
Figure 49:
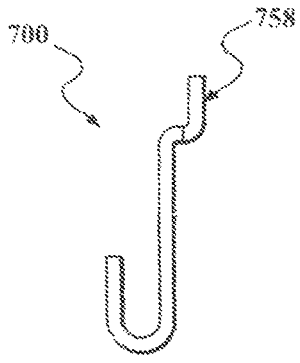
FIG. 49 is a side view of the parts bin holder which is shown in FIG. 43 and taken in the direction of view arrow "49".

According to one non-limiting aspect of the present inventions, the contained shelf 30 is configured to selectively receive a plurality of dissimilar storage assemblies in order to facilitate the storage of a variety of dissimilar items. For this reason, according to one non-limiting embodiment of the inventions and as best shown perhaps in FIGS. 18, 19, and 21, the contained shelf 30 includes a plurality of spaced apart and substantially identical tab receptacle openings 104 along the leading edge 108 (the longitudinal edge closest to the front panel 20) and a variety of dissimilar openings 107 in the top shelf surface 110.

Referring now to FIGS. 14-20, there is shown a power tool storage assembly 120 which is made in accordance with the teachings of the preferred embodiment of the various inventions.

The assembly 120 includes a retention portion 122 having a plurality of dissimilarly sized holes or openings 124, 126, 128, and 130 all of which are not aligned (the respective center points of openings 124-130 do not all lie along the same axis). The assembly 120 further includes a support portion 140 which angularly projects from the retention portion 122 and which includes notches 142, 144, 146, and 148 and these notches 142-148 are respectively aligned with a unique one of the openings 124-130. In this context, the term "aligned" means that the center point of a notch lies along the same axis as the center point of an opening and that this axis is an axis of symmetry of both the aligned notch and opening. In one non-limiting embodiment, the angle 113 between the retention portion 122 and the support portion 140 is an acute angle and remains fixed. Other angles may be utilized and in other non-limiting embodiments instead of being integrally formed together, the support portion 140 may be hinged to the retention portion 122 allowing for selective movement between the support portion 140 and the retention portion 122.

The assembly 120 further includes a pair of identical side members or portions 160, 162 which are each substantially identical and having openings 164, 166, 168, and 170 which lie along an arc 172. Further, upon opposed and respective edges 174, 176 of the retention portion 120 is a pivotally coupled adjustment member 190 having a generally flat body 192 and a protruding member 194. Particularly, a member 190 is pivotally coupled to an edge 174, 176 by a pin 191.

In operation, the retention portion 122 and support portion 140 are integrally formed and selectively move with respect to the side members 160, 162 to a desired position which is then fixed by placement of the members 194 within desired openings 164-170 formed on respective members 160, 162. In this non-limiting embodiment, the retention portion 122 pivots about the outer lip or attachment portion 240. That is, the retention portion 122, in this non-limiting embodiment, includes a projection 239 which is received by the lip 240 and the projection is rotatable within the lip 210 and allows the retention assembly 122 along with the integrally formed support portion 140 to move along arc 172. Alternatively, in yet another non-limiting embodiment of the various inventions, the side members 160, 162 are pivotally attached to the outer lip 210 of the retention portion 122 by a conventional fastener, such as by a bolt, thereby allowing the side members 160, 162 to move along arc 172 and move with respect to the integrally formed retention portion 122 and the support portion 140. In both non-limiting embodiments, there exists selective and relative movement between the side members 160, 162 and the support portion 140 and retention portion 122.

In operation, a power tool, such as a drill 216, may be selectively and removably placed within opening 124 and supported upon and within the assembly 120 by the aligned notch 142. The contained power tool, such as drill 216, may then be easily removed for use and placed back in to the assembly 120 for storage. The positional adjustment, along arc 172, of the side members 160, 162 with respect to the support portion 140 and the reception portion 122 is then made in order to allow the contained power tool 216 to remain firmly positioned within one of the openings 124 and the associated aligned notch 142 and this position is maintained by having respective portion 194 of each respective pin 190 made to reside in the respective opening 164-172 of the respective side members 160, 162 which allows this desired positon to be maintained.

The outer lip or attachment portion 210 forms an outwardly protruding trench 240 and may additionally include a plurality of substantially identical and spaced apart tabs 242, 244, 246, 248, 250, 252, and 254 which project away from the outer lip 210 parallel to the flat back surface 256 of the assembly 120. In this manner, the tabs 242-254 may be selectively and removably placed within the openings 104, thereby coupling the assembly 120 to and upon the contained shelf 30. As is perhaps best shown best in FIG. 20, the tabs 242-254 may be used to selectively and removably couple the assembly 120 to the outer edge 292 of a cart, such a cart 50.

Moreover, in other non-limiting embodiments, an electrical power receptacle assembly 300 and/or a data communication assembly (e.g., a USB type of data port) 302 may be attached to the retention portion (perhaps best shown in FIG. 14) and these assemblies 300, 302 may also or alternatively attached to the shelf 30 (perhaps best shown in FIG. 21).

In further non-limiting embodiments of the inventions, the adjustment members 190 may not be used and instead selectively compressible pins may protrude away from the respective edges 174, 176 and toward the respective side members 160, 162. These selectively compressible pins may be selectively and removably fitted or placed within the respective openings upon the side members 160, 162 to fix the positon of the portions 122, 140 with respect to the side members 160, 162. Other types of fasteners may also be used such as a nuts and bolts (e.g., holes would be created along edges 174, 176 and be respectively aligned with the opening of the side members 160, 162 and a nut could then traverse a pair of aligned openings (one opening upon an edge 174, 176 and one opening upon a side member 160, 162) and then receive a nut to hold it in place. This could be accomplished for each edge 174, 176 and each side member 160, 162. Any other type of known fastener could also be used to selectively secure the side plates 160, 162 to the edges 174, 176 and nothing in this description limits the type or number of such utilized fasteners.

Referring now to FIGS. 23-28, there is shown a socket reception assembly 320 which is made in accordance with the teachings of the preferred embodiment of the various inventions.

As shown, socket reception assembly 320 comprises a base portion 340 having a flat back surface 342 and a generally triangular cross sectional area and a substantially flat frontal surface 344 upon which a plurality of generally rounded projection members 346 are disposed. Particularly, in this preferred although non-limiting embodiment of the various inventions, the projection members 346 may be of various lengths and each project away from the frontal surface 344 and away from the flat back surface 342. These lengths may be such as to receive ⅜ inch drive sockets, ½ inch drive sockets, and Y inch drive sockets, although other lengths may be utilized and nothing in this description is intended to limit the number or length of such projection members 346. Importantly, the base portion includes an attachment portion 347 which may be substantially similar to the attachment portion 210 of the power tool storage assembly 12. That is, the attachment portion includes a lip 349 and a plurality of tabs 351 which extend from the lip 349 toward the bottom edge 353. These tabs 351 may be substantially identical to tabs 242-254. In this manner, the socket reception assembly 320 may attach to the contained shelf 30 or upon a cabinet, such as cabinet 50, in the manner previously discussed with respect to the power tool storage assembly 120.

Referring now to FIGS. 31-35, there is shown a media stand assembly 400 which is made in accordance with the teachings of the preferred embodiment of the various inventions and which includes a substantially flat front face portion 402 having a ledge portion 404 which comprises a plurality of spaced apart tabs 406, 408, 410, 412, 414,416, 418 which each have an upwardly protruding portion 420 and a portion 422 which outwardly extends from the face 402. The media stand 400 further includes a back portion 421 having a substantially triangular cross sectional area and an attachment portion 424 which may be substantially similar to the previously described attachment portion 210 and which includes a plurality of substantially identical tabs 433 which are each substantially identical to tabs 242-254 (shown for example in FIG. 18).

It should be appreciated that in operation, a tablet computer or other device may be placed upon the substantially flat face portion 402 and supported upon the face 402 by the plurality of tabs 406-418 and that the attachment portion 424 allows the media stand assembly 400 to be placed upon the contained shelf 30 or upon a storage cabinet, such as storage cabinet 50, in the manner which was previously described. Moreover, in alternate and non-limiting embodiments, an electrical power receptacle 444 and/or a data communications port or assembly 446 may be deployed upon the face 402 by the use of conventional type fasteners, such as screws.

Referring now to FIGS. 37-42, there is shown a tool holder 500 which is made in accordance with the teachings of the preferred embodiment of the various inventions and which comprises a generally flat body 502 which integrally terminates into a notched portion 504 having a plurality of projections 501 which cooperatively form a plurality of notches 505. Notched portion 504 is mostly substantially flat and linearly coextensive to the body 502. Each projection, such as projection 505 of portion 504, includes an angled end 507. Except for the angled ends 507, the portion 504 orthogonally projects away from the body 502. Further, tool holder 500 further includes a plurality of "L"-shaped includes a plurality of tabs 510, 512, 514, 516, 518, 520, 522, 524, 526, 528, 530, 532, and 534 which each have a respective first portion 536 which respectively projects orthogonally away from the body 502 and a second portion 537 which projects in a direction which is parallel to the body 502.

Figure 50:
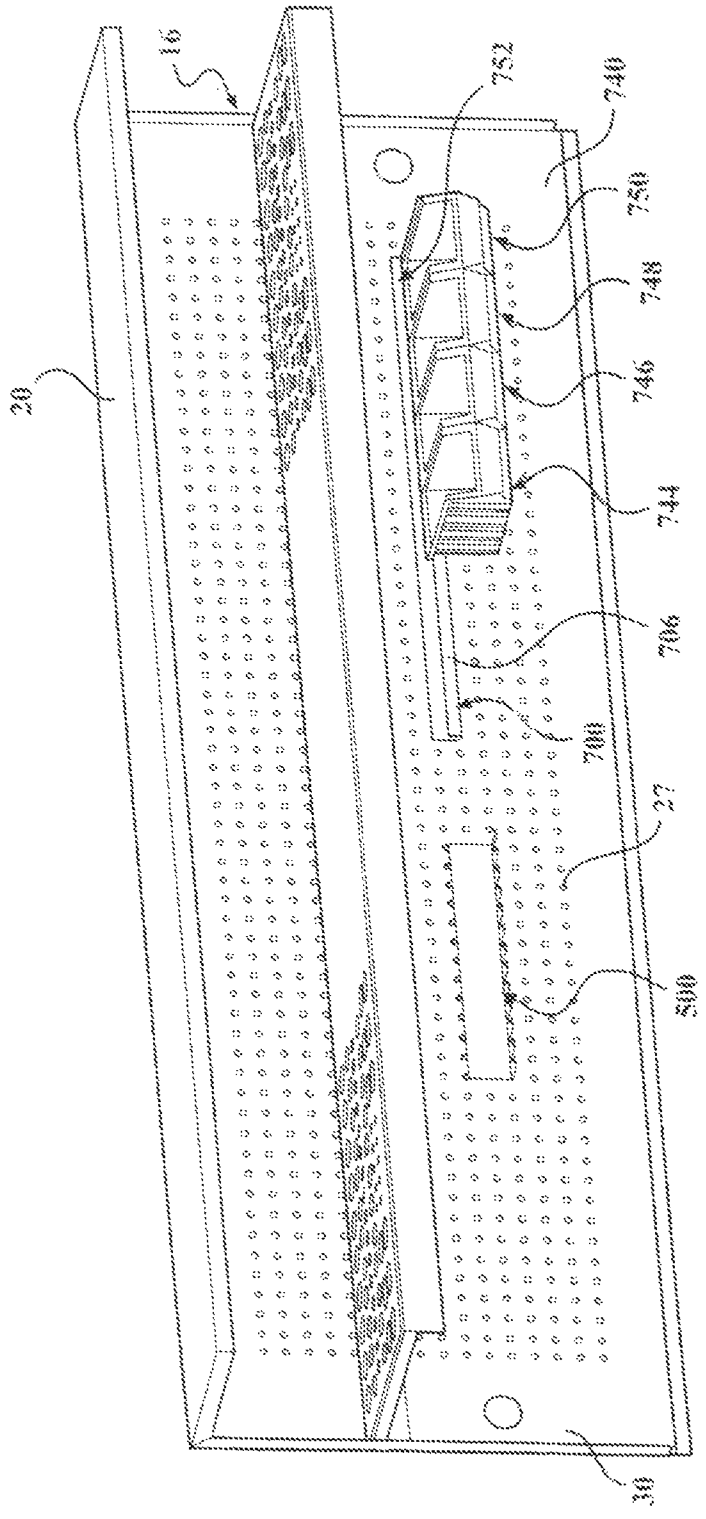
FIG. 50 is a perspective view of shelf which is made in accordance with the teachings of the preferred embodiment of the invention and which is adapted to be mounted within the interior cavity of the storage hutch assembly which is shown for example, in FIGS. 1 and 2, and upon which a socket assembly, a power tool storage assembly, and a media stand are deployed and which further shows the attachment of a tool holder and a parts bin holder to a portion of the storage hutch assembly.

In operation, as is perhaps best shown in FIG. 50, the tool holder 500 is adapted to be selectively and removably coupled to the surface 25 of the back panel 16. Particularly, as previously described, interior surface 25 includes a plurality of openings 27, and each of the tabs 510-534 is disposed in a unique one of the openings 27, thereby positioning the tool holder 500 in a desired position upon the back panel interior surface 27. Tools are then selectively and removably placed within each of the notches, such as notch 505, and against the flat body 502.

Referring now to FIGS. 43-49, there is shown a parts bin holder 700 which is made in accordance with the teachings of the preferred embodiment of the various inventions. Particularly, parts bin holder 700 includes a generally elongated body 702 having a generally flat middle portion 704 and a first longitudinal edge 706 which is generally rounded and protruding from the middle portion 704. The body 702 includes a second opposed and longitudinal edge 707 having a plurality of spaced apart projections or teeth 710-760 which project away from the edges 706, 707.

Figure 57:
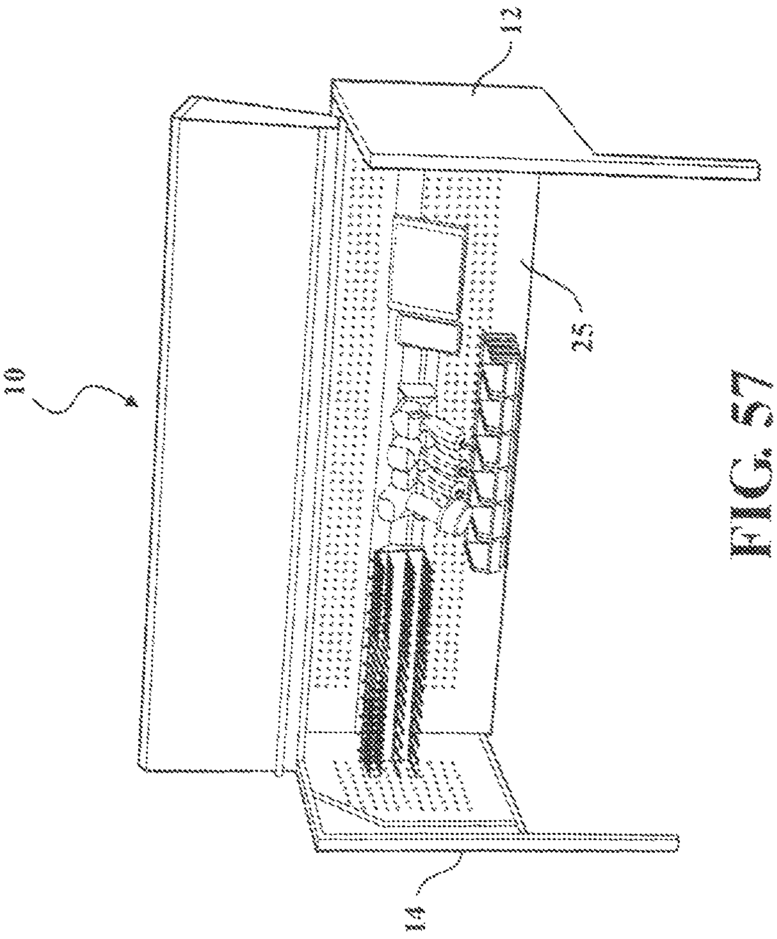
FIG. 57 is a perspective view of the storage hutch assembly made in accordance with the teachings of the preferred embodiment of the various inventions in combination with a socket assembly, a tool holder, a part bin holder, a power tool storage assembly, and a media stand.

In operation, as is best perhaps shown in FIGS. 50, 57, the teeth 710-760 are each disposed within respective openings 27 formed within the back wall surface 25 of the back panel 16. In this manner, the edge 706 extends away from the surface 25 toward the front panel 21 and upon this extended rounded edge 706, a parts bin, such as parts bin 740, may be selectively and removably disposed. That is, parts bin 740 includes a plurality of parts bins or receptacles 744, 746, 748, and 750 which are integrally formed and extend from the edge 752 which comprises a channel into which the edge 706 frictionally fits. Thus, when deployed upon the back wall surface 25, the parts bin 740 may be used to selectively and securely receive many small parts into each of the receptacles 744, 746, 748.

Figure 54:
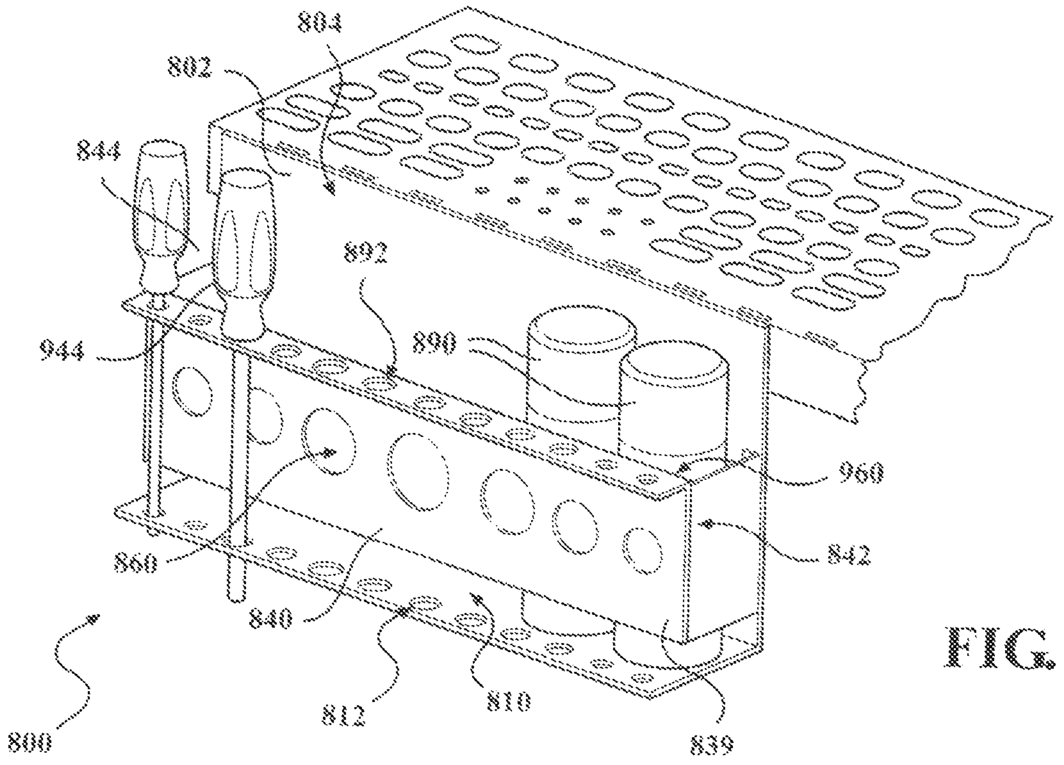
FIG. 54 is a partial perspective view of the shelf which is shown, for example, in FIGS. 2, 18 and 19 and further showing a hutch shelf storage assembly selectively and removably attached to the shelf.
Figure 55:
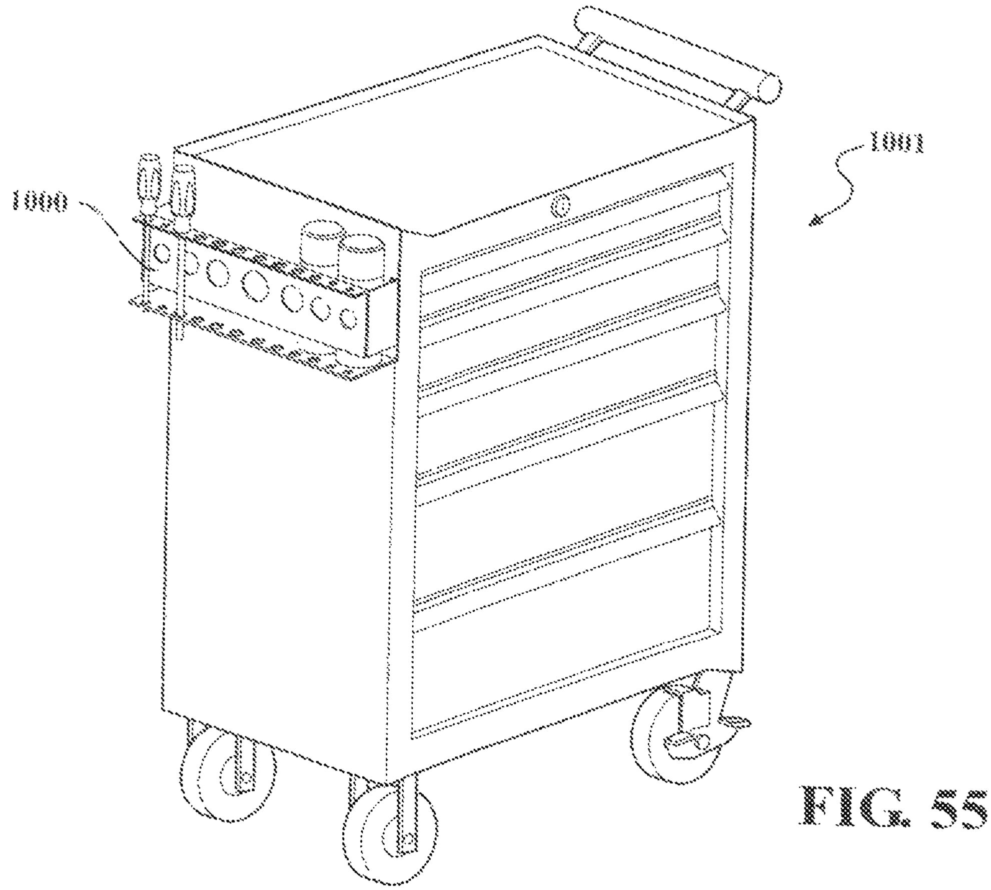
FIG. 55 is a perspective view of the hutch shelf storage assembly shown in FIG. 54 in combination with a storage cart.
Figure 56:
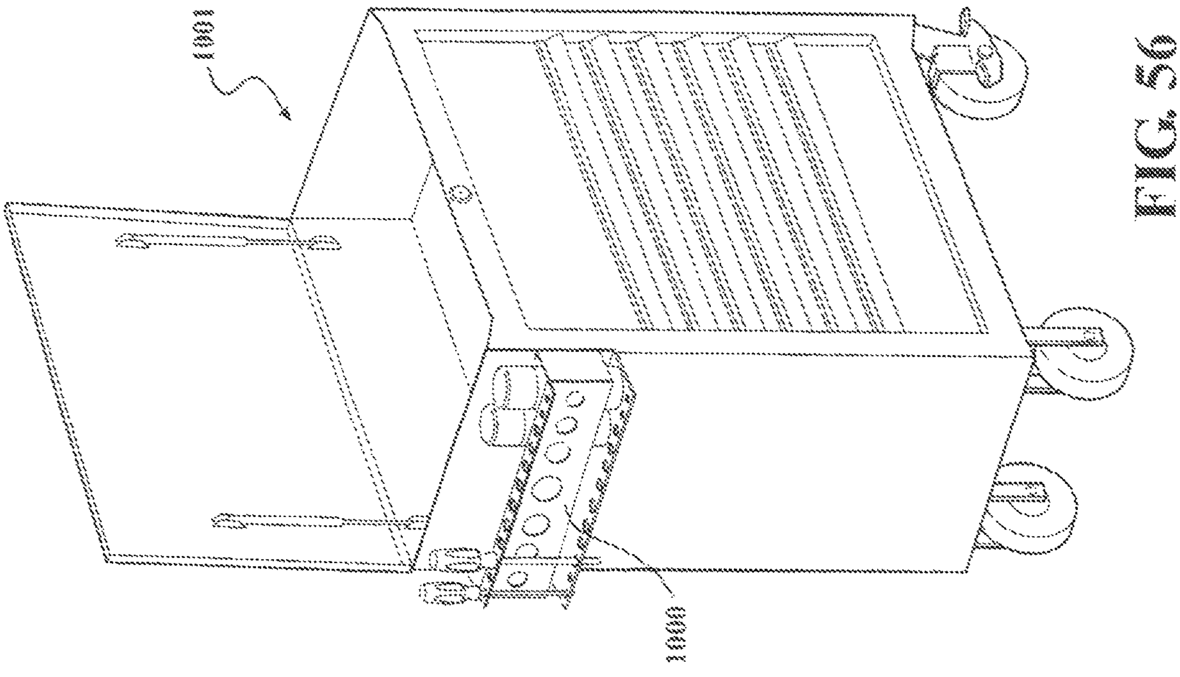
FIG. 56 is a perspective view of the hutch shelf storage assembly shown in FIG. 54 in combination with a tool cart.
Figure 58:
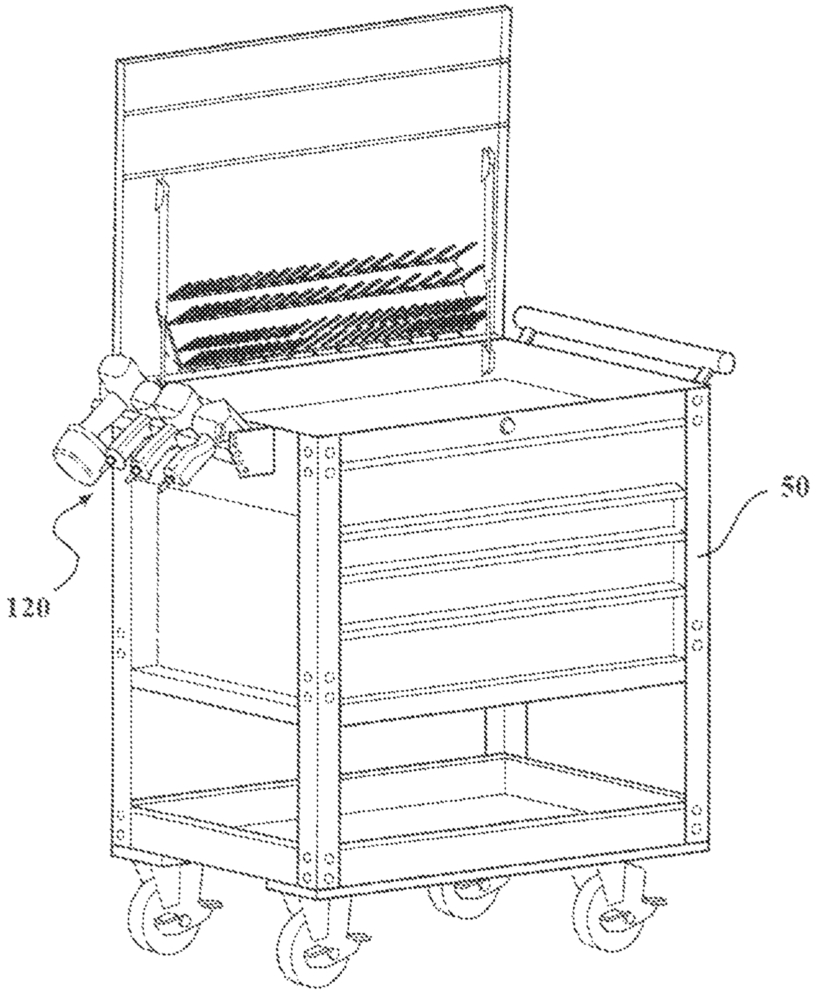
FIG. 58 is a perspective view of a tool cart in combination with a power tool storage assembly and a socket assembly which are each shown, for example, in FIGS. 50, 51.
Figure 59:
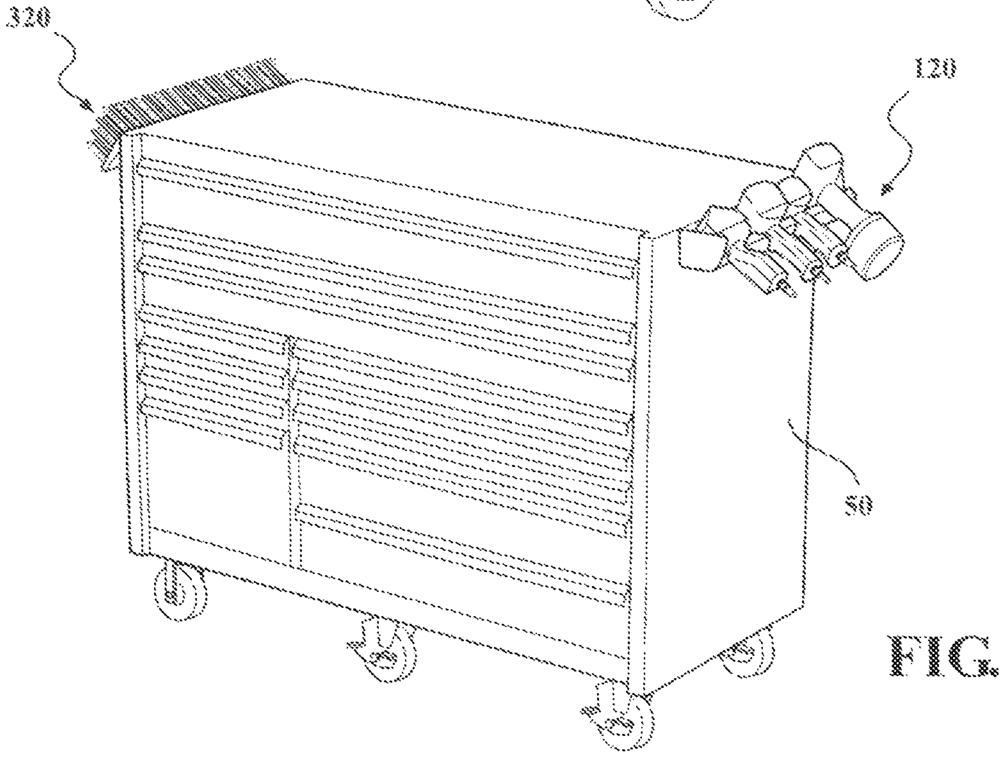
FIG. 59 is a perspective view of a roller storage cabinet in combination with a power tool storage assembly and a socket assembly which are each shown, for example, in FIGS. 50 and 51.
Figure 60:
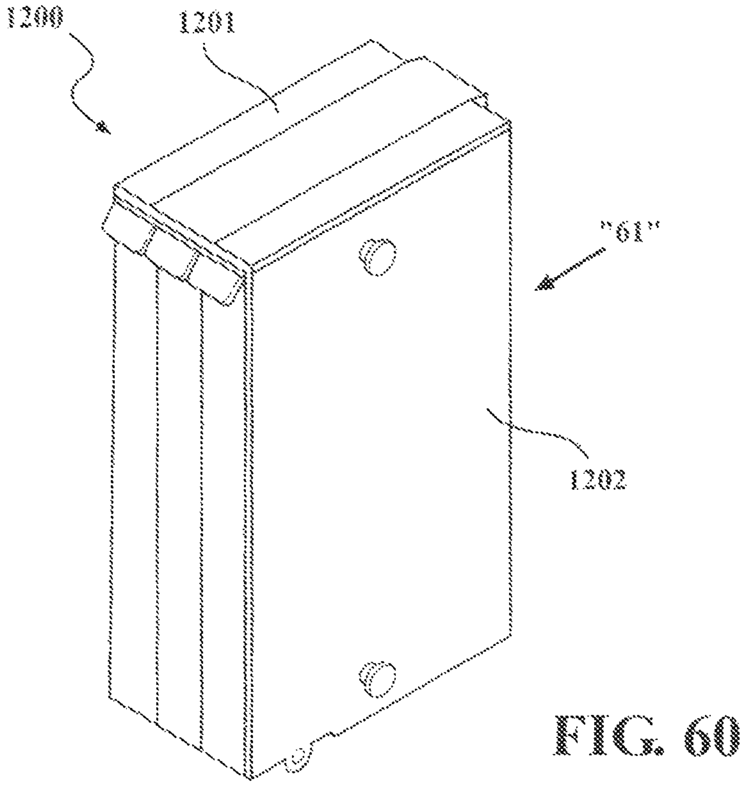
FIG. 60 is a view of the drill bit holder which is shown in FIG. 52, but further shown in a selectively closed position.
Figure 61:
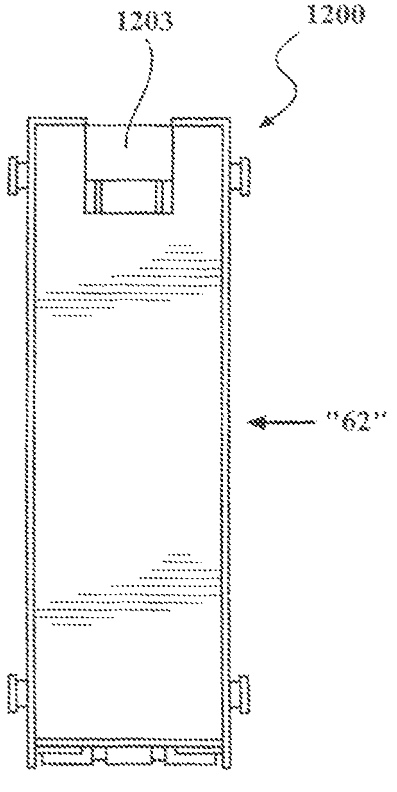
FIG. 61 is a back view of the drill bit holder shown in FIGS. 52 and 60 and taken in the direction of view arrow "61".
Figure 62:
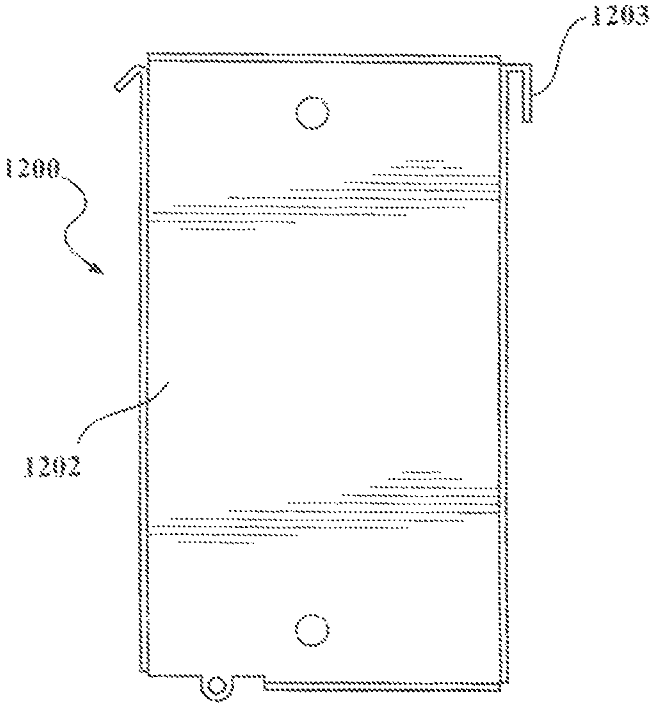
FIG. 62 is a right side view of the drill bit holder which is shown in FIG. 61 and taken in the direction of view arrow "62".
Figure 64:
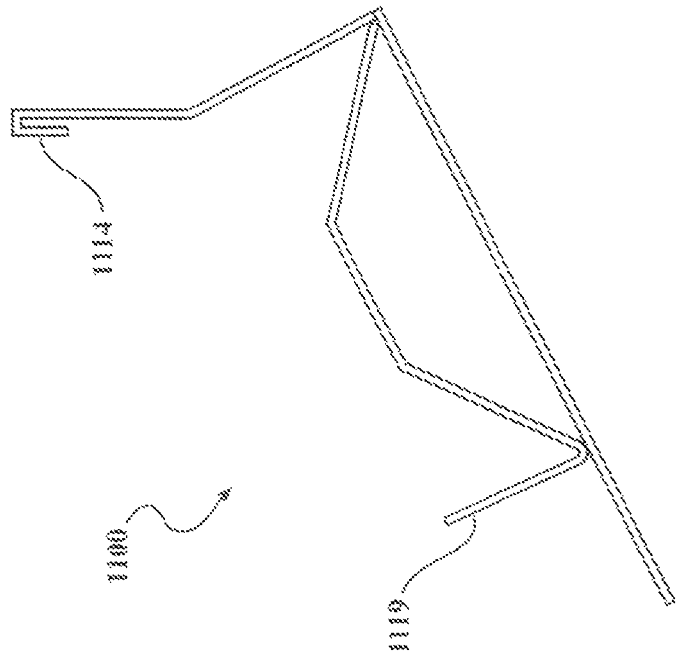
FIG. 64 is a left side view of the pliers rack which is shown in FIG. 53 and taken in the direction of view arrow "64".
Figure 63:
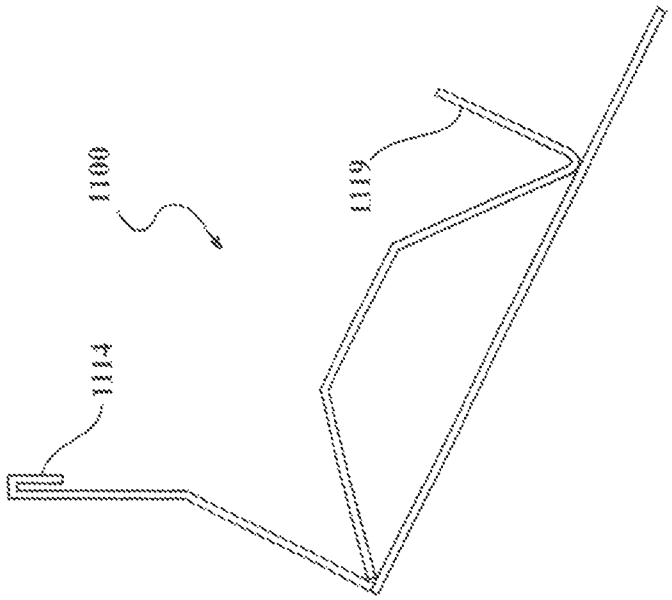
FIG. 63 is a right side view of the pliers rack which is shown in FIG. 53 and taken in the direction of view arrow "63".
Figure 65:
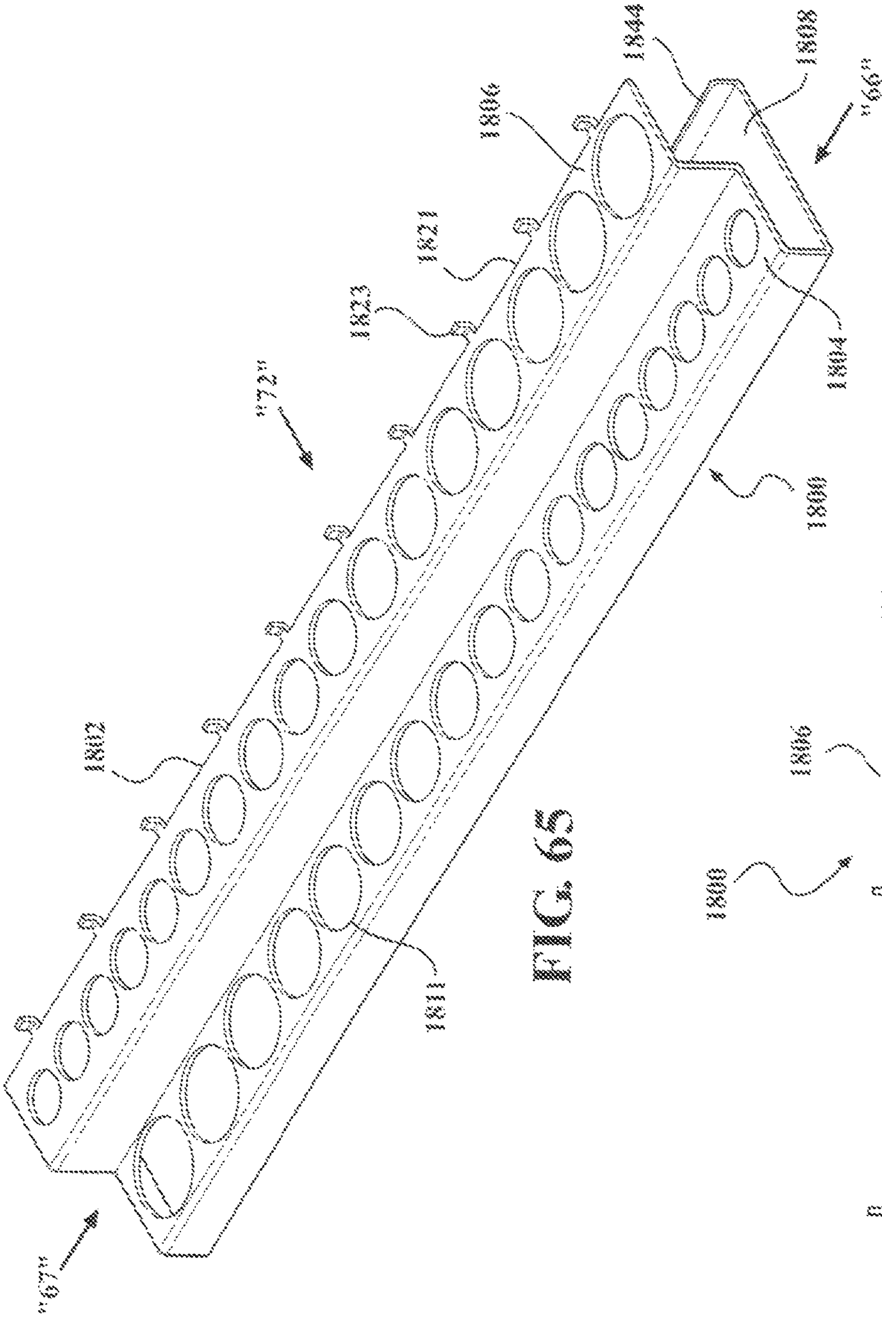
FIG. 65 is a perspective view of a socket holder which is made in accordance with alternate embodiments of the various inventions.
Figure 67:
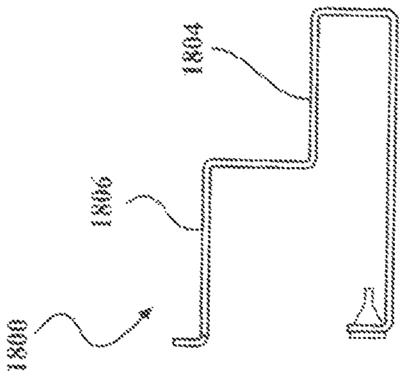
FIG. 67 is a right side view of the socket holder which is shown in FIG. 65 and taken in the direction of view arrow "67".
Figure 66:
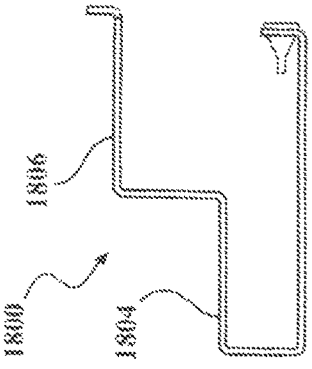
FIG. 66 is a left side view of the socket holder which is shown in FIG. 65 and taken in the direction of view arrow "66".
Figure 68:
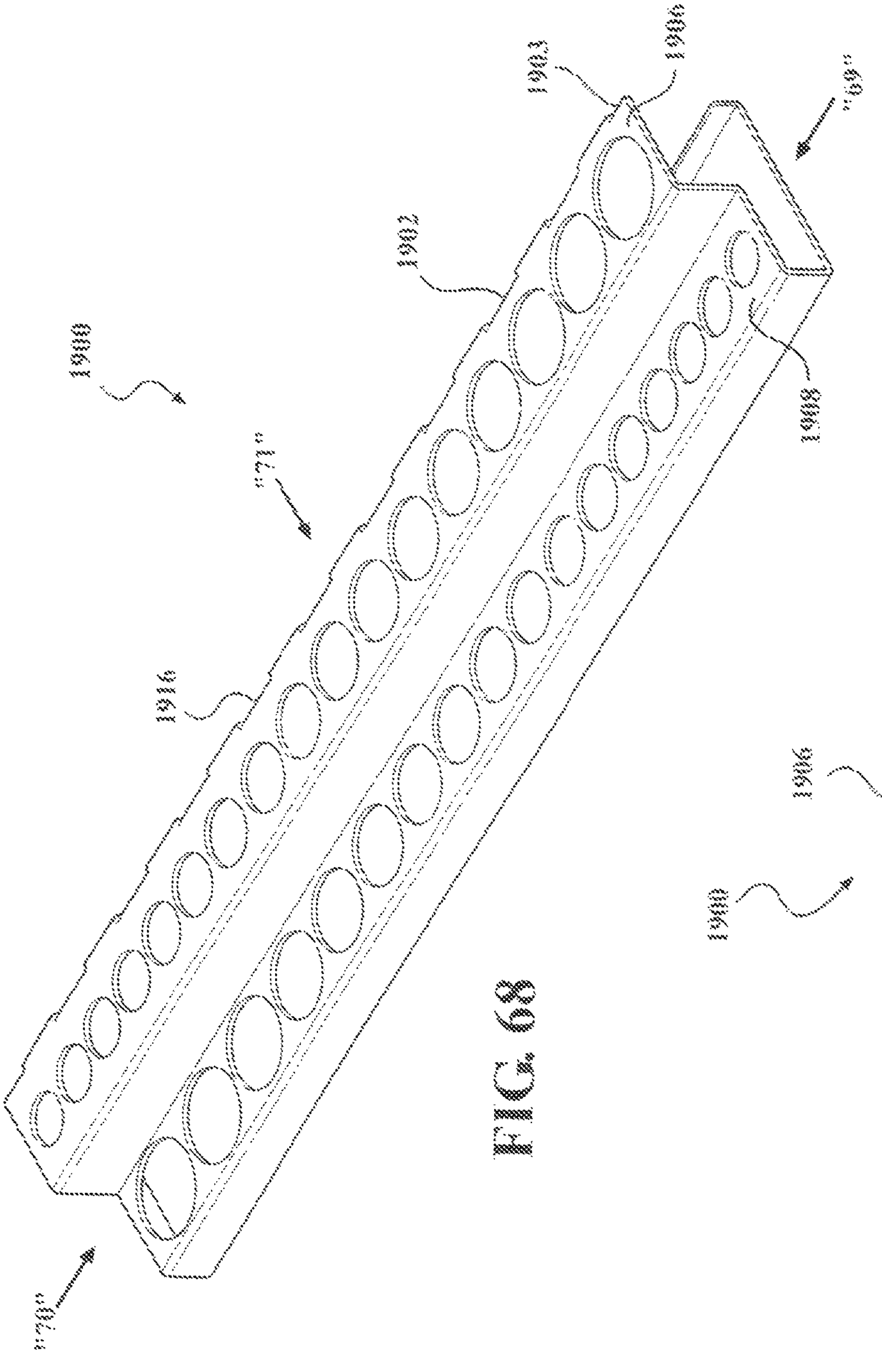
FIG. 68 is a perspective view of a socket holder which is made in accordance with the teachings of another alternate embodiment of the various inventions.
Figure 70:
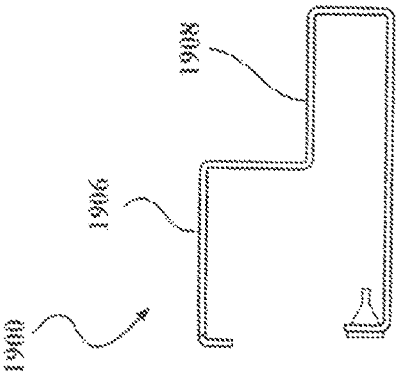
FIG. 70 is a right side view of the socket holder which is shown in FIG. 68 and taken in the direction of view arrow "70".
Figure 69:
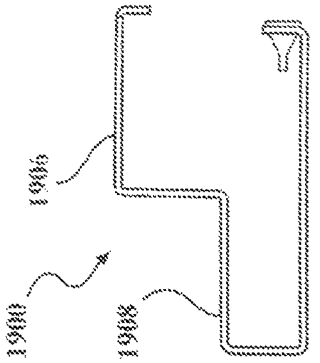
FIG. 69 is a left side view of the socket holder which is shown in FIG. 68 and taken in the direction of view arrow "69".
Figure 71:
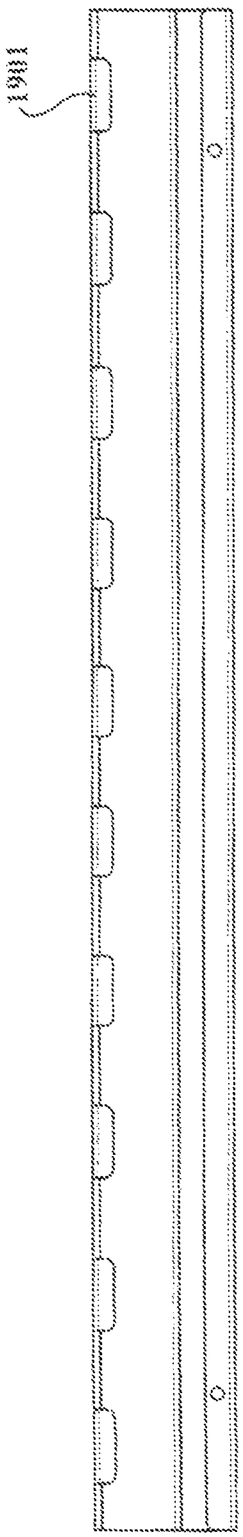
FIG. 71 is a back view of the socket holder which is shown in FIG. 68 and taken in the direction of view arrow 71.
Figure 72:
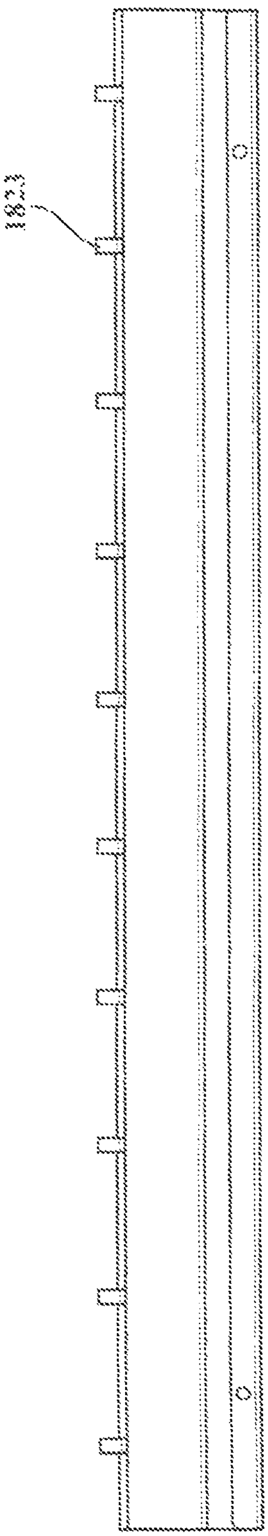
FIG. 72 is a back view of the socket holder which is shown in FIG. 65 and taken in the direction of view arrow 72.
Figure 73:
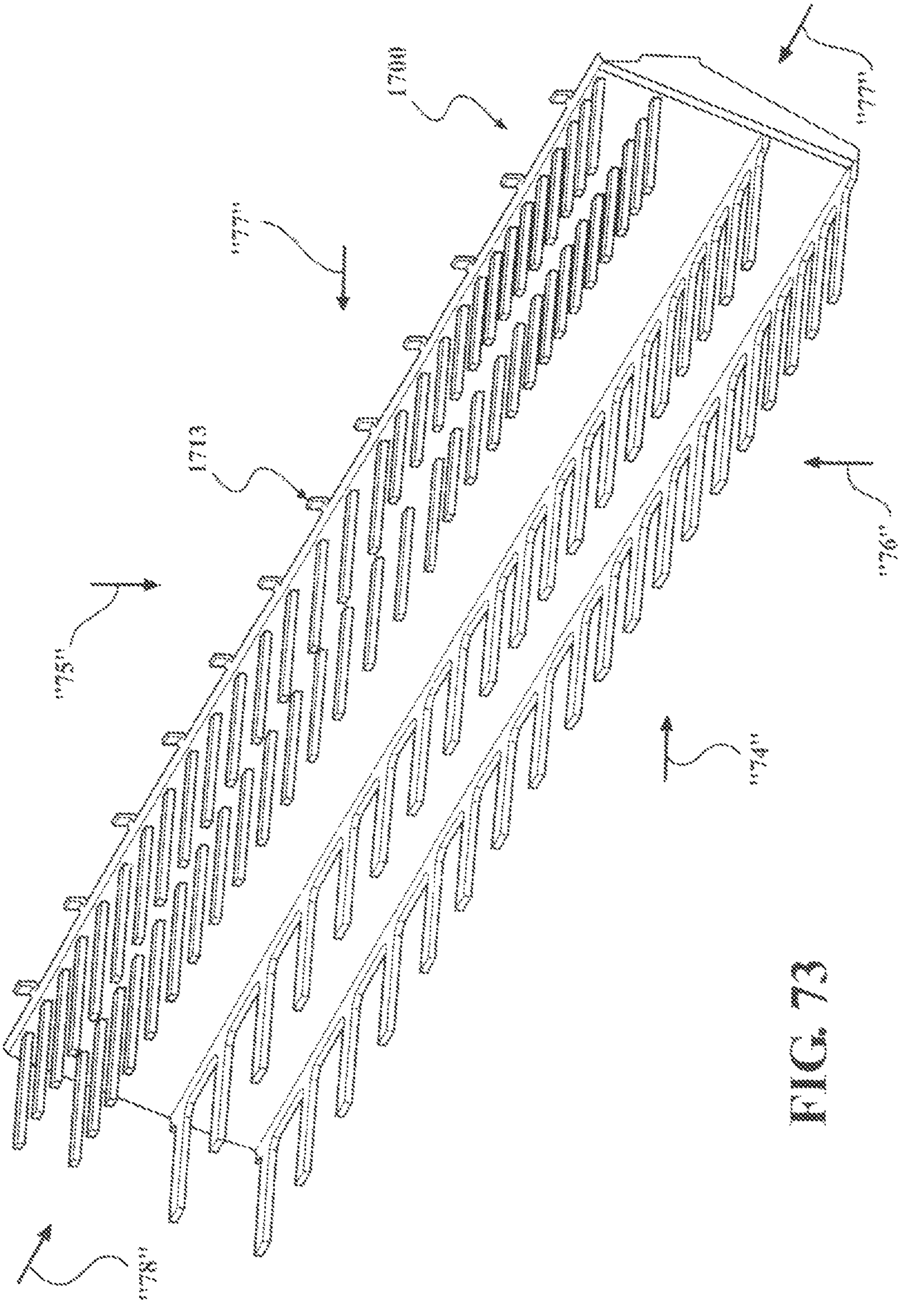
FIG. 73 is a perspective view of a socket holder which is made in accordance with yet another non-limiting embodiment of the various inventions.
Figure 74:
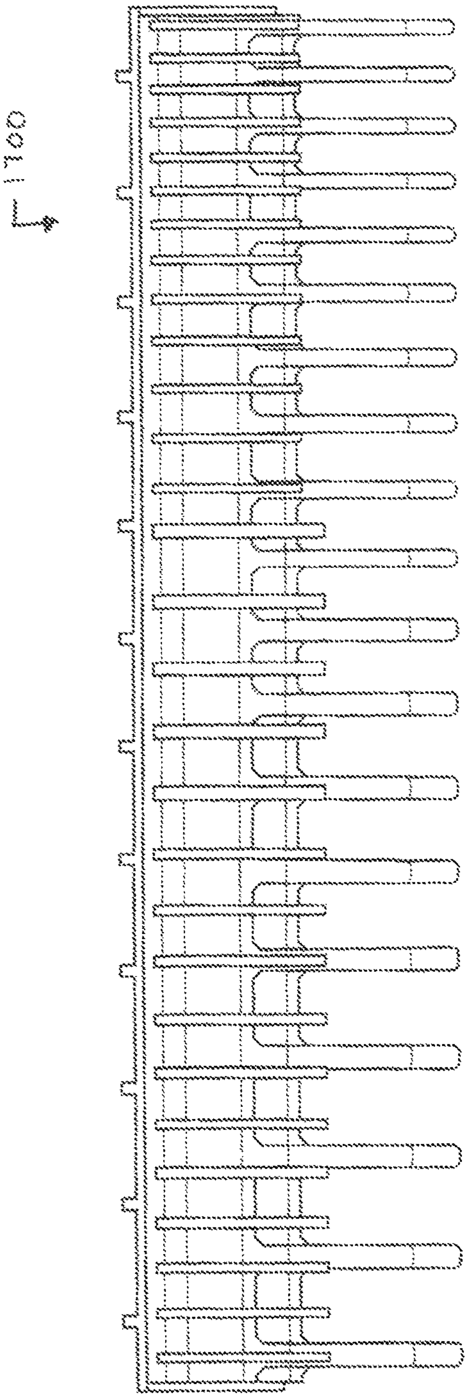
FIG. 74 is a top view of the socket holder which is shown in FIG. 73 and taken in the direction of view arrow "74".
Figure 75:
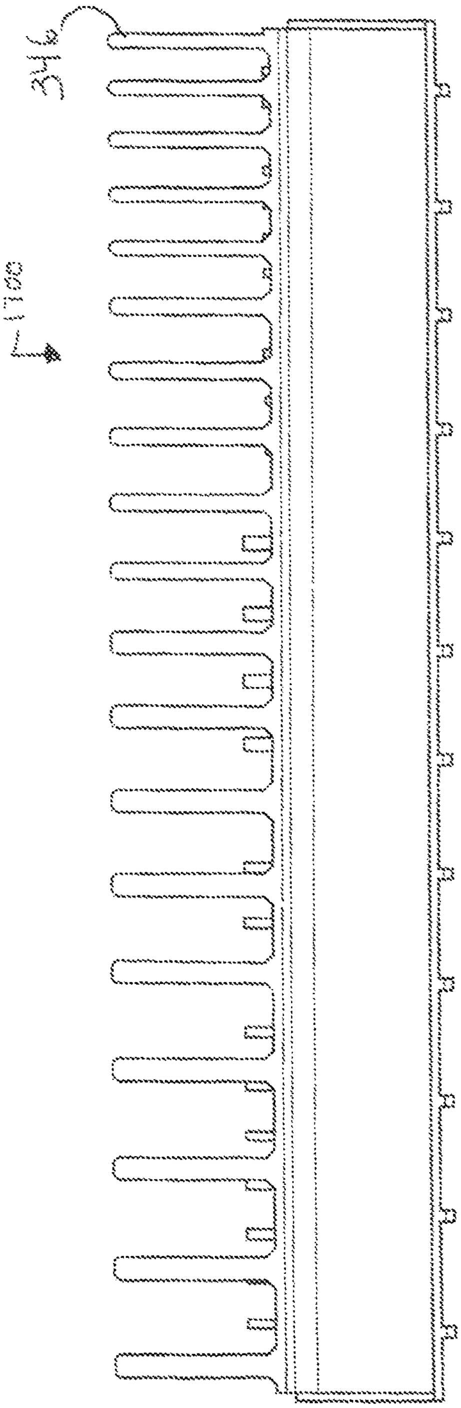
FIG. 75 is a bottom view of the socket holder which is shown in FIG. 73 and taken in the direction of view arrow "75".
Figure 76:
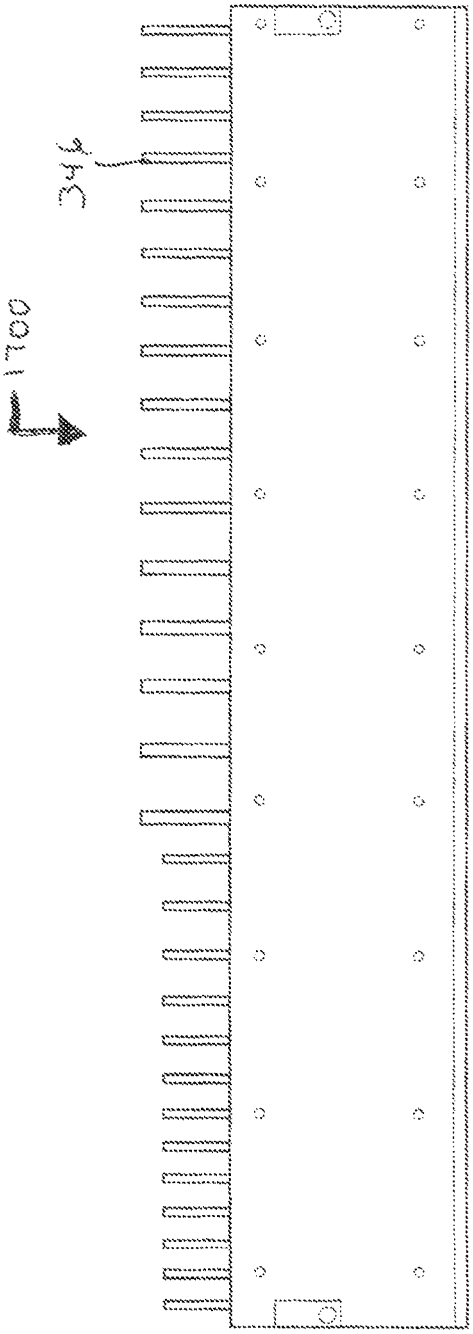
FIG. 76 is a back view of the socket holder which is shown in FIG. 73 and taken in the direction of view arrow "76.
Figure 78:
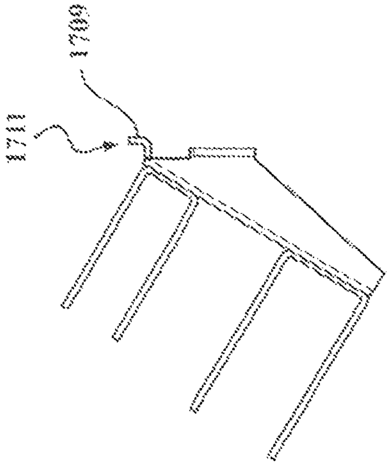
FIG. 78 is a right side view of the socket holder which is shown in FIG. 73 and taken in the direction of view arrow "78".
Figure 77:
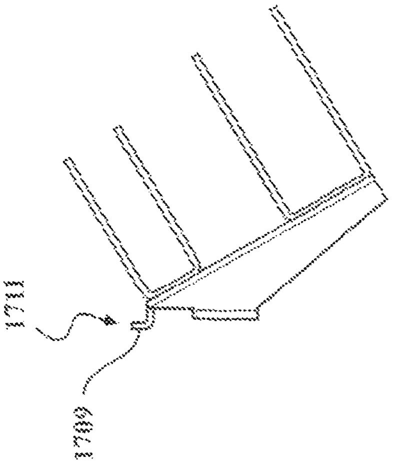
FIG. 77 is a left side view of the socket holder which is shown in FIG. 73 and taken in the direction of view arrow "77".

Referring now to FIGS. 54-56 there is shown a shelf assembly 800 which is made in accordance with the teachings of the preferred embodiment of the various inventions.

Particularly, the shelf assembly 800 includes a generally flat back portion or surface 802 having an attachment edge 804 which may be substantially similar to the previously described attachment edge or lip 210. The shelf assembly 800 further includes an integrally formed and generally flat bottom portion 810 having a plurality of openings of various sizes 812 which integrally and orthogonally projects and is linearly coextensive to the back surface 802. The shelf assembly 800 further includes a "C-shaped" middle portion 839 which includes a first flat portion 840 which lies above the bottom portion 810 and is longitudinally coextensive to the bottom portion 810. The "C"-shaped middle portion further includes side portions 842, 844 which orthogonally project from the flat portion 840. A plurality of dissimilar openings 860 may be formed in the portion 840 and a plurality of dissimilar openings 892 may be formed along ledge 960 of portion 840. In the most preferred, although non-limiting embodiment of the various inventions, each opening 892 is respectively aligned with and is substantially identical to a unique one of the openings 812. In this manner, a tool, such as a screwdriver 944 may be selectively and removably placed within the portions 810 and 840 and the space between the portions 810 and 960 thereby functions as a storage space. Further, items, such as items 990, may also be selectively and removably placed upon the bottom portion 810 and within the "C"-shaped middle portion 839. Items may, of course, also be selectively and removably placed through openings 860-872 for storage and later retrieval. The attachment edge 804 allows the shelf assembly 800 to be selectively and removably placed upon the shelf 30 in the previously described manner or upon the edge 1000 of a typical tool or storage cart, such as cart 1001.

Referring now to FIGS. 51, 53, 63, and 64, there is shown a pliers rack assembly 1100 which is made in accordance with the teaching of the preferred embodiment of the inventions. Particularly, the rack assembly 1100 includes a body 1102 having a flat bottom portion 1103 upon which a plurality of generally "C"-shaped slots 1104 are formed. Further, orthogonally and integrally projecting from a first end of the flat bottom portion 1103 is a reception portion 1105 having a plurality of generally oval reception slots 1106 and each of the reception slots 1106 communicates with and is aligned with a unique one of the generally "C"-shaped slots 1104. Further, the body 1102 includes an attachment portion 1110 which is linearly coextensive to the flat bottom portion 1103 and to the reception portion 1105 and which further forms an acute angle 1111 with reception portion 1105. The attachment portion 1110 includes a lip 1112 having a plurality of tabs 1114 which project in a direction from the lip 112 toward the flat bottom portion 1103 and which are substantially similar to the plurality of tabs 242-254 and which allow the pliers rack 1110 to be attached to a tangible item or entity in a substantially similar manner as explained with respect to the power tool rack 120. Further, the body 1102 includes a substantially flat back plate 1119 which is linearly coextensive to the flat bottom portion 1103, the reception portion 1105, and which orthogonally projects from the flat bottom portion 1103.

Figure 51:
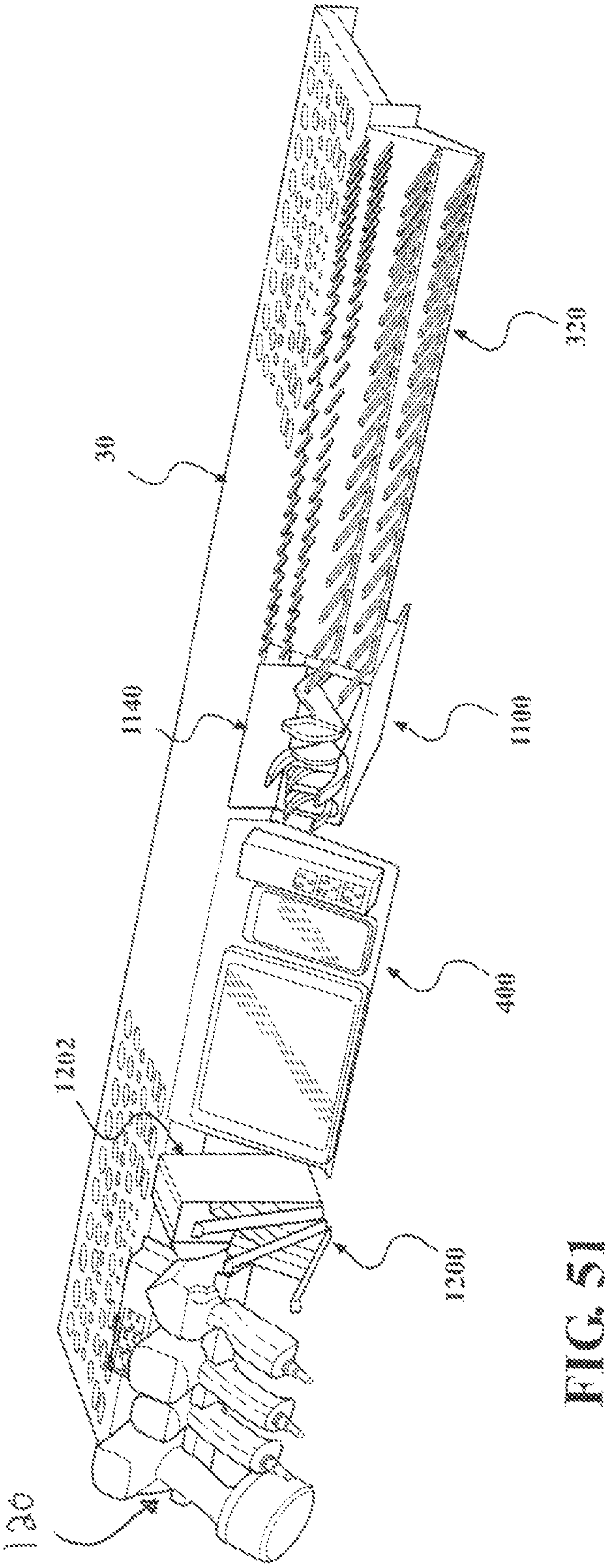
FIG. 51 is a perspective view the shelf which is shown in FIG. 50 and further showing the attachment of a pliers rack and a drill bit case upon the shelf.
Figure 52:
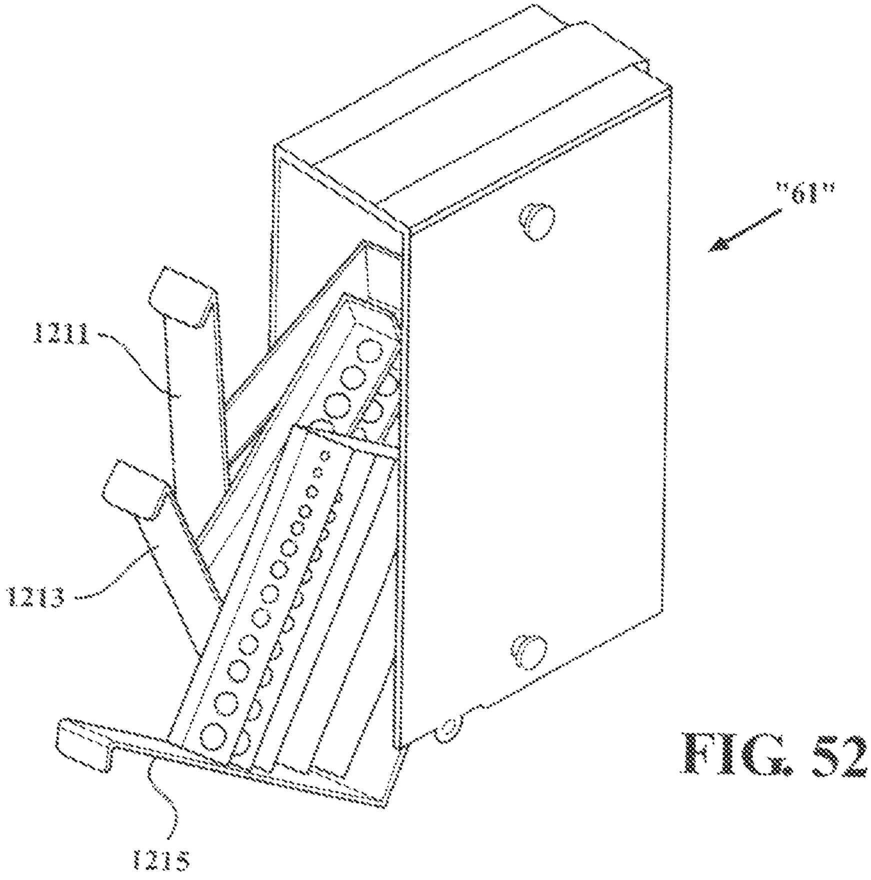
FIG. 52 is a perspective view of the drill bit case which is shown in FIG. 51.
Figure 53:
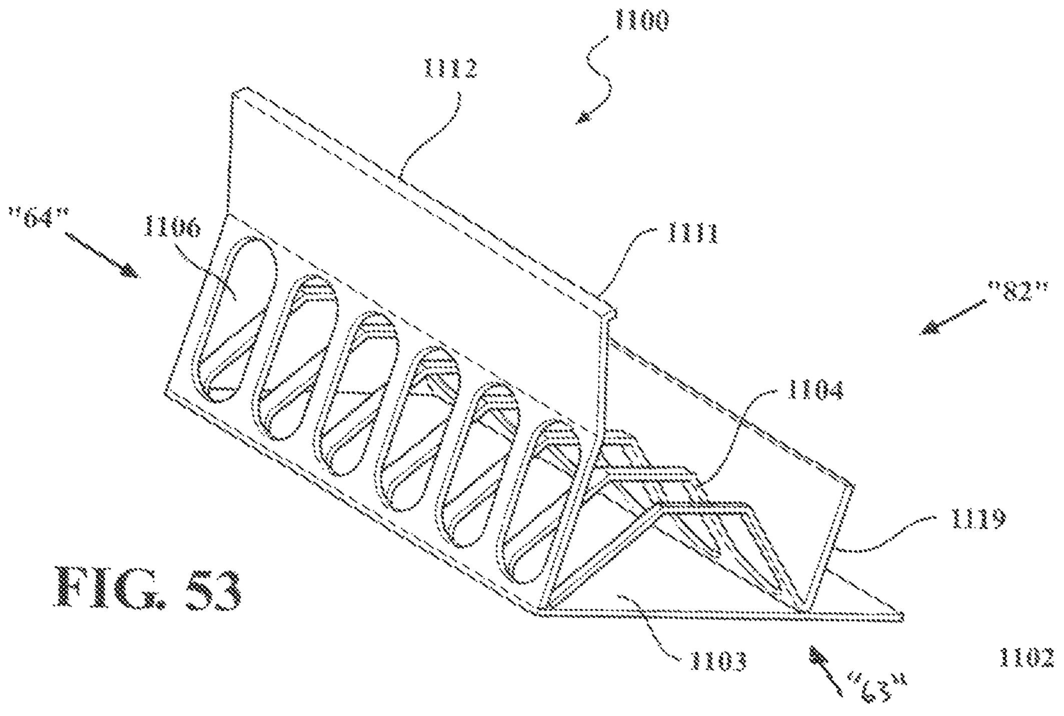
FIG. 53 is a perspective view of the pliers rack which is shown in FIG. 51.

Thus, the rack assembly 1100 may be selectively attached to the shelf 30 by use of the plurality of tabs 1114 in the previously described manner and when so attached, as shown in FIG. 51 and pliers, such as pliers 1140, may be placed through an opening 1106 and into the respectively aligned slot 1104 until the placed plier 1140 contacts the back plate portion 1119. It can easily be removed for later use and replaced.

Referring now to FIGS. 51, 52, 60, 61, 62, and 84-85, there is shown a drill bit holder or case assembly 1200 which is made in accordance with the teachings of the preferred embodiment of the inventions.

The drill bit case assembly 1200 includes a body 1202 has a generally hollow and generally rectangular body 1201 and a back tab 1203 which may be substantially similar to each of the tabs 242-254 and which allows the drill bit holder 1200 to be mounted in a substantially similar manner as was the power tool holder 120. Further, the drill bit holder assembly 1200 includes drill bit holder members 1211, 1213, and 1215 and each of the members 1211, 1213, and 1215 having a respective handle portion 1219 and a generally rectangular case portion 1223 which is integrally formed with the respective handle portion 1219 and which includes several rectangular reception portions 1225 and 1227, each of which have a plurality of openings, such as opening 1229. Each of the openings 1229 may have a dissimilar diameter or only some of the openings 1229 may have a dissimilar diameter.

Each respective case portion 1223 receives the pin 1230 which also traverse both opposed side portions 1240 and 1242 of the body 1202. The portion of the pin 1230 which protrudes from each side portion 1240, 1242, receives a respective nut or other fastener device to hold the pin 1230 in place. In this manner, each of the members 1211, 1213, and 1215 are selectively and independently movable about the pin 1230 from a first position in which the respective members 1211, 1213, and 1215 reside inside of the body 1202 (see, for example, FIG. 60), to a respective positon in which the respective members 1211, 1213, and 1215 are made to reside outside of the body 1202 (see, for example, FIG. 52). Drill bits may be selectively and removably placed in each of the openings 1229 (e.g, a particular drill bit having a certain diameter is placed into an opening 1229 having the same or approximately the same diameter). Moreover, a pair of rivets 1250, 1252 are disposed on each side 1240, 1242 and is used to mount the assembly 1200 between two side walls or pegboards.

Referring now to FIGS. 73-78, there is shown a socket assembly 1700 which is made in accordance with the teachings of an alternate embodiment of the inventions.

Figure 79:
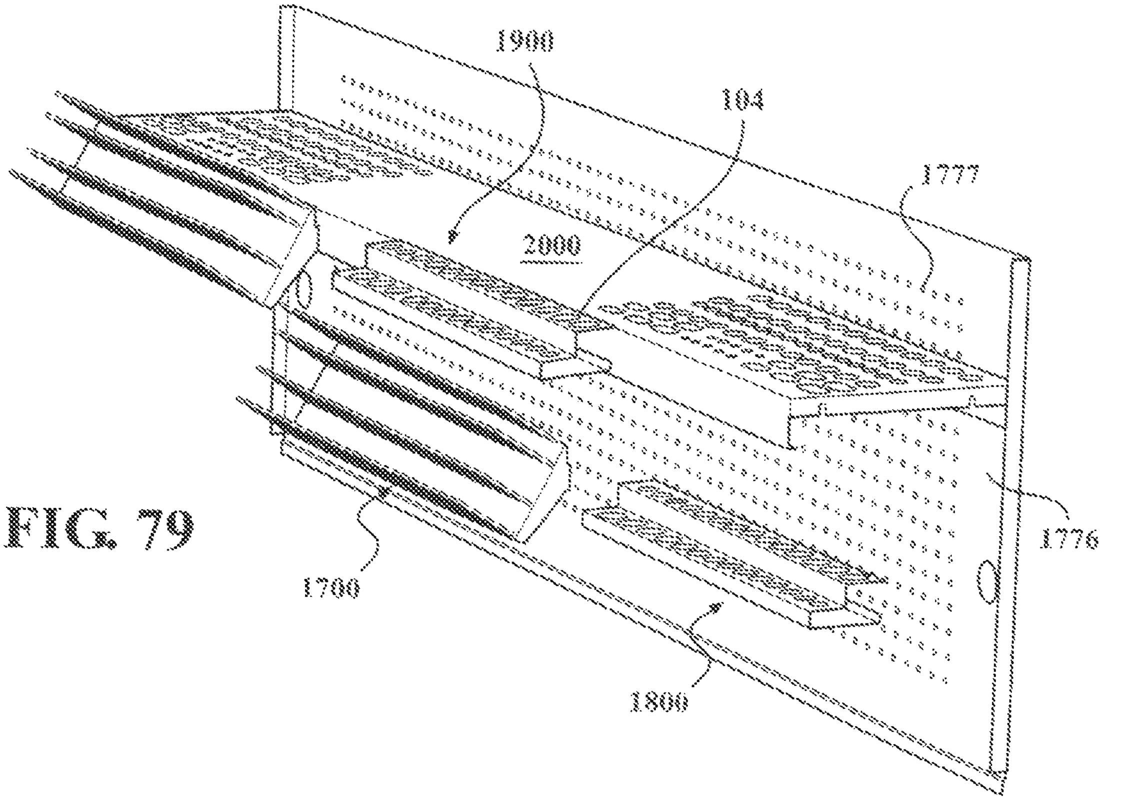
FIG. 79 is a perspective view of a back panel and a shelf and several embodiments of the socket holders which have been described and shown with regard to the previous Figures.

Particularly, the socket assembly 1700 differs from the previously described socket assembly 320 in that the use of tabs 351 is obviated and instead the edge or lip 349 includes a plurality of spaced apart and substantially identical prongs 1709. Each of the prongs 1709 are "L"-shaped having a first portion 1711 which is coplanar to the edge 347 but extending in an opposite direction to the direction which the reception members 346 extend, and a second portion 1713 which extends away from the bottom edge 353 and is orthogonal to portion 1711. As shown, perhaps best in FIG. 79, these plurality of generally "L"-shaped prongs 1713 allows the socket assembly 1700 to be selectively and removably attached to a pegboard 1776. That is, each prong 1713 frictionally and removably fits within a hole 1777 of the pegboard 1776.

Referring now to FIGS. 65-67 and 72, there is shown a socket assembly 1800 which is made in accordance with yet another non-limiting and alternate embodiment of the inventions.

Particularly, the socket assembly 1800 includes a body 1802 having a pair of steps 1804, 1806 which are integrally formed upon a generally flat base 1808 and each of the steps 1804, 1806 has respective openings 1811 and the openings 1811 are mostly dissimilar in diameter, thereby allowing for reception of sockets of various and dissimilar sizes. Further, step 1806 includes, along an outer edge 1820, a plurality of integrally formed and generally "L"-shaped prongs 1823 which may be substantially identical to the prongs 1709 which have been previously explained. A wall portion 1844 is integrally formed with the base 1808 and is lineally coextensive to the base 1808 and is orthogonal to the base 1808.

In operation, the prongs 1823 allow (as is perhaps best shown in FIG. 79) the socket assembly 1800 to be attached to a peg board 1776 (each prong 1823 fits into an opening 1777), thereby allowing the socket assembly 1800 to be attached to the peg board 1776. Sockets may be placed into openings 1811 and the wall portion 1844 contacts the peg board 1776 and such contact further stabilizes the positon of the socket assembly 1800 upon the pegboard 1776.

Referring now to FIGS. 68, 69, 70, and 71, there is shown a socket assembly 1900 which is made in accordance with the teachings of yet another non-limiting embodiment of the inventions.

Figure 80:
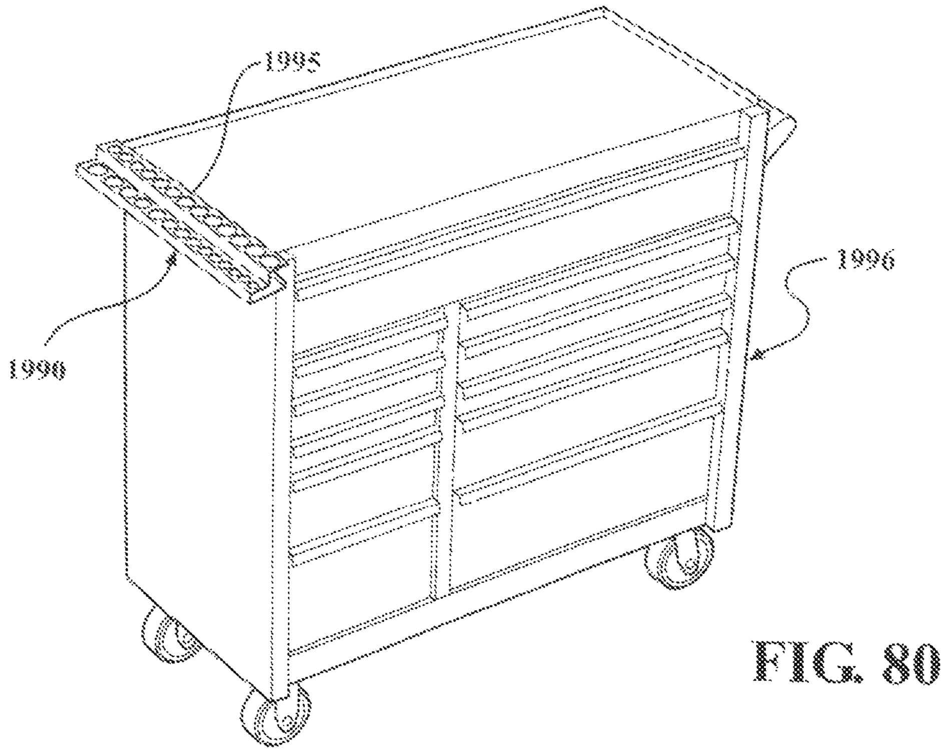
FIG. 80 is a perspective view of a tool cart in assembled combination with one of the socket holders of the various embodiments of the inventions.

Socket assembly 1900 includes a pair of steps 1908 and 1906 but differs from socket assembly 1800 in that the plurality of prongs 1823 are not used and instead integrally formed tabs 1901 exist along the edge 1903 of the step 1906. Step 1908 is substantially similar to step 1804. The tabs 1901 may be substantially similar to tabs 242-254 and allow the socket assembly 1900 to be mounted in a substantially similar way to power tool assembly 120, as shown for example, upon shelf 2000 (which may be substantially similar to shelf 30 and which includes openings 104 into which the tabs 1901 may selectively and removably reside. As is perhaps shown best in FIG. 80, socket assembly 1900 may be selectively and removably mounted upon the edge 1995 of tool cart 1996 by the use of tabs 1901 which cooperatively receive the edge 1995.

Figure 81:
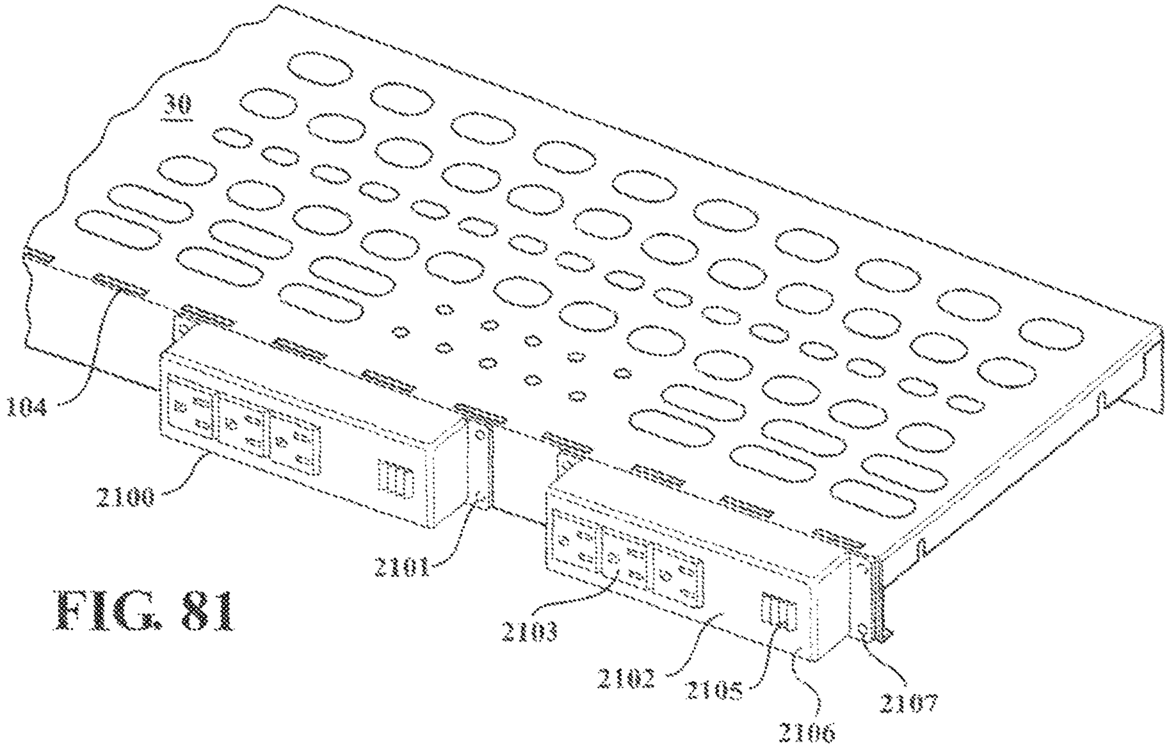
FIG. 81 is a partial perspective view of a shelf and several power strip embodiments of the various embodiments of the inventions.
Figure 82:
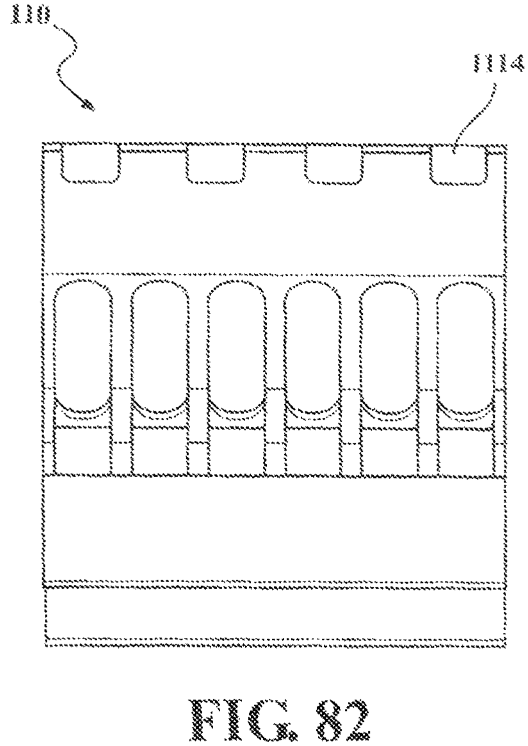
FIG. 82 is a back view of the pliers rack which is shown in FIGS. 53, 63, and 64 and taken in the direction of view arrow "82".
Figure 83:
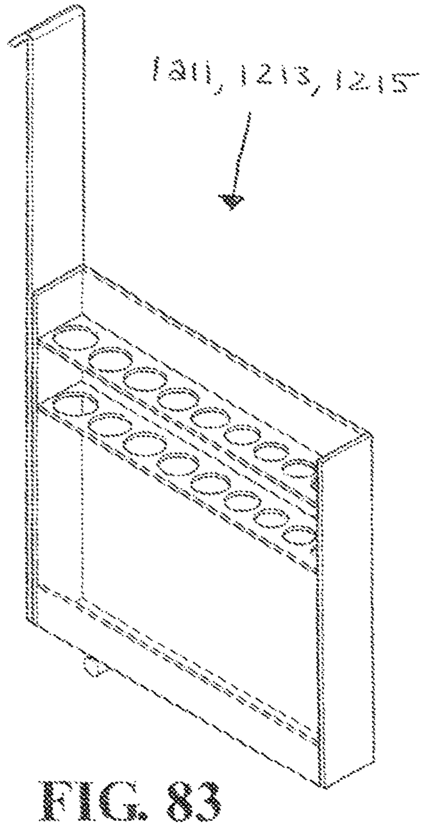
FIG. 83 is a perspective unassembled view of a drill bit holder member which is shown in FIGS. 52 and 60 and which is made in accordance with the teachings of the preferred embodiment of the inventions.
Figure 84:
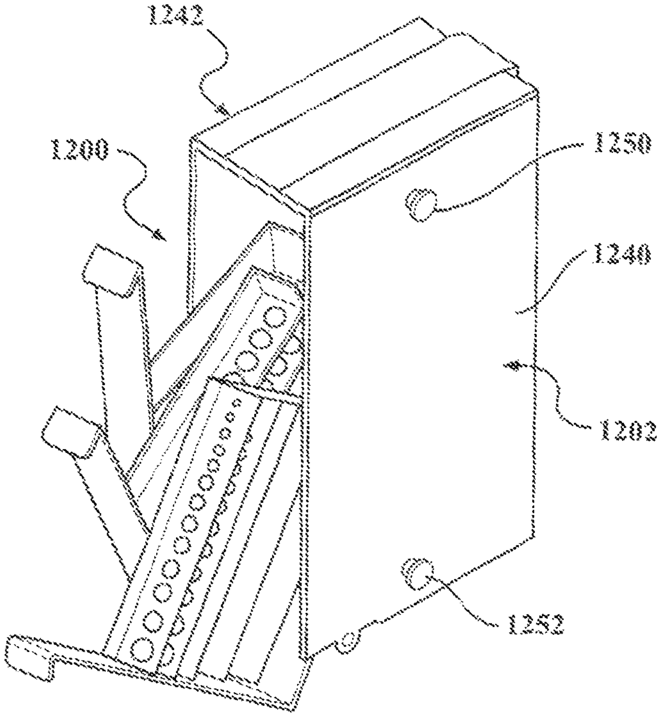
FIG. 84 is an unassembled view of the drill bit holder assembly which is shown in FIGS. 52, 60, and 83.
Figure 85:
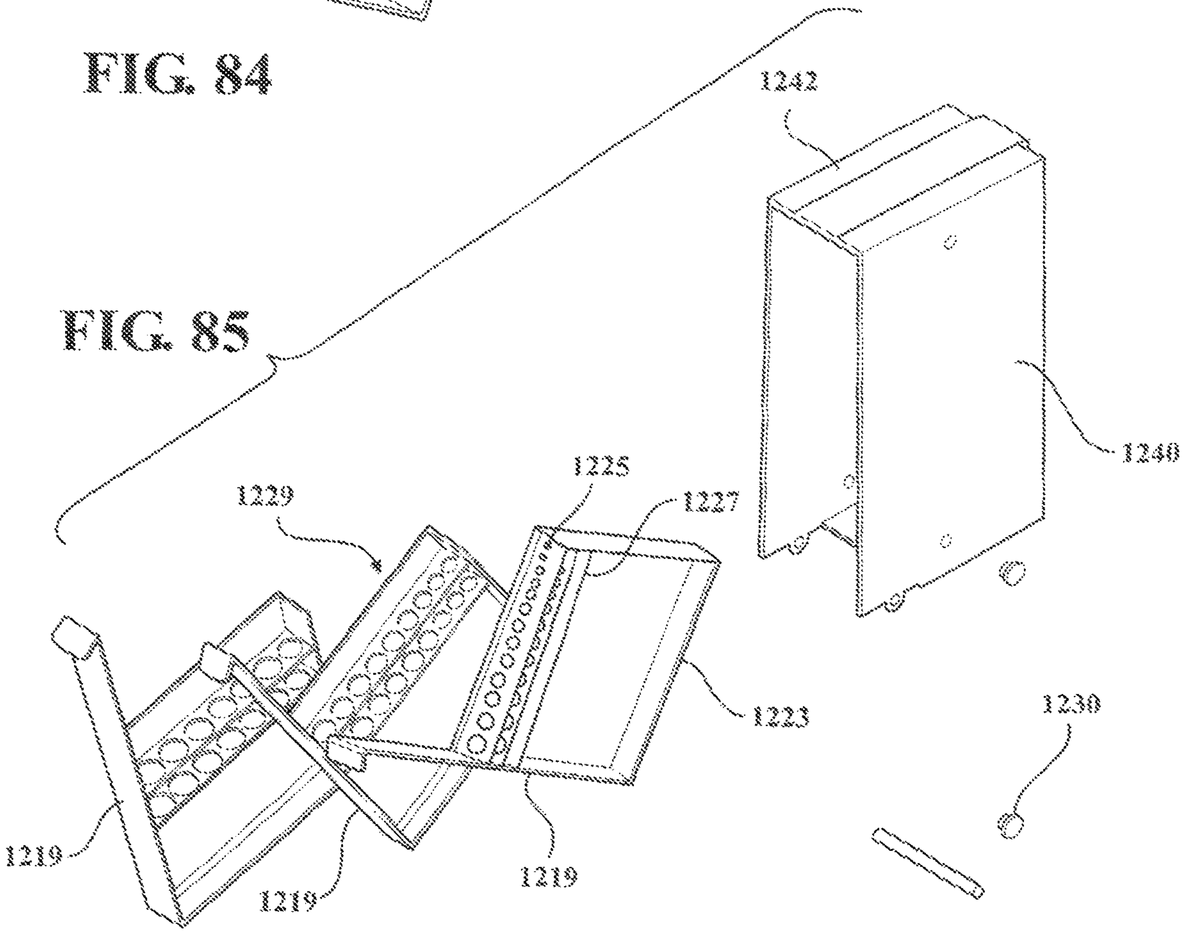
FIG. 85 is an assembled open view of the drill bit holder assembly.

As shown best in FIG. 81, in yet another non-limiting embodiment of the inventions, a power strip 2100 may be attached to the shelf 30 by the use of screws 2101 or other conventional fasteners and/or a self contained power strip and USB or data port assembly 2102 (having at least one electrical outlet 2103 and at least one data port 2105 in one physical enclosure 2106) may be attached to the shelf 30 by screws 2107 or similar fasteners. In each case, the foregoing electrical outlets are coupled to a source of electrical power and the data ports are coupled to a source of data or to a computer.

It is to be understood that the various inventions are not limited to the exact construction which has been illustrated and describe but the various changes and modifications may be made without departing from the spirit and the scope of the inventions as set forth in the following subjoined claims. Further, it should be appreciated that the attachment edge 210 may alternatively form a "J" or hook type configuration without the need for tabs, such as tab 242, and that nothing in this disclosure is meant to limit the attachment edge 210 and the other utilized attachment edges to any particular geometric configuration. Further, the power tool holder 120 may be adjustable (as described) or fixed and non-adjustable and that it may be attached to any tangible entity by the use of magnets or other types of conventional fasteners. Further, in alternate and non-limiting embodiments, storage assemblies may have different attachment edges. Further, nothing is meant to limit any of the foregoing to any particular type of geometric configuration.

What is claimed is:

1. A storage hutch comprising a tool storage assembly disposed within said body and wherein said tool storage assembly includes a retention portion having a plurality of dissimilarly sized holes and wherein said dissimilarly sized holes have respective center points which are in a non-aligned relationship, wherein no more than two center points lie along the same axis, and wherein said tool storage assembly further includes a support portion which angularly projects from and which forms an acute angle with said retention portion and which includes a plurality of notches which are each respectively aligned with a unique one of said dissimilarly sized holes, and wherein said tool storage assembly further including an attachment portion which projects from said retention portion on a side opposite to the support portion and which couples said tool storage assembly to said body; and wherein said tool storage assembly further includes a pair of substantially identical side members which are disposed on opposed sides of said retention portion, and wherein said attachment portion comprise a plurality of tabs which allow said tool storage assembly to be removably coupled to said body.

2. The tool storage assembly of claim 1 wherein said attachment portion comprises an outwardly protruding trench which is linearly coextensive to said retention portion.

3. The tool storage assembly of claim 1 wherein said plurality of tabs is substantially identical.

4. The tool storage assembly of claim 1 wherein said plurality of notches are respectively aligned with a unique one of said plurality of openings.

* * * * *